United States Patent [19]
Imaeda et al.

[11] Patent Number: 6,036,775
[45] Date of Patent: Mar. 14, 2000

[54] SINGLE CRYSTAL-GROWING METHOD AND APPARATUS

[75] Inventors: Minoru Imaeda; Akihiko Honda; Katsuhiro Imai; Yuichiro Imanishi; Nobuyuki Kokune, all of Nagoya; Shoji Sogo, Komaki; Kazuaki Yamaguchi, Nagoya; Tetsuo Taniuchi, Sendai, all of Japan

[73] Assignee: NGK Insulators, Ltd., Nagoya, Japan

[21] Appl. No.: 09/358,066

[22] Filed: Jul. 21, 1999

Related U.S. Application Data

[62] Division of application No. 08/909,138, Aug. 11, 1997, which is a division of application No. 08/616,525, Mar. 19, 1996, Pat. No. 5,690,734.

[30] Foreign Application Priority Data

| Mar. 22, 1995 | [JP] | Japan | 7-062585 |
| Mar. 22, 1995 | [JP] | Japan | 7-062586 |
| Mar. 24, 1995 | [JP] | Japan | 7-065883 |
| Jun. 2, 1995 | [JP] | Japan | 7-136578 |
| Feb. 16, 1996 | [JP] | Japan | 8-029078 |

[51] Int. Cl.[7] .................................................. C30B 35/00
[52] U.S. Cl. ........................ 117/214; 117/201; 117/202; 117/208; 117/216
[58] Field of Search ................................... 117/201, 202, 117/208, 214, 216

[56] References Cited

U.S. PATENT DOCUMENTS

| 4,211,600 | 7/1980 | Cole | 156/608 |
| 4,269,652 | 5/1981 | Yancey | 156/607 |
| 4,367,200 | 1/1983 | Mimura et al. | 422/248 |
| 4,565,600 | 1/1986 | Ricard | 156/608 |
| 4,647,437 | 3/1987 | Stormont et al. | 117/210 |
| 4,664,742 | 5/1987 | Tomizawa et al. | 156/607 |
| 4,711,695 | 12/1987 | Stormont et al. | 117/25 |
| 5,030,315 | 7/1991 | Washizuka et al. | 156/607 |
| 5,492,078 | 2/1996 | Alterkruger et al. | 117/19 |

FOREIGN PATENT DOCUMENTS

| 162467 | 11/1985 | European Pat. Off. . |
| 0 170 856 | 2/1986 | European Pat. Off. . |
| 33 31 048 C1 | 1/1985 | Germany . |
| 89/03902 | 5/1989 | WIPO . |

OTHER PUBLICATIONS

Yoon et al., "Crystal Growth of dislocation–free LiNbO$_3$ single crystals by micro pulling down method," Journal of Crystal Growth, vol. 142, No. 3/4, Sep. 1994, Amsterdam NL, pp. 339–343, XP000468428.

Oguri et al., "Growth of MgO doped LiNbO$_3$ single crystal fibres by a novel drawing down method," Journal of Crystal Growth, vol. 110, No. 4, Apr. 1991, Amsterdam NL, pp. 669–767, XP000242065.

Yoon et al., "Morphological aspects of potassium lithium niobate crystals with acicular habit grown by the micro–pulling down method," Journal of Crystal Growth, vol. 144, No. 3/4, Dec. 1994, Amsterdam NL, pp. 207–212, XP000483660.

Patent Abstracts of Japan, vol. 11, No 163 (C–424) May 26, 1987 & JP 61 291487 A (Sumitomo Electric Ind. Ltd) Dec. 22, 1986.

*Primary Examiner*—Felisa Hiteshew
*Attorney, Agent, or Firm*—Wall Marjama Bilinski & Burr

[57] ABSTRACT

A process is disclosed for continuously producing a single crystal by drawing downwardly a melt of a single crystal raw material, wherein a single crystal body grown from the melt is continuously pulled downwardly, and a plurality of single crystal products are continuously formed by intermittently cutting the single crystal body being downwardly moved.

12 Claims, 33 Drawing Sheets

FIG_2
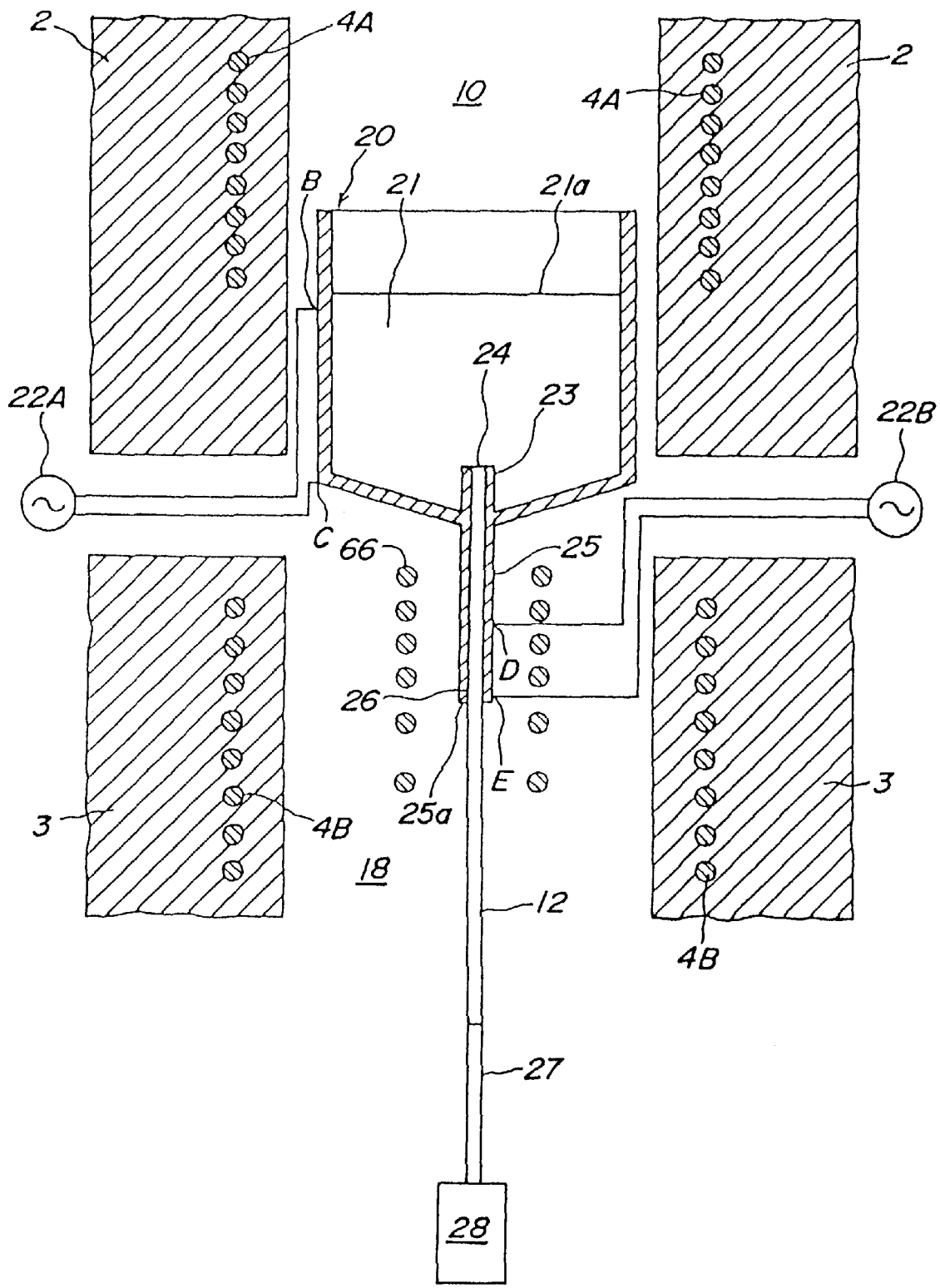

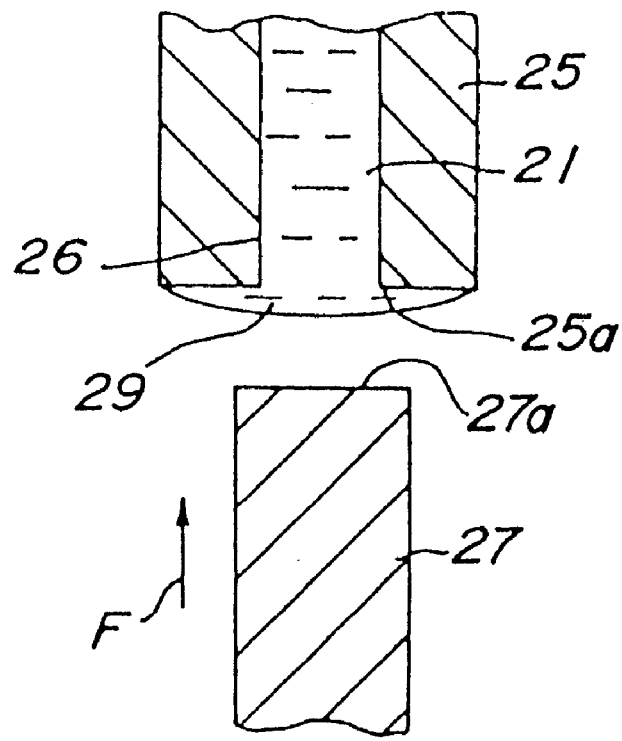
FIG_3a
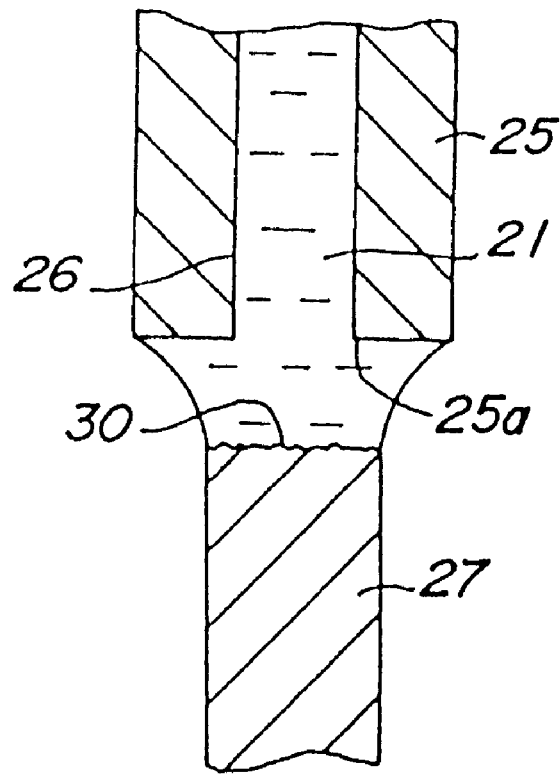
FIG_3b

FIG_4a
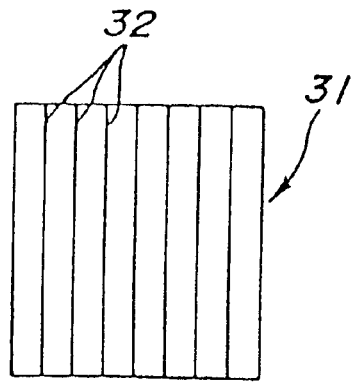
FIG_4b
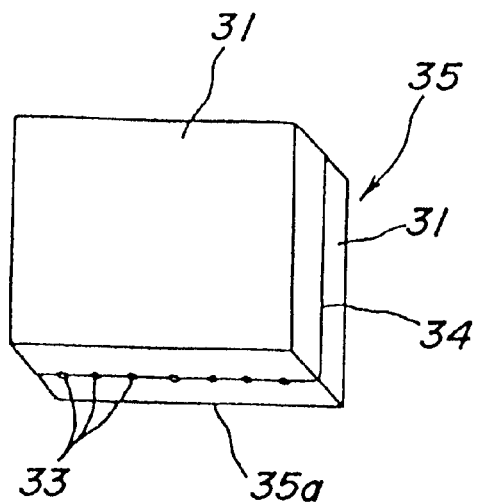
FIG_4c
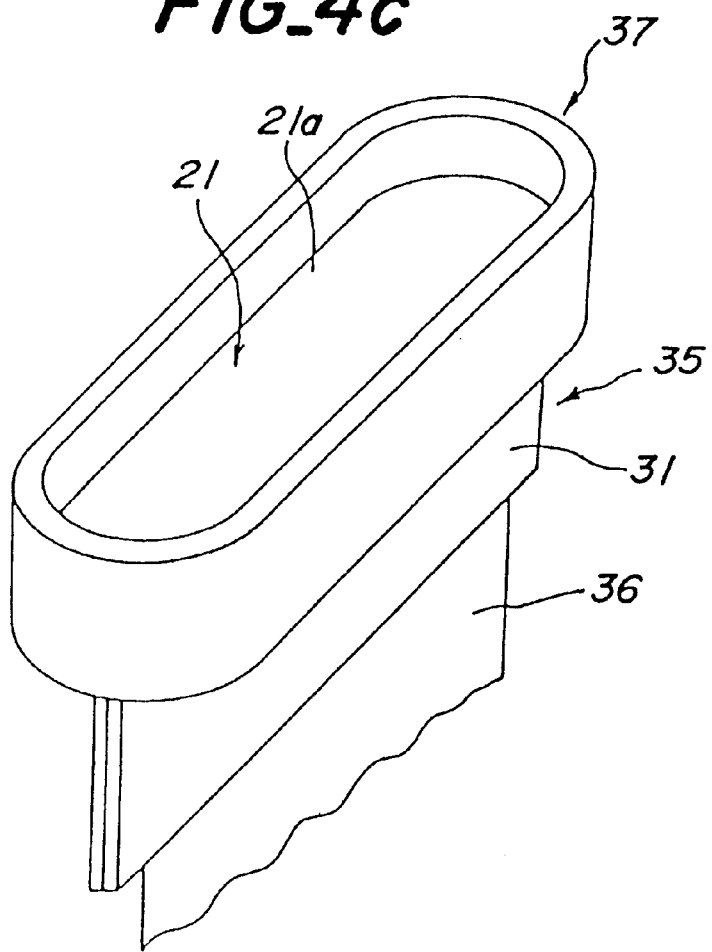

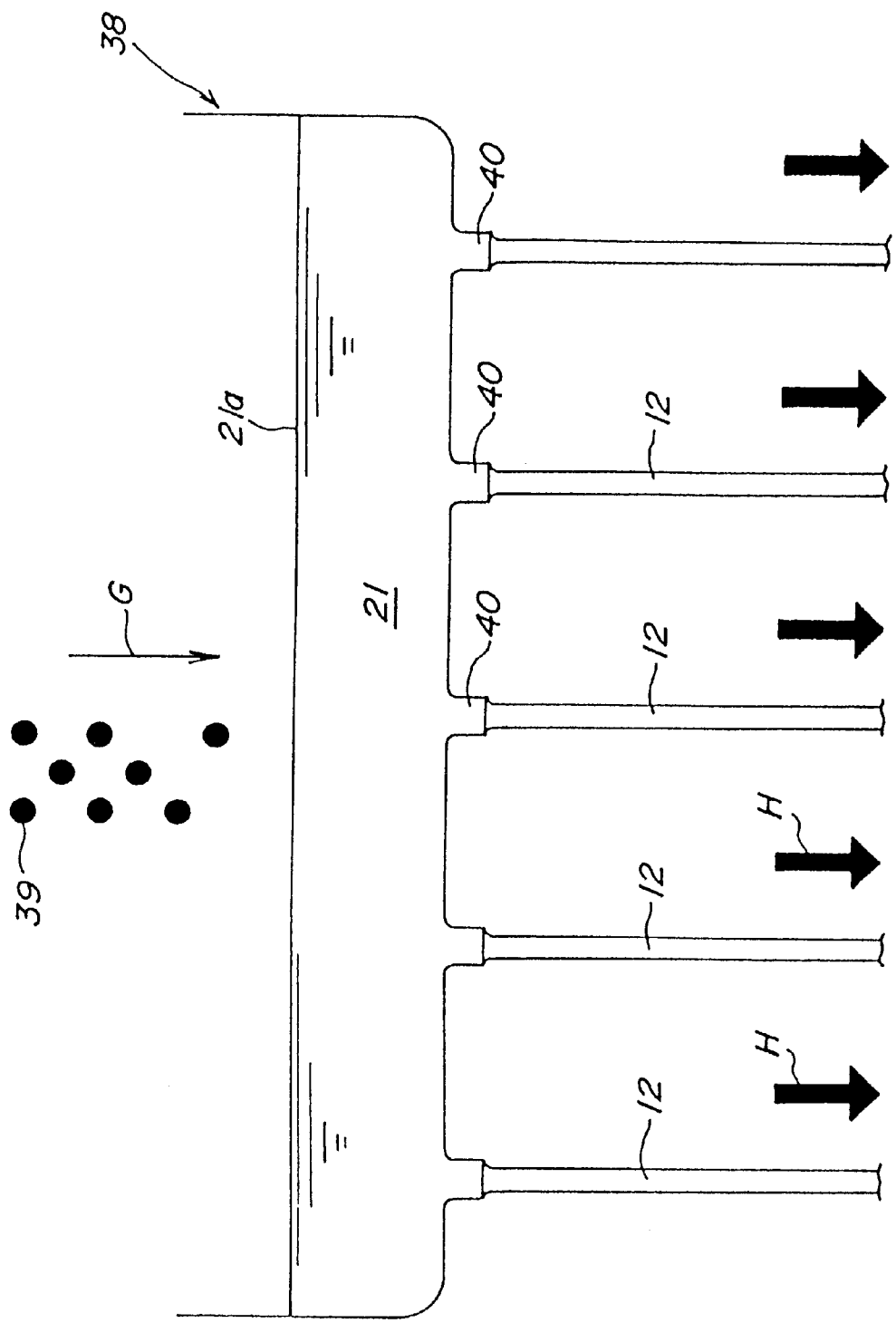

FIG_6
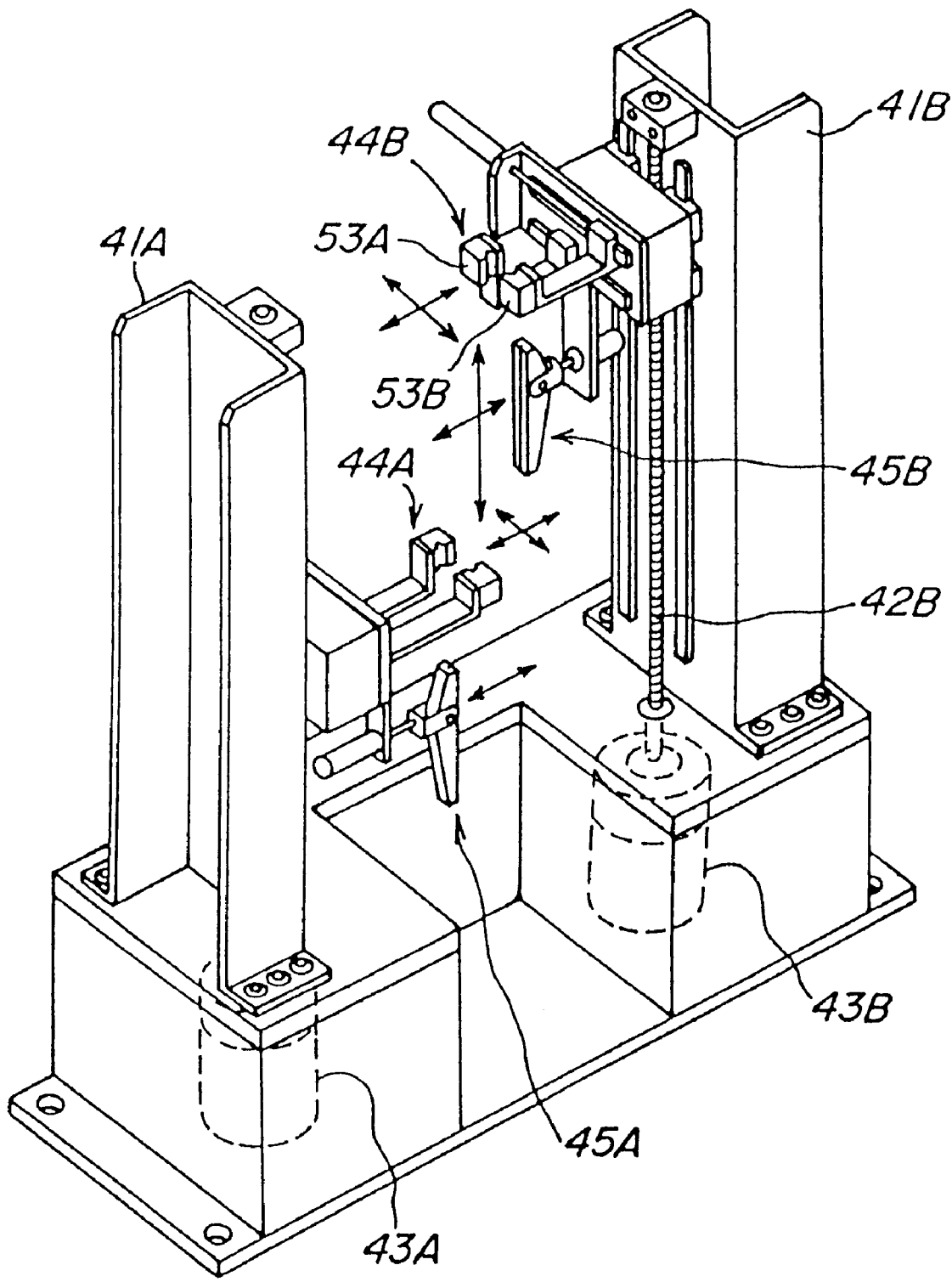

FIG_7
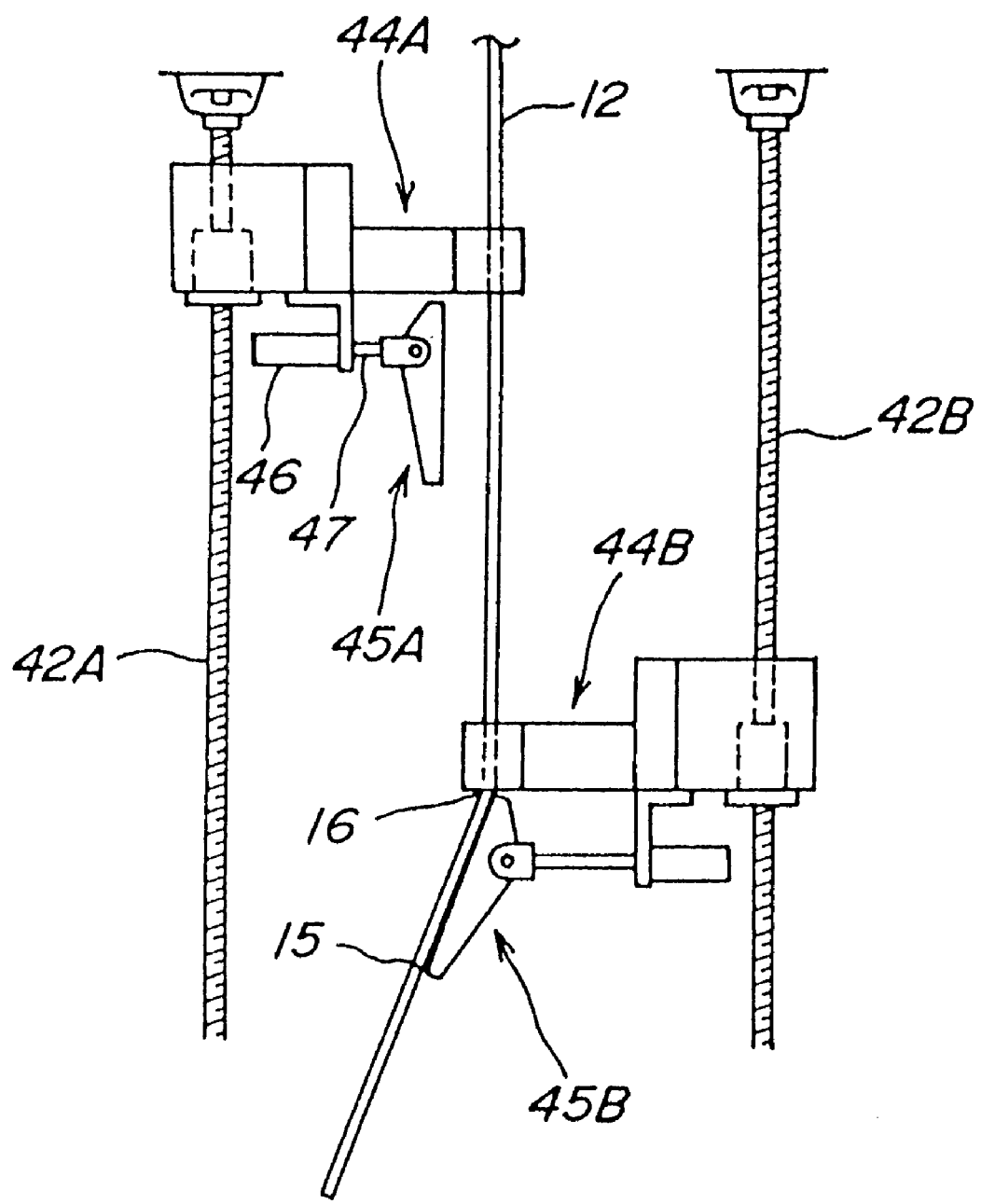

FIG_8
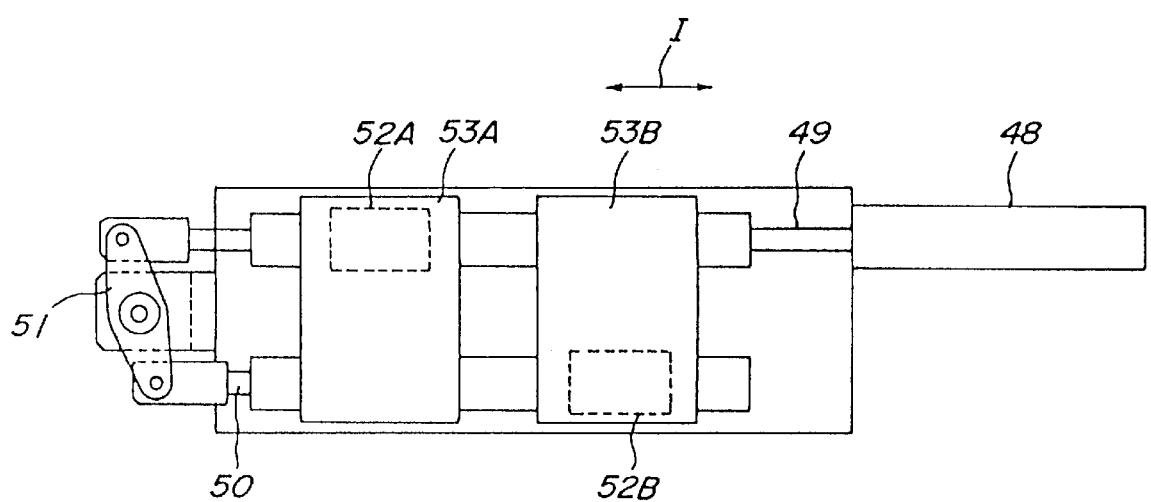

FIG_10
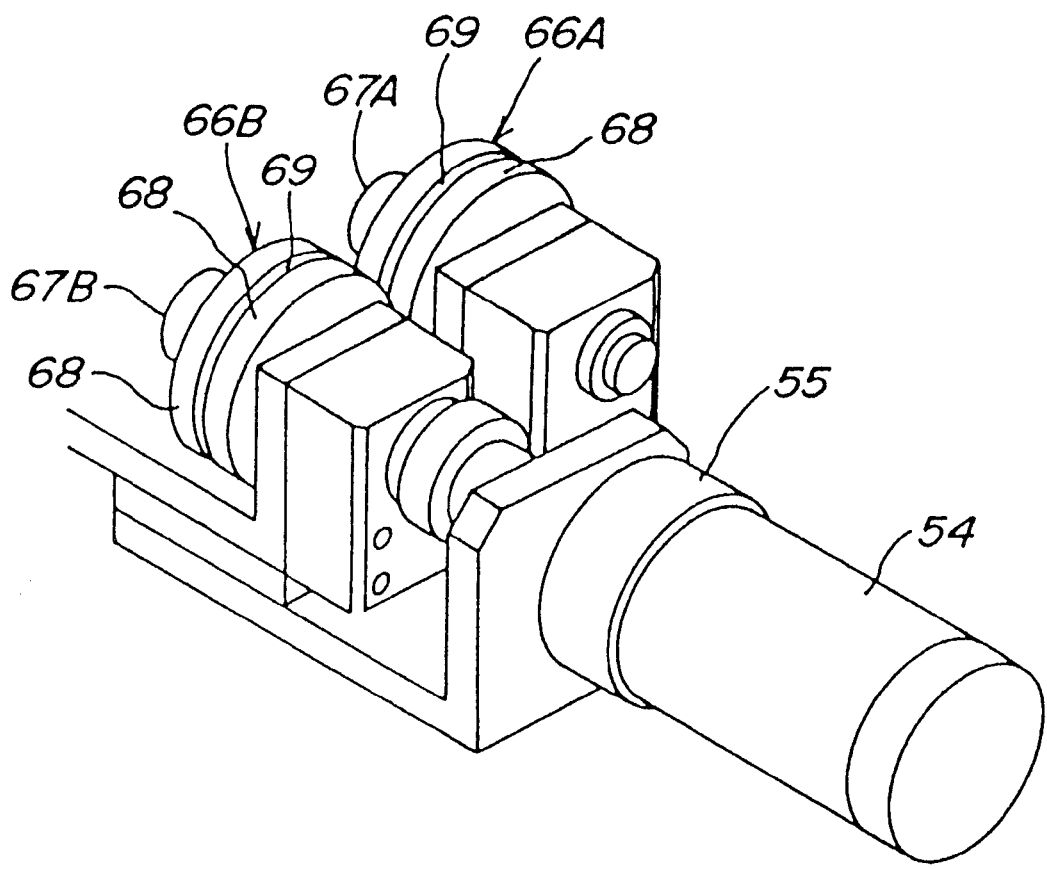

FIG_11a
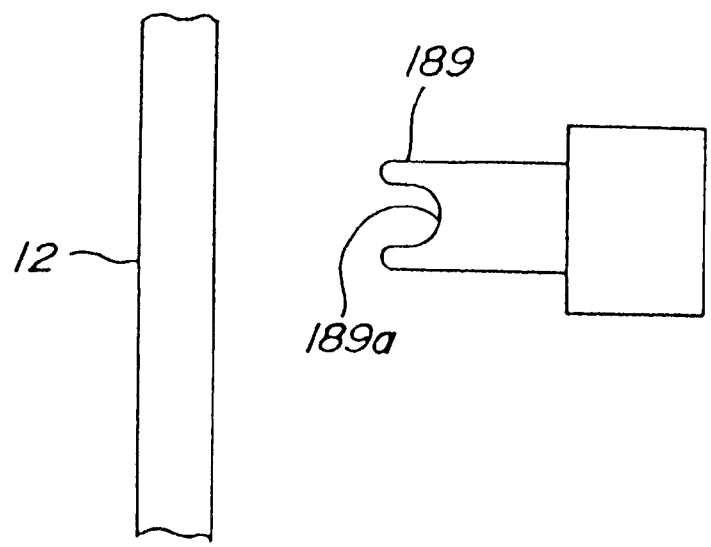
FIG_11b
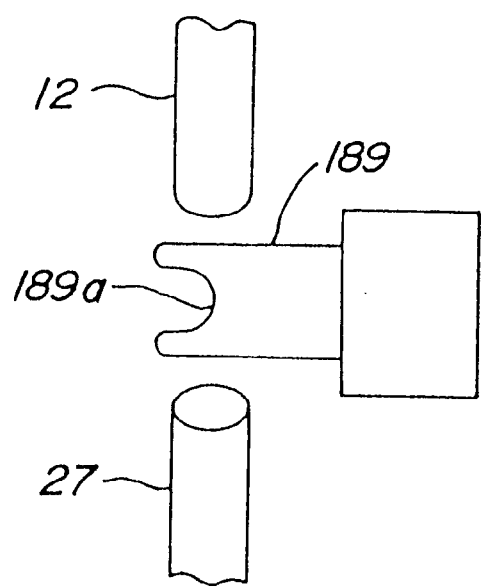

FIG_14

FIG_16

FIG_18a
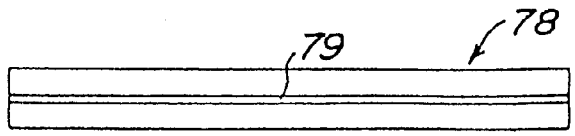
FIG_18b
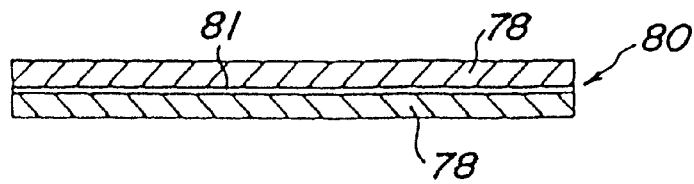
FIG_18c
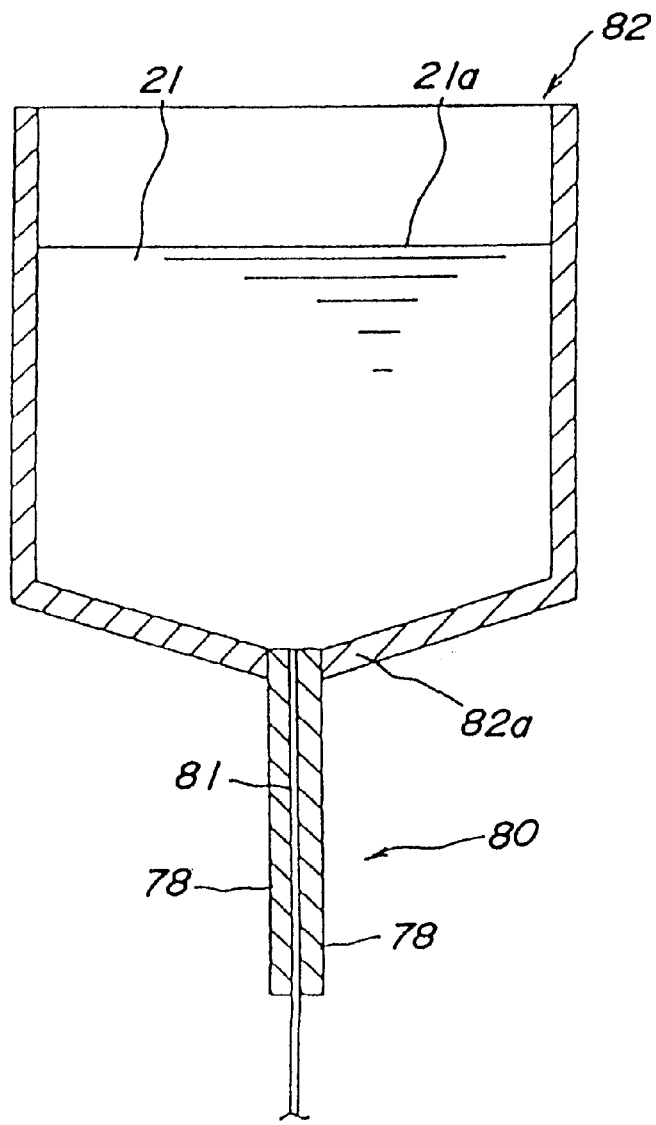
FIG_18d

FIG_19
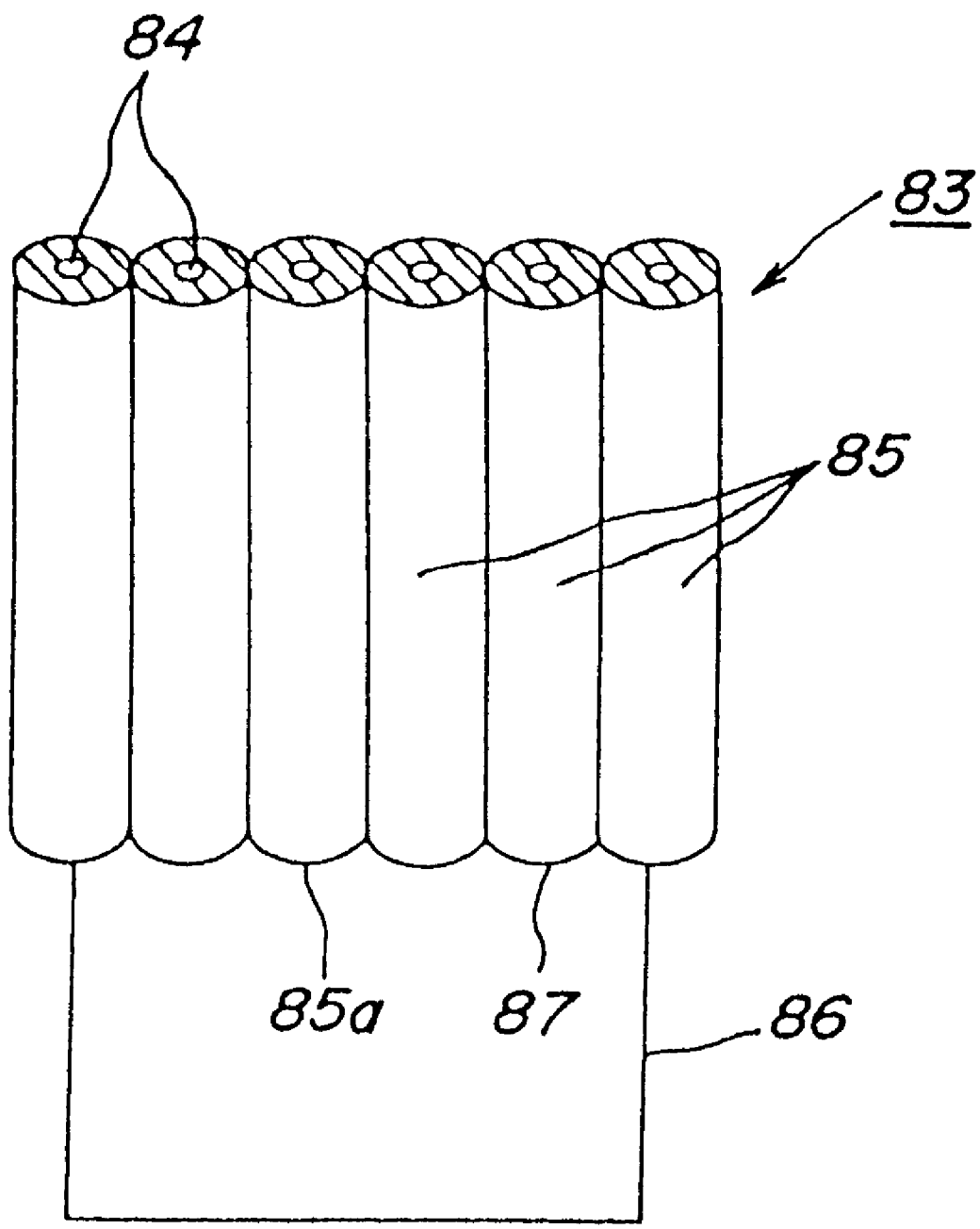

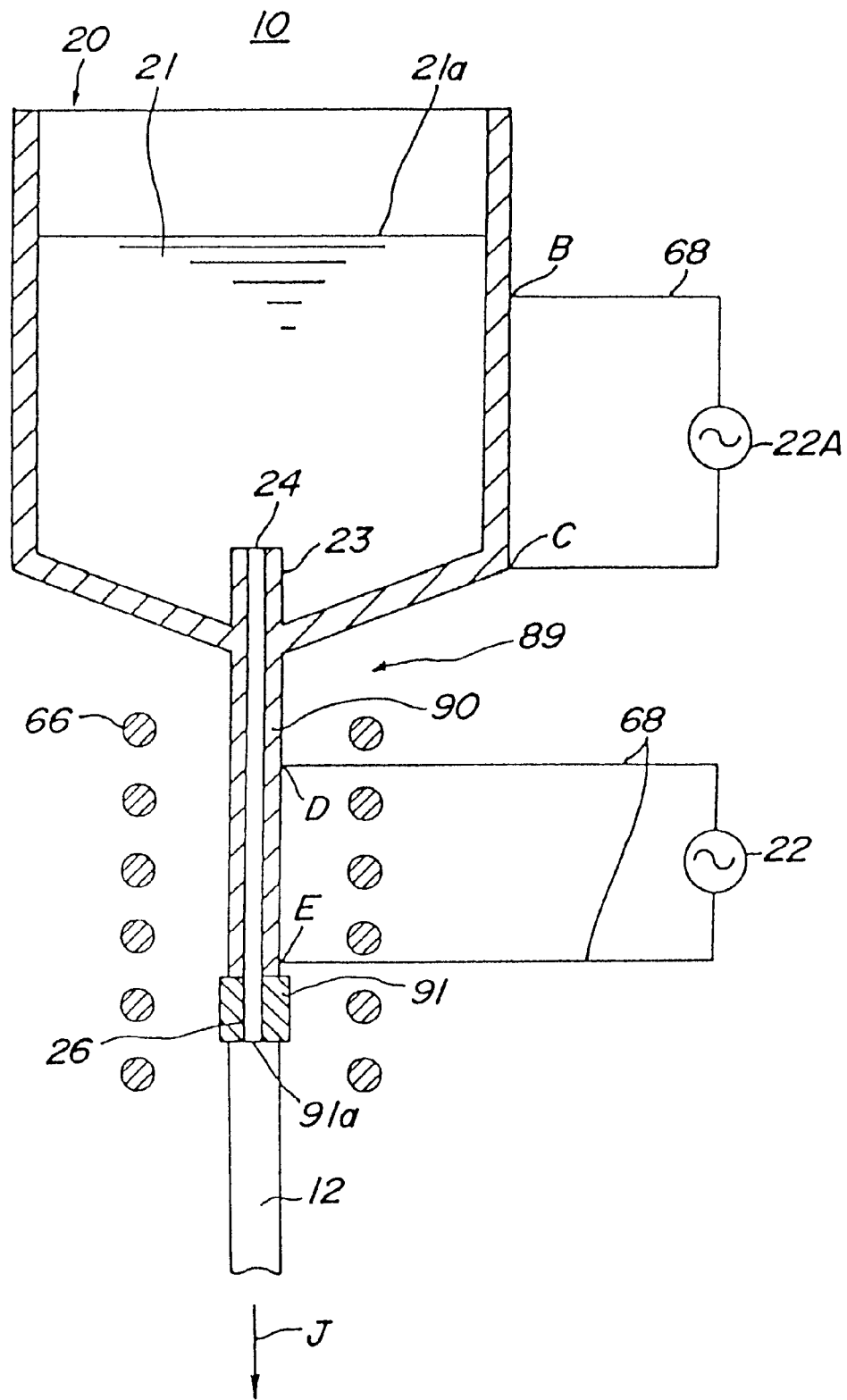
FIG_20

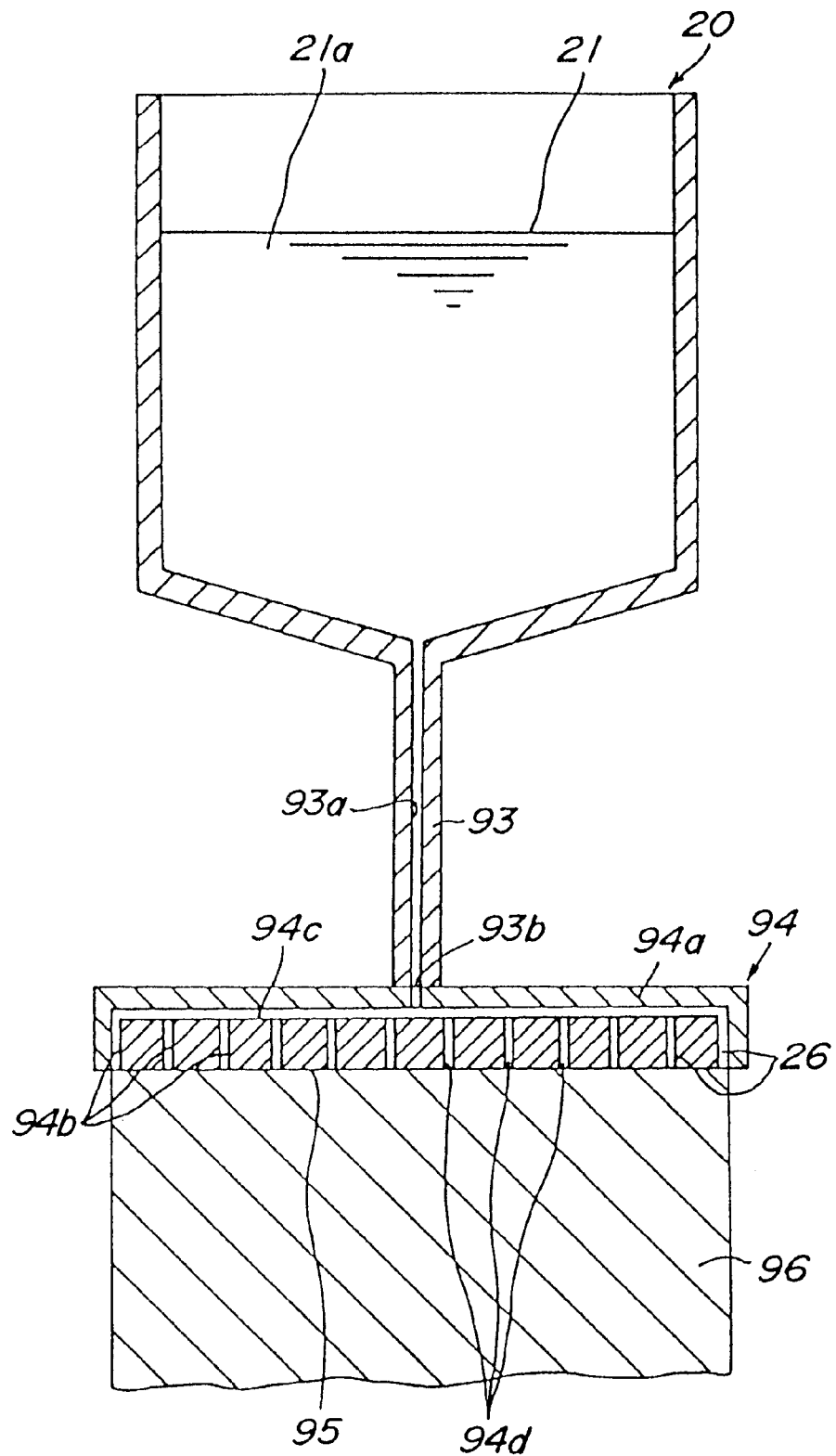
FIG_21

FIG_23

FIG_24

FIG_31
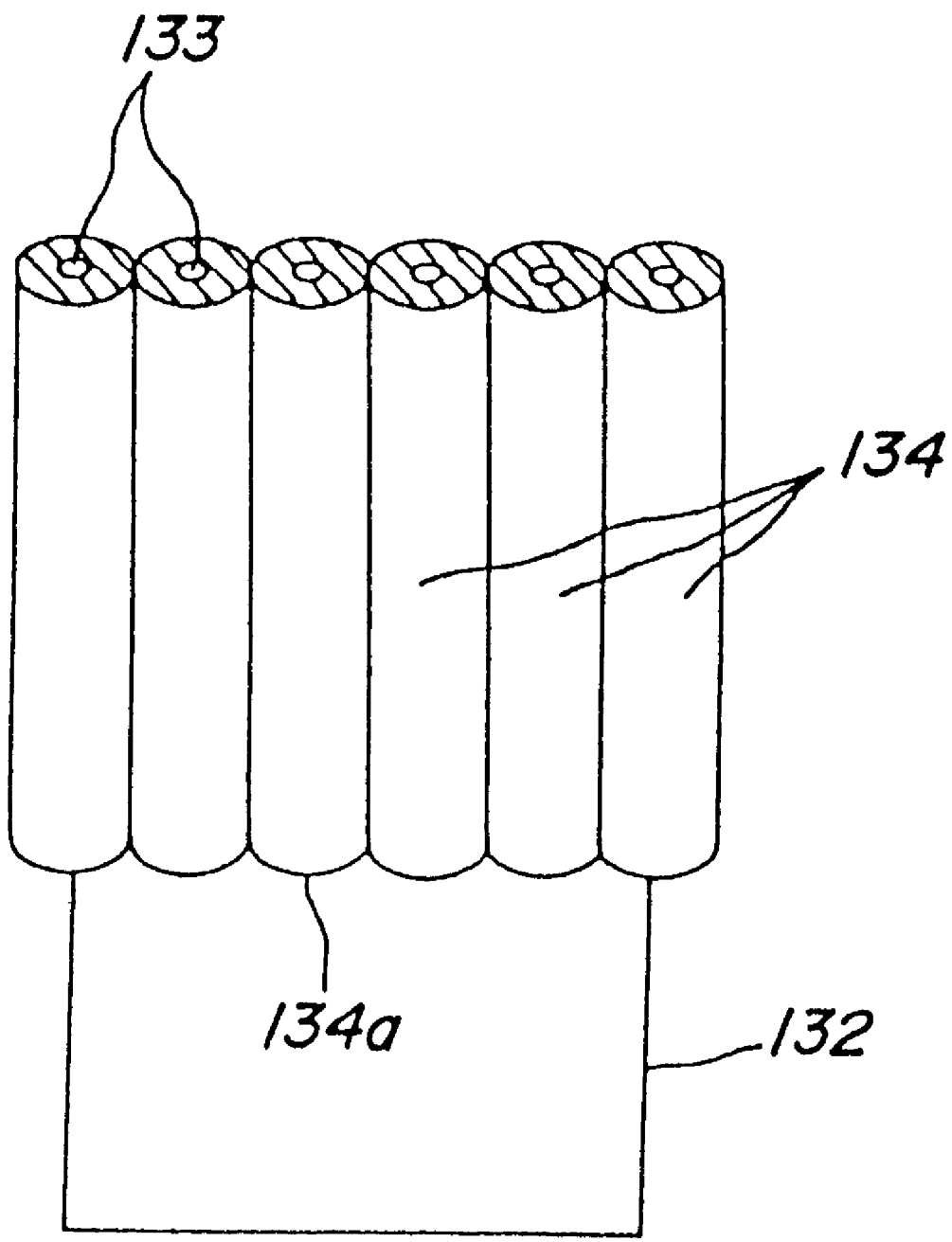

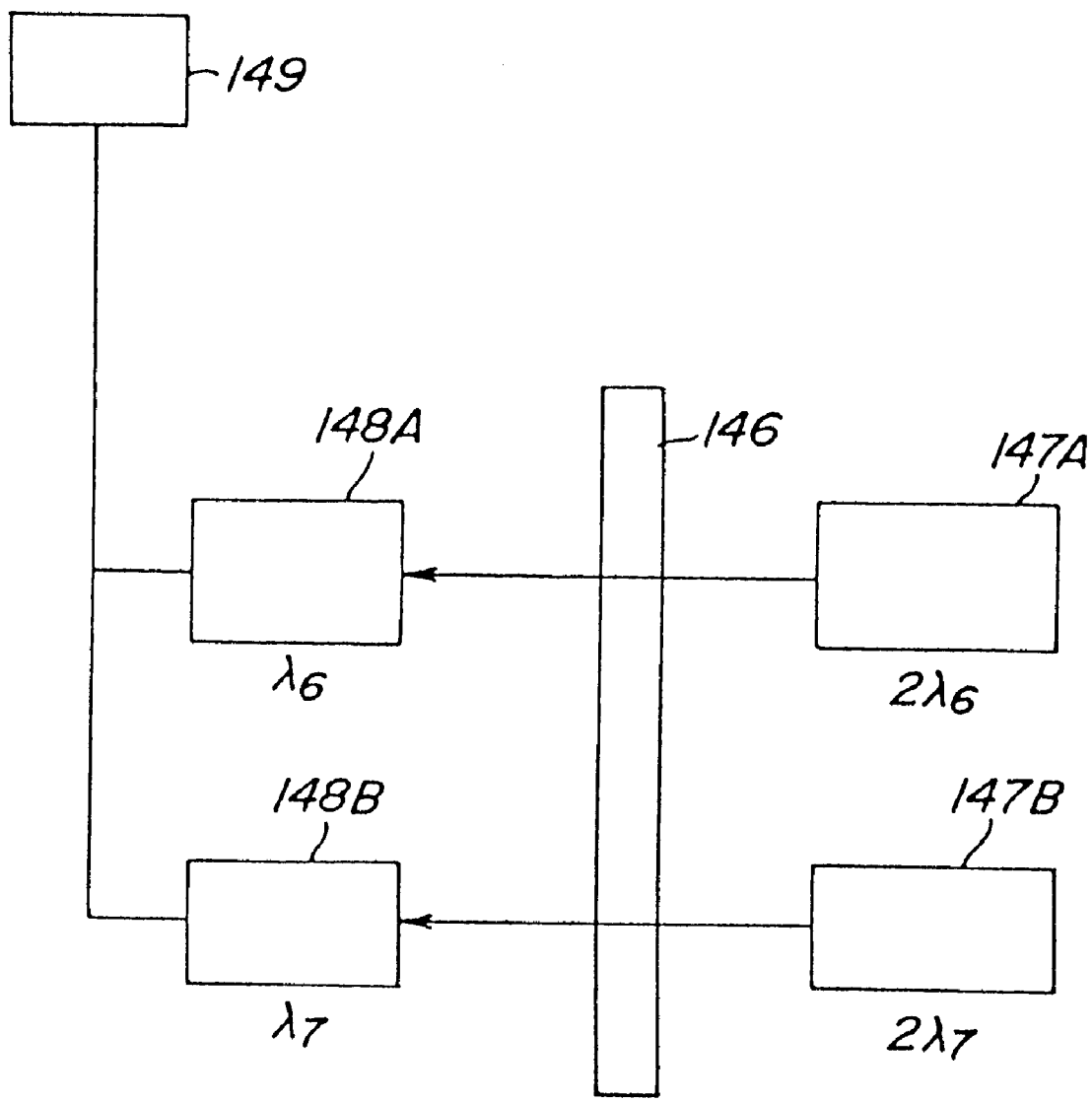
FIG_35

SINGLE CRYSTAL-GROWING METHOD AND APPARATUS

CROSS REFERENCE TO RELATED APPLICATIONS

This is a divisional application of U.S. Ser. No, 08/909,138, filed Aug. 11, 1997, now allowed, which in turn is a divisional application of U.S. Ser. No. 08/616,525, filed Mar. 19, 1996, now U.S. Pat. No. 5,690,734, the entireties of which are incorporated herein by reference.

BACKGROUND OF THE INVENTION (1) Field of the invention

The present invention relates to a process and an apparatus for producing single crystals.

(2) Related Art Statement

In order to grow oxide-series single crystals, a process for producing single crystal fibers by an u pulling down process has recently attracted attention. "Electrotechnical Laboratory" No. 522, pp 4–8, July, 1993 describes the story that a single crystal fiber made of potassium lithium niobate ($K_3Li_{2-2x}Nb_{5+x}O_{15+x}$, hereinafter referred to as IIKLNII) was grown by this process.

According to this literature, electric power is fed to a cell or crucible made of platinum to resistively heat a raw material powder. A melt drawing hole is formed in the bottom of the cell or crucible, a rod member called a melt feeder is inserted into this drawing hole so that both a feed amount of the melt to the melt drawing hole and the state of an interface between a liquid phase and a solid phase may be controlled. A thin KLN single crystal fiber is continuously formed, while the diameter of the melt drawing hole, the diameter of the feeder, the protruded length of the feeder from the drawing hole, etc. are controlled. According to this $\mu$ pulling down process, the single crystal fiber having the diameter not greater than 1 mm can be formed, and it is easily possible to reduce thermal strain and to control the convection of the melt and the diameter of the single crystal fiber. This process also enables the production of a small size high quality single crystal suitable particularly for the blue laser device by second harmonic generation (SHG).

SUMMARY OF THE INVENTION

The present inventors have repeatedly studied to mass-produce KLN single crystal fibers, etc. by using the above $\mu$ pulling down process. What is the most important for the mass production technique are that a large amount of a melt is treated with an enlarged scale of the crucible, and that a long single crystal fiber-is continuously pulled down from this crucible. However, a concrete technique has not yet been known, which enables the single crystal fiber to be continuously pulled down with use of such a large amount of the raw material.

In view of this, the present inventors carried out the $\mu$ pulling down process by using an increased amount up to about 5 g of the raw material powder to be fed into the crucible, correspondingly enlarging the size of the crucible, and melting the raw material powder under heating through feeding electric power to the crucible.

However, when the scale of the crucible was increased and the amount of the melted powder was increased, it was found extremely difficult to form the single crystal by drawing the melt through the drawing hole. More specifically, when the temperature inside a furnace in which the crucible was placed was set as low as not more than 900° C. and the powder was melted inside the crucible by passing electric current mainly through the crucible, the single crystal was not excellently grown in the vicinity of the drawing hole. That is, when the electric power to be fed to the crucible was increased, the melt was kept melted and not crystallized at the drawing hole. On the other hand, when the electric power was decreased, the melt was so solidified in the vicinity of the drawing hole that the melt could not be drawn.

When the above furnace temperature was set beyond 900° C., the entire crucible was largely heated by radiant heat from the furnace, so that the temperature gradient become extremely small in the vicinity of the drawing hole. In this case, the crystallization growth could not be continuously effected, either.

In order to solve the above problem, the present inventors have developed a process for continuously drawing a single crystal fiber. This process will be explained later. However, it was found that even this process still had a problem particularly from the standpoint of mass-producing the single crystal fiber by continuously pulling down.

That is, it is necessary to prevent changes in the quality, particularly, in the composition of the single crystal fiber. Particularly, when a material for second harmonic generation or solid laser elements is to be produced, slight change in the composition largely changes its characteristics to make the resulting product unacceptable. Therefore, it is necessary to prevent changes in the composition in continuously pulling down the single crystal fiber.

In the conventional $\mu$ pulling down process, the composition of the single crystal fiber has been examined after growth. Indeed, the composition of the produced single crystal fiber can be detected by cutting off a portion of the single crystal fiber and examining its composition. But, since the single crystal fiber-growing process based on the $\mu$ pulling down process is a complicated, delicate, chemical and rheological system in which a number of various factors are correlated with one another, the composition of the single crystal fiber will often change in such a production system due to slight changes in the producing condition. As a result, since all of the numerous single crystal fibers may be unacceptable, any countermeasure is indispensable from the standpoint of the production yield.

It is an object of the present invention to provide a concrete mechanism for mass-producing an oxide-series single crystal by continuously pulling down based on the $\mu$ pulling down process.

It is another object of the present invention to enable the production of an oxide-series single crystal having a good quality by continuously pulling down based on the $\mu$ pulling down process, even if the size of the crucible is increased or the amount of the raw material is increased.

It is a further object of the present invention to enable the mass-production of an oxide-series single crystal by pulling down based on the $\mu$ pulling down process. through continuously treating a large amount of the raw material.

It is a still further object of the present invention to enable the production of an oxide-series single crystal by continuously pulling down based on the $\mu$ pulling down process, while by real-time detecting changes in the composition of the oxide-series single crystal, changes in the composition of the oxide-series single crystal are prevented and the yield thereof is largely increased.

A first aspect of the present invention relates to a process for continuously producing a single crystal by drawing down a melt of a single crystal raw material, wherein a single crystal body grown from the melt is continuously moved downwardly, and a plurality of single crystal products are continuously formed by intermittently cutting the single crystal body being downwardly moved.

The first aspect of the present invention also relates to a single crystal product-producing apparatus which includes a single crystal-growing device in which a melt of a single crystal raw material is placed and a single crystal body is grown by drawing downwardly the melt, a moving device for continuously moving downwardly the grown single crystal body, and a cutter for intermittently cutting the single crystal body being downwardly moved to continuously produce a plurality of single crystal products.

The present inventors have found out that the single crystal products having uniform composition and characteristics as well as a uniform shape can be obtained by continuously pulling downwardly the single crystal body and intermittently cutting the single crystal body at a given downstream location under the pulling down step. The present invention has been accomplished based on this finding. More specifically, it was found out that the process for continuously producing a plurality of the single crystal products by continuously pulling downwardly the grown single crystal body and intermittently cutting the single crystal body being moved is a process for industrially and stably mass-producing a number of the single crystal products having a given shape.

The above moving device preferably includes a pair of rotary bodies for sandwitching the single crystal body therebetween, and a driving device for rotating the rotary bodies, wherein the single crystal body is continuously downwardly moved by rotating the rotary bodies such that the single crystal body is sandwitched between the pair of the rotary bodies. According to this embodiment, an installation space for the moving device can be reduced. Further, since a pressure can be stably applied upon the single crystal body even with the lapse of time, there is no fear that the crystallinity of the single crystal body is deteriorated upon application of a large stress upon a part of the single crystal. This construction is particularly suitable for pulling down the single crystal fiber.

In the above embodiment, if the temperature of the single crystal body is high, particularly, beyond 200° C., the single crystal body may be adversely affected depending upon the material constituting the rotary bodies. Therefore, it is preferable that the rotary bodies are made of a heat-resistive material such as Teflon. Further, if a seed crystal is pulled downwardly by the above rotary bodies and then the single crystal body is continuously pulled down, it is difficult to smoothly move a portion of the single crystal body in the vicinity of a interface between the seed crystal and the single crystal body because the dimension of the seed crystal differs from that of the single crystal body. Therefore, it is preferable to pull downwardly the seed crystal by another pulling down mechanism exclusively for the seed crystal.

Further, in a preferable embodiment the single crystal-moving device includes a plurality of holders for grasping the single crystal body, and a driving device for vertically moving the holders, wherein the single crystal body is grasped by one holder and this holder is downwardly moved such that the single crystal body is grasped by this holder, the single crystal body is then grasped by the other holder and this other holder is downwardly moved such that the single crystal body is then grasped by the other holder, and these steps are repeated to downwardly move the single crystal body. According to this construction, even if the dimension and the shape of the single crystal body are changed variously, such changes can be easily be coped with by adjusting a pair of chucks of each of the holders.

However, in the above embodiment, it may be feared that the single crystal body is vibrated or its central axis is deviated due to stress applied upon the single crystal body at the moment the single crystal body is grasped by the chucks of the holder. In order to prevent this, it is effective to simultaneously grasp the single crystal at plural sites. Further, if the single crystal body is grasped by a pair of the chucks such that the center between a pair of the chucks is not coincident with that of the single crystal body, it may be feared that the crystallinity of the single crystal body is deteriorated due to stress applied upon the single crystal body from either one of the chucks. In order to prevent this, the chucks are preferably made detachable so that the fitted location of each of the chucks may be changed or adjusted to make the center of a pair of the chucks coincident with the center of the single crystal body.

Furthermore, according to the present invention, it is necessary to provide the pulling device for pulling downwardly the single crystal body. Although a method may be considered that the single crystal body is downwardly led by the self weight of the melt inside the crucible, the crystallinity of the single crystal will be deteriorated by such a method.

In a preferred embodiment, the cutter cuts the single crystal body by fusing through heat-generating a heating wire. This is a method to locally fuse the single crystal body by instantaneously raising the temperature of the heater arranged near around an intended portion of the single crystal body. This method hardly applies stress upon the single crystal body with no fear of adversely affecting the crystallinity of the single crystal body.

Further, in a preferable embodiment, a cutter for cutting the single crystal body by fusing it through irradiating a laser beam upon the single crystal body. This method scarcely exerts mechanical forces upon the single crystal and does not cause deterioration of the crystallinity. Further, such a cutter can be easily set relative to the single crystal body. As the laser, carbon dioxide laser may be preferably used.

In addition, in a preferred embodiment, the cutter cuts the single crystal body by mechanically destructing a given portion thereof through pressing a cutting member against the single crystal body. For this purpose, in order to reduce mechanical stress applied to the single crystal body, it is preferable to use a shearing member or scissors each having a distal end of a reduced cross-sectional area.

Furthermore, in a preferred embodiment, the single crystal-producing apparatus includes a feeder for automatically supplementing a fresh single crystal raw material into the melt inside the crucible. In this case, the single crystal raw material can be continuously supplemented in the crucible at a given feed rate. Further, a given amount of the single crystal raw material can be intermittently fed into the crucible every given interval.

The single crystal raw material can be fed according to a given program. The single crystal-producing apparatus preferably includes a device for measuring the level of the melt in the crucible, and a controller for maintaining the level of the melt in the crucible at a constant height by controlling the feed rate of the single crystal raw material based on a signal from the measuring device. Although the growing state of the single crystal body changes variously, the thermodynamic condition in the vicinity of the single crystal drawing hole can be kept constant so that the crystallinity and the composition of the single crystal body may be kept constant.

For this purpose, when a thermocouple is arranged as the measuring device in the vicinity of the surface of the melt inside the crucible, the temperature detected by the thermocouple decreases as the surface of the melt lowers. The controller receives a corresponding signal from the thermocouple, and outputs an order to the raw material feeder so that a fresh single crystal raw material may be fed in the crucible. In this embodiment, if the raw material is fed by a batch system, the crystallinity may be adversely affected due to reduction in the temperature of the melt at the moment the raw material is fed. Therefore, it is preferable that while the temperature in the vicinity of the melt is continuously detected by the thermocouple, the raw material is continuously fed at a given rate, and when reduction in the temperature is detected by the thermocouple, a small amount of the raw material is fed. By so doing, the amount of the raw material to be fed by the batch system can be reduced.

The thermocouple is particularly preferred if the temperature of the melt is higher beyond 800° C.

If the temperature of the melt inside the crucible is relatively low, a temperature sensor or an optical sensor for detecting the surface of the melt by a light beam may be arranged inside the furnace. However, if the melt exceeds 800° C., it may be that such a sensor is placed in a sensor cover, and a cooling medium may be flown inside the sensor cover.

In a preferred embodiment, the single crystal-producing apparatus according to the present invention includes a device for measuring changes in the weight of the melt, and a controller for controlling the feed rate of the single crystal raw material based on a signal from the measuring device so that the weight of the melt in the crucible may be kept in a given range. By so doing, the crystallinity of the single crystal body can be kept constant similarly as in the above case.

The single crystal-producing apparatus according to the present invention preferably includes an observing device (or a shape measuring device) for observing the shape of the single crystal body, and a shape controller for controlling the shape of the single crystal body based on the information from the observing device. By so doing, if the shape of the single crystal body changes during the automatic mass-production of the single crystal products, such changes can be corrected. More specifically, if the dimension of the single crystal body increases, such a dimensional change amount is detected, and a signal corresponding to this change amount is fed to the controller. The controller may output a temperature control signal to the heater inside the furnace so that the dimension of the single crystal body may be slightly reduced by sending a signal from the controller to the heater to make the heater to slightly raise the temperature. If the heater receives a signal from the controller to slightly lower the temperature, the dimension of the single crystal body can be slightly increased.

The shape measuring device may be a device for monitoring the outer shape of the single crystal body through taking a view of this outer shape with a CCD camera. However, since this device cannot detect an absolute actual dimension of the single crystal body, it is preferable to set a standard scale near the single crystal body. Further, the view of the single crystal body may be dark, it is preferable to set an illuminating device near the single crystal body.

In addition, the dimension of the single crystal body may be measured by irradiating a laser beam upon the single crystal body. In this case, it is necessary that the temperature in the vicinity of the laser beam source is lowered by setting the laser beam source away from the furnace body. If the laser beam is irradiated upon the single crystal body from one direction only, the dimension can be measured only from this one direction so that the entire shape thereof cannot be measured. Therefore, preferably the dimension of the single crystal body is measured by irradiating the laser beams from at least two crossing directions.

Further, if a line sensor is used, its viewing image is unfavorably dark. In this case, it is also preferable to set an illuminating device for the single crystal body.

In a preferred embodiment, the single crystal-producing apparatus includes an observing device for observing the material quality of the single crystal body, and a quality controller for controlling the material quality of the single crystal body based on information from the observing device. By so doing, the single crystal products having uniform crystallinity can be mass-produced. In this embodiment, it is preferable that a laser beam is irradiated upon the single crystal body being pulled down, an outputted light beam from the oxide-series single crystal body is measured, and the proportion ratio of components in the composition of the single crystal raw material to be fed to the crucible is controlled based on the measuremental result so that change in the composition of the raw material may be prevented even in the case of continuously pulling down a single crystal fiber.

More specifically, if the peak wavelength of a generated light beam from the oxide-series single crystal shifts to a shorter wavelength side, this means that the composition of the single crystal deviates from a target one. Therefore, the proportion ratio of components in the composition of the raw material is changed so that the shifting of the peak wavelength may be reduced. By so doing, while the single crystal fiber or the like is being drawn, its composition can be maintained in a given range. It is more preferable that half wavelength light beams are detected through irradiating a laser beam on an oxide-series single crystal having a SHG effect.

Further, in a preferred embodiment, the invention apparatus includes a transfer device for automatically arraying and transferring the cut single crystal bodies. This is preferable from the standpoint of the mass-production, because the arrayed single crystal products can be automatically transferred to a succeeding step. Particularly, when the single crystal fiber product is used as an SHG element, the above embodiment is extremely preferable, because such single crystal fiber products are transferred to a succeeding assembling step as they are arrayed.

Further, according to a preferred embodiment, a plurality of single crystal drawing holes are provided in the single crystal growing device so that single crystal bodies may be simultaneously pulled down through said plural single crystal drawing holes, respectively.

As single crystals to which the present invention can be applied, oxide-series single crystals and non-oxide series single crystals may be recited. Particularly, the oxide-series single crystals are preferred. As such oxide-series single crystals, known oxide-series single crystals may be recited, and particularly oxide-series single crystals for blue laser device by SHG, such as KLN, KLTN and KN ($KNbO_3$) as well as oxide-series single crystals for ultraviolet laser device, such as CLBO ($CS_{0.5}Li_{0.5}B_3O_5$), BBO ($\beta\text{-}BaB_2O_4$) and LBO ($LiB_3O_5$) are preferred. Further, later described oxide-series single crystals in a state of solid solution are preferred.

Next, a preferred growing device used in the present invention will be explained. The present inventors have made studies on how to enlarge the crucible so as to establish the oxide-series single crystal mass-production technique based on μ pulling down process. During the process of these studies, the inventors have tried to enlarge the crucible, provide a nozzle portion extending downwardly from the crucible, providing a single crystal-growing section at the lower end of the nozzle portion, and independently control the respective temperatures of the crucible and the single crystal-growing section.

As a result, it was discovered leading to the present invention that even if a large amount such as not less than 5 g of the powdery raw material to be melted in the crucible is used and the volume of the crucible is correspondingly increased, the oxide-series single crystal body can be easily continuously pulled down.

The reason why the above function and effect are obtained is probably that the provision of the single crystal-growing section at the lower end of the nozzle portion makes the single crystal-growing section difficult to be directly influenced by the heat generated by the melt in the crucible, and the temperature gradient in the vicinity of the single crystal-growing section can be made greater by simultaneously and independently controlling the temperatures of the single crystal-growing section, the end of nozzle portion, and the crucible.

In addition, the inventors have found out that according to the above technique, even if the amount of the powdery raw material to be melted in the crucible is increased up to around 30–50 g, changes in the composition in the case of KLN single crystal fiber products is suppressed to a surprisingly high accuracy with changes of not more than 0.01 mol %. Therefore, the oxide-series single crystal having an extremely high accuracy composition can be mass-produced by incorporating the above technique into the present invention.

Further, the present inventors have studied the state of the melt in the single crystal-growing section as well as the physical properties of the single crystal by using the above producing apparatus. As a result, it was discovered that if the surface tension is more dominant than the gravity in the environment of the single crystal-growing section, the oxide-series single crystal body having a very small change in composition can be excellently pulled down continuously. It is considered that a good solid phase/liquid phase interface (meniscus) is formed by so doing.

In order to produce the condition that the surface tension is more dominant than the gravity in the environment of the single crystal-growing section, it is effective to provide, inside the crucible, a mechanism for reducing the gravity acting on the melt in the nozzle. The inventors have investigated such a mechanism and found out that the condition that the surface tension is more dominant than the gravity acting on the melt can be realized particularly by setting the inner diameter of the nozzle portion to not more than 0.5 mm so that a uniform meniscus can be formed at the distal end opening of the nozzle portion.

In this case, if the inner diameter of the nozzle portion is less than 0.01 mm, the growing speed of the single crystal becomes too small. Therefore, the inner diameter of the nozzle portion is preferably not less than 0.01 mm from the viewpoint of mass production. The optimum inner diameter of the nozzle portion is preferably set in a range of 0.01 to 0.5 mm from the stand point of the mass production, which may slightly change depending on the viscosity, the surface tension, and the specific gravity of the melt, the growing speed of the single crystal, etc.

Further, the present inventors have studied the above point, and obtained the following finding. That is, it was considered that the single crystal fiber could be continuously pulled down in the conventional μ pulling down process since the scale of the crucible was small. It can be presumed that since the amount of the melt in the crucible was small, the melt was attached to the surface of the wall of the crucible due to its surface tension, and therefore the gravity acting on the drawing hole was relatively smaller, a somewhat uniform solid phase/liquid phase interface was formed. However, it is presumed that as the dimension of the crucible was increased, the condition that the surface tension was more dominant in the vicinity of the drawing hole was disappeared.

In the above process, the temperature gradient can be easily made larger in the vicinity of the single crystal-growing section as viewed in the longitudinal direction of the nozzle portion. Owing to this, the melt flowed down through the nozzle portion can be rapidly cooled.

Therefore, this producing process is suitable particularly for the production of the single crystal of a solid solution state. The single crystal of a solid solution state has the property that the proportion ratio in the composition changes under an equilibrium condition. When the conventional μ pulling down process is used, the equilibrium condition exists in the vicinity of the drawing hole, and the composition of the solid solution is changed depending on changes in the temperature or change in the solidifying rate. This is considered to be caused by the above change in the proportion ratio in the composition. To the contrary, according to the invention process and apparatus, since the single crystal can be rapidly cooled in the vicinity of the single crystal-growing section, the composition of the melt can be maintained.

As the solid solution, for example, KLN, KLTN [$K_3Li_{2-2x}(Ta_yNb_{1-y})_{5+x}$] $O_{15+x}$ and $Ba_{1-x}Sr_xNb_2O_6$, which have tungsten-bronze structre, and Mn-Zn ferrite may be recited.

When the raw material is fed into the crucible and melted therein, the thermal condition inside the crucible changes due to heat of dissolution of the raw material, so that the composition of the single crystal changes. However, if the nozzle portion is provided below the crucible as mentioned before, the raw material can be continuously or intermittently fed in the crucible. For, even if the thermal change occur inside the crucible, thermal influence upon the single crystal-growing section is small. Since the single crystal is not in an equilibrium state at the single crystal-growing section but in a kinetics state, the single crystal-growing section is further hardly influenced by the thermal changes.

The producing apparatus according to the present invention is not limited to any particular heating means for the crucible. However, it is preferable to provide a heating furnace as surrounding the crucible. In this case, it is preferable that the heating furnace is divided into an upper furnace portion and a lower furnace portion, and the crucible is surrounded by the upper furnace portion, and the upper furnace portion may be heated at a higher temperature to assist the melting of the powder inside crucible. On the other hand, it is preferable that the lower furnace portion is arranged to surround the nozzle portion, and the temperature of the lower furnace portion is set lower so that the temperature gradient in the single crystal-growing section at the lower end of the nozzle portion may be greater.

Further, in order to improve the efficiency of melting the powder inside the crucible, it is preferable that the crucible itself is made of an electrically conductive material, and is caused to generate heat through applying electric power thereto rather than heating the crucible by using only the heating furnace outside the crucible. Further, in order to keep the molten state of the melt flowing the nozzle portion, preferably the nozzle is made of a conductive material and caused to generate heat through applying electric power to the nozzle portion.

In order to make larger the temperature gradient particularly in the single crystal-growing section, it is preferable that a current-passing mechanism for the crucible and that for the nozzle portion are separately provided, and can be independently controlled.

As the above conductive material, materials such as platinum, platinum-gold alloys, platinum-rhodium alloys, platinum-iridium alloys, and iridium are preferred.

The present invention can excellently be applied to not only the production of the single crystal fiber products but also the production of the planar shaped single crystal products. A specific process for the formation of such a planar shaped single crystals will be explained later.

The KLN single crystal has recently attracted attention as one of optical materials, and particularly the KLN single crystal has recently attracted attention as a single crystal for a blue laser device by second harmonic generation (SHG) element. Since the KLN single crystal can generate a light beam in an ultraviolet ray area of down to 390 mn, such a single crystal can find wide applications in optical disc memory, medical use, photochemical use, various optical measurements, etc. by utilizing the short wavelength light beam as mentioned above. Further, since the KLN single crystal has a large electro-optic effect, it can be applied to an optical memory element utilizing a photorefractive effect thereof.

According to the oxide-series single crystal producing process according to the second aspect of the present invention, the raw material for the oxide-series single crystal is melted in the crucible, a seed crystal is brought into contact with the melt, and the oxide-series single crystal body is grown, while drawing the melt downwardly. This process is carried out by using the producing apparatus including the crucible, the nozzle portion extending downwardly from the crucible, and the downwardly directed single crystal-growing section at the distal end of the nozzle portion, wherein the temperature of the crucible and that of the single crystal-growing section are independently controlled.

Further, the oxide-series single crystal producing apparatus according to the second aspect of the present invention is adapted to melt the oxide-series single crystal raw material in the crucible, bringing a seed crystal into contact with the melt, and growing the oxide-series single crystal, while drawing the melt downwardly. This apparatus includes the crucible, the nozzle portion extending downwardly from the crucible, the single crystal-growing section provided at the lower end of the nozzle portion, and the mechanism for independently controlling the temperature of the crucible and that of the single crystal-growing section.

When the drawing hole is provided in the bottom of the crucible as in the conventional apparatus and the melt is directly drawn through the drawing hole, it is considered that a good solid phase/liquid phase interface could not be formed in the vicinity of the drawing hole due to thermal influence of the crucible and the melt in the crucible in the vicinity of the drawing opening.

In addition, the present invention is not limited solely to the melting of a large amount of the powder and the continuous pulling down of the single crystal body through the lower end of the nozzle portion. The present inventors continuously pulled down a KLN single crystal fiber by using a conventional single crystal-producing apparatus, while the amount of the powder inside the crucible was suppressed to 300 to 500 mg then precisely measured the composition of the fiber. As a result, it was discovered that the composition changed in a range of about 1.0 mol %.

Surprisingly high accuracy can be realized by the producing process and apparatus according to the second aspect of the prevent invention from the stand point of the improved homogeneity of the composition of the single crystal as compared with the conventional pulling down process.

Further, for the above-mentioned reason, an oxide series single crystal having a segregation composition can be produced. For example, when neodymium is added or substituted in $LiNbO_3$, neodymium only in an amount smaller than that in the composition of the melt enters the single crystal because the segregation coefficient of neodium is not 1.0. For example, even if about 1.0 mol % of neodymium is contained in the melt, only about 0.3 mol % of neodymium can be substituted in the single crystal. However, according to the present invention, the single crystal having the same composition as that of the melt can be produced by rapidly cooling the melt inside the nozzle portion as mentioned above, without segregation. This can be also applied to other laser single crystals such as YAG ($Y_3Fe_5O_{12}$) partially substituted by Nd, Er and/or Yb, and $YVO_4$ partially substituted by Nd, Er and/or Yb.

The present inventors has proceeded their investigations, and obtained the following finding. That is, nozzle portions having various inner diameters were produced by platinum, and single crystals made of KLN, etc. were actually experimentally grown. As a result, when an amount of the melt inside the crucible was large, the melt dripped from a distal end face of the nozzle portion, and consequently it was difficult to grow a fiber or the like in some cases. For example, when the surface level of the melt measured from the bottom of the crucible was set at not less than 30 mm or not less than 50 mm, the melt dripped from the distal end face of the nozzle portion even when the inner diameter of the nozzle portion was reduced to 0.2–0.5 mm.

In order that although the amount of the raw material received in the crucible is particularly increased like this, the oxide-series single crystal may be stably mass-produced, a nozzle portion is provided at a side face of the crucible, and a part of the nozzle portion is laid above a joined portion between the crucible and the nozzle portion. In order to most stably pull down the oxide-series single crystal, the height of the distal end face of the nozzle portion is made different from the height of the upper surface of the melt by a given value in the above construction.

How to make the height of the distal end face of the nozzle portion different from that of the upper surface of the melt so as to obtain an optimum growing condition depends upon numerous factors such as the physical properties (viscosity, melting point, etc.) of the single crystal, the structure of the furnace body (temperature distribution, etc.), the structure of the crucible (the shape of the melting section (the section for melting the raw material) of the crucible, and the shape of the nozzle portion), the growing temperature, the temperature gradient of the single crystal-growing section, etc. However, if the above difference is increased, the growing speed becomes greater, whereas if the difference is decreased, the melt at the distal end of the nozzle portion is less influenced by the gravity acting upon this melt so that the melt may be difficult to drip. For this reason, if the height of the nozzle portion is taken as "zero mm", it is preferable to set the surface level of the melt inside the crucible to not less than −10 mm but not more than 50 mm. If the surface level of the melt inside the crucible is set to not more than 50 mm, the abovementioned growing state can be more easily controlled. On the other hand, even if the distal end face of the nozzle is located higher than the upper surface of the melt in the crucible but by not more than 10 mm, the melt is continuously fed to the nozzle portion due to the capillary phenomenon inside the nozzle. The distal end face of the nozzle portion can be set to a location lower than a bottom surface of the melt inside the crucible.

In the above embodiment, the invention apparatus may further include a heat-insulating wall for adiabatically separating a melting furnace in which the crucible is placed from a growing furnace in which the single crystal-growing section is placed, wherein the nozzle portion is inserted through a through-hole provided in the heat-insulating wall. By so doing, the melt can be obtained inside the crucible by heating at a sufficiently high temperature, whereas temperature difference between the single crystal-growing section and the melt in the crucible can arbitrarily be controlled so that the melt flowing through the nozzle portion may be rapidly cooled in the single crystal-growing section.

The producing apparatus according to the second aspect of the present invention is not limited to any particular heating means for the crucible. However, it is preferable to provide a heating furnace as surrounding the crucible. In the case that the nozzle portion is extended downwardly below the crucible, it is preferable that the heating furnace is divided into an upper furnace portion and a lower furnace portion, and the crucible is surrounded by the upper furnace portion so that the upper furnace portion may be heated to a higher temperature to assist melting of the powder in the crucible. On the other hand, it is preferable that the lower furnace portion is arranged to surround the nozzle portion, and the temperature of the lower furnace portion is set lower so that the temperature gradient in the single crystal-growing section at the lower end of the nozzle portion may be greater.

Further, in order to improve the efficiency of melting the powder inside the crucible, preferably the crucible itself is made of a conductive material, and is caused to generate heat through applying electric power thereto, rather than heating the crucible by using only the heating furnace outside the crucible. Further, in order to keep the molten state of the melt flowing through the nozzle portion, preferably the nozzle is made of a conductive material, and caused to generate heat through applying the electric power thereto. The respective temperatures of the nozzle portion and the crucible portion may be controlled by heating with radio frequency waves.

In order to make larger the temperature gradient particularly in the single crystal-growing section, preferably a current-passing mechanism for the crucible and that for the nozzle portion are separately provided, and can be independently controlled.

As the above conductive material, materials such as platinum, platinum-gold alloys, platinum-rhodium alloys, platinum-iridium alloys, and iridium are preferred.

Since the corrosion-resistant metals such as platinum all have relatively small resistivities, the resistance of the nozzle portion needs to be increased to some degree by decreasing the thickness of the nozzle portion so that the nozzle portion may effectively be heat-generated. For example, when the nozzle portion was made of platinum, it needed to be formed by a thin film of about 100–200 $\mu$m. However, if the nozzle portion is formed by such a thin film, it is structurally weak, so that stable production of the single crystal body may be difficult due to deformation of the nozzle portion in some case.

Under the circumstances, the nozzle portion may be surrounded by a heat-generating resistive member, which can be caused to generate heat through feeding electric power thereto. In this case, the nozzle portion may be made of the above corrosion-resistant metal, and this metal is also caused to generate heat through feeding electric power thereto. In this case, no electric power may be applied to the nozzle portion. In the above case, a principal heating function may be given to the heat-generating resistive member surrounding the nozzle portion, so that a heat-generating load required for the nozzle portion becomes smaller. Since the nozzle portion may not necessarily be caused to generate heat, the mechanical strength of the nozzle portion can be enhanced by thickening the nozzle portion (for example, to not less than 300 $\mu$m), which makes the apparatus more suitable for the mass-production.

According to the producing apparatus of the second aspect of the present invention, the raw material can be continuously or intermittently fed into the crucible. For, if the raw material is supplied in the crucible, the state thermally changes inside the crucible due to the heat of the dissolution of the raw material, and the composition of the single crystal correspondingly changes. However, according to the invention producing apparatus, even if such thermal change occurred inside the crucible, the single crystal-growing section is less thermally influenced. Further, since the single crystal-growing section is not in an equilibrium state but in a kinetics state, the growing section is still less thermally influenced.

The second aspect of the present invention can be excellently applied to not only to the production of the single crystal fiber products but also the planar single crystal products. A concrete process of producing such planar single crystal products will be explained later.

The oxide-series single crystal producing process according to the third aspect of the present invention includes the steps of melting an oxide-series single crystal raw material in a melting crucible, continuously feeding the melted raw material to a single crystal-growing crucible having a volume smaller than that of the melting crucible (the crucible for melting the raw material) through an opening of the melting crucible, contacting a seed crystal with the melt at a drawing hole of the single crystal-growing crucible (the crucible for growing the single crystal), and growing the oxide-series single crystal body while drawing down the melt through the drawing hole.

The third aspect of the present invention also relates to the producing apparatus for contacting the seed crystal with the melt at the drawing hole of the crucible and growing the oxide-series single crystal, while drawing down this melt through the drawing hole, and the apparatus includes the melting crucible for melting the oxide-series single crystal raw material and having the opening, the single crystal-growing crucible having the volume smaller than that of the melting crucible and provided with the drawing opening, wherein the raw material melted in the melting crucible is continuously fed to the single crystal-growing crucible through the opening of the melting crucible, the seed crystal is contacted with the melt at a drawing hole of the single crystal-growing crucible, and the oxide-series single crystal body is grown while pulling down the melt through the drawing hole.

The present inventors have continued studies to enlarge the crucible so as to establish the oxide-series single crystal mass-production technique based on the $\mu$ pulling down process. However, it was revealed that since the enlargement of the crucible made it impossible to draw the single crystal fiber through the drawing hole, it was difficult to find a solution for the above enlargement problem. Having investigated causes therefor, the inventors found that if a system in which the drawing hole was provided in the bottom of the crucible and the melt was directly drawn through the drawing hole was employed and the heat capacity of the crucible and the melt increased beyond a given level, a good solid phase/liquid phase interface could not be formed in the vicinity of the drawing hole by the thermal influence of the crucible and the melt upon the vicinity of the drawing hole.

Irrespective of the above finding, the inventors have looked for any process of continuously treating a large amount of the raw material for continuously pulling the single crystal fiber. During the process of the investigation, the inventors have found a technique that the single crystal-growing crucible having the volume smaller than that of the melting crucible is separately provided from this melting crucible, the single crystal raw material is melted in the melting crucible, the melted raw material is continuously fed to the single crystal-growing crucible through the opening of the melting crucible, a single crystal is contacted with the melt at the drawing opening of the single crystal-growing crucible, and the oxide-series single crystal is grown while drawing the melt downwardly.

As a result, the inventors found a finding leading to the third aspect of the present invention, that even if the amount of the powdery raw material to be melted in the melting crucible was increased to not less than 5 g and the volume of the melting crucible was correspondingly increased, the oxide-series single crystal could be easily continuously pulled down.

In addition, the third aspect of the present invention is not merely limited to the advantage that the single crystal fiber can be continuously pulled down through melting a large amount of the powder. The present inventors continuously pulled down a KLN single crystal fiber by using the conventional single crystal producing apparatus, while the amount of the powdery raw material in the crucible was suppressed to around 300–500 mg. The precise measurement of the composition of the thus obtained single crystal fiber revealed that the composition varied within about 1.0 mol %.

To the contrary, according to the third aspect of the present invention, even if the amount of the powdery raw material to be melted in the crucible was increased to around 30–50 g and the melt was continuously fed to the single crystal-growing crucible such that the amount of the melt in the growing crucible may reach around 300–500 mg, changes in the composition in the case of KLN single crystal fiber products were suppressed to lower values of indeed not more than 0.01 mol % showing a surprisingly high accuracy. Thus, according to the producing process and apparatus of the third aspect of the present invention, surprisingly high accuracy can be realized in that the homogeneity of the composition of the single crystal is improved, as compared with the conventional $\mu$ pulling down process.

The reason for the above is not clear. However, according to the conventional producing apparatus based on the $\mu$ pulling down process, the powdery raw material was fed and melted in the crucible, and the single crystal fiber was pulled down through the drawing hole of the crucible. Therefore, the temperature of the melting crucible and that of the melt therein have to be kept high so that the melt might not be solidified in the vicinity of the drawing hole, and therefore it was difficult to maintain the temperature condition and the temperature gradient such that the solid crystal might be solidified at a single crystal-growing point in the vicinity of the drawing hole. From this reason, it is considered that even if a single crystal fiber could happened to be pulled down under a certain condition, the composition thereof unavoidably suffered changes.

To the contrary, according to the third aspect of the present invention, since the raw material was melted in the melting crucible and then the melt is fed from the melting crucible to the single crystal-growing crucible, the single crystal-growing crucible is not thermally influenced by the high temperature of the melting crucible. Therefore, the temperature condition in the vicinity of the drawing hole of the single crystal-growing crucible can be independently set separately from that of the melting crucible. As a result, good single crystal body can be drawn out by setting a greater temperature gradient at the single crystal-growing point in the vicinity of the drawing hole of the single crystal-growing crucible.

For that purpose, it is preferable to independently heat the melting crucible and the single crystal-growing crucible by separate heating mechanisms. Further, it is preferable to largely separate the melting crucible from the single crystal-growing crucible. For this, it is preferable that a nozzle portion is extended downwardly from the bottom of the melting crucible, the raw material melted in the melting crucible is continuously fed to the single crystal-growing crucible through the nozzle portion.

In the third aspect of the present invention, the raw material is melted in the melting crucible, and the melt is continuously fed to the single crystal-growing crucible. It is preferable that the raw material is kept melted when the raw material from the melting crucible is brought into contact with the melt in the single crystal-growing crucible. However, the melt may be solidified after it is discharged through the opening of the melting crucible. In this case, it is preferable that the solidified material in the vicinity of the opening is continuously pulled downwardly or the material solidified in the vicinity of the opening is melted instantaneously after it is contacted with the melt in the single crystal-growing crucible so that the solidified raw material might not clog the opening.

On the other hand, the present inventors have studied the relationship between the state of the melt in the single crystal-growing crucible and the physical properties of the single crystal, by using the above producing apparatus. As a result, the inventors have discovered that if the surface tension is more dominant than the gravity in the environment of the single crystal-growing section, the good single crystal having extremely small changes in composition can be continuously pulled down. The reason therefor is considered that a good solid phase/liquid phase interface can be formed in this case.

Further, the present inventors have made researches on the above reason to find out the following finding. That is, it is considered that since the scale of the crucible in the conventional $\mu$ pulling down process was small, the single crystal fiber could be continuously pulled down. This is considered since the amount of the melt inside the crucible was small, the melt was adhered to the surface of the inner wall of the crucible through its surface tension to make the gravity acting on the drawing opening relatively small, and a solid phase/liquid phase interface which was homogeneous to some extent could be formed. However, it is considered that if the dimension of the crucible is increased, such condition that the surface tension is more dominant in the vicinity of the drawing opening was disappeared.

Further, according to the third aspect of the present invention, it is easy to make larger the temperature gradient in the vicinity of the single crystal-growing point for the single crystal-growing crucible. By so doing, the melt can be rapidly cooled.

Therefore, the third aspect of the present invention is particularly suitable for the production of the single crystal of a solid solution state. The single crystal of a solid solution state has a tendency that its composition ratio changes under an equilibrium condition. When the conventional $\mu$ pulling down process is employed, the equilibrium condition exists in the vicinity of the drawing hole so that the composition of the solid solution changes due to a slight temperature change or slight changes in the solidifying speed. To the contrary, according to the method and apparatus of the third aspect of the present invention, since the area near the single crystal-growing section can be rapidly cooled, the composition of the melt can be kept constant.

As the solid solution, for example, KLN, KLTN[$K_3Li_{2-2x}(Ta_yNb_{1-y})_{5+x}$] $O_{15+x}$ and $Ba_{1-x}Sr_xNb_2O_6$, which have tungsten-bronze structure, and Mn—Zn ferrite may be recited.

Further, for the above-mentioned reason, an oxide series single crystal having a segregation composition can be produced. For example, when neodymium is added or substituted in $LiNbO_3$, neodymium only in an amount smaller than that in the composition of the melt enters the single crystal because the segregation coefficient of neodium is not 1.0. For example, even if about 1.0 mol % of neodymium is contained in the melt, only about 0.3 mol % of neodymium can be substituted in the single crystal. However, according to the present invention, the single crystal having the same composition as that of the melt can be produced by rapidly cooling the melt inside the nozzle portion as mentioned above, without segregation. This can be also applied to other laser single crystals such as YAG ($Y_3Fe_5O_{12}$) partially substituted by Nd, Er and/or Yb, and $YVO_4$ partially substituted by Nd, Er and/or Yb.

The producing apparatus according to the present invention is not limited to any particular heating means for the crucibles. However, it is preferable to provide a heating furnace as surrounding the crucible. In this case, it is preferable that the heating furnace is divided into an upper furnace portion and a lower furnace portion, and the melting crucible is surrounded by the upper furnace portion so that the upper furnace portion may be heated at a higher temperature to assist melting of the material powder inside the melting crucible.

On the other hand, it is preferable that the lower furnace portion is arranged to surround the single crystal-growing crucible, and the temperature of the lower furnace portion is set lower so that the temperature gradient in the single crystal-growing section of the single crystal-growing crucible may be greater.

Further, in order to improve the efficiency of melting the powder material inside the melting crucible, it is preferable that the melting crucible itself is made of a conductive material, and is caused to generate heat through applying electric power thereto, rather than heating the melting crucible by using only the heating furnace outside the melting crucible.

Further, in order to keep the molten state of the melt flowing the nozzle portion of the melting crucible, it is preferable that the nozzle portion is made of a conductive material, and caused to generate heat through applying the electric power to the nozzle portion. Further, it is preferable that a radio frequency heating mechanism is provided to heat the melting crucible body and the nozzle portion through radio frequency induction heating.

As the above conductive material, materials such as platinum, platinum-gold alloys, platinum-rhodium alloys, platinum-iridium alloys, and iridium is preferred.

Since the corrosion-resistant metals such as platinum all have relatively small resistivities, the resistance of the nozzle portion have to be increased to some degree by decreasing the thickness of the nozzle portion so that the nozzle portion may be effectively heat-generated. For example, when the nozzle portion was made of platinum, it had to be formed by a thin film of about 100–200 $\mu$m. However, if the nozzle is formed by such a thin film, it is structurally weak, so that stable production of the single crystal body may be difficult due to deformation of the nozzle portion in some case.

Under the circumstances, the nozzle portion may be surrounded by a heat-generating resistive member, which can be caused to generate heat through feeding electric power thereto. In this case, the nozzle portion may be made of the above corrosion-resistant metal, and this metal may also be caused to generate heat through feeding electric power thereto. In this case, no electric power may be applied to the nozzle portion. In the above case, a principal heating function may be given to the heat-generating resistive member surrounding the nozzle portion, so that a heat-generating load required for the nozzle portion becomes smaller. Since the nozzle portion may not necessarily be caused to generate heat, the mechanical strength of the nozzle portion can be enhanced by thickening the nozzle portion (for example, to not less than 300 $\mu$m), which makes the apparatus more suitable for the mass-production.

According to the producing apparatus of the third aspect of the present invention, the raw material can be continuously or intermittently fed into the melting crucible. For, the state thermally changes inside the melting crucible due to the heat of the dissolution of the raw material, and the composition of the single crystal correspondingly changes. However, according to the invention producing apparatus, even if such thermal change occurred inside the melting crucible, the single crystal-growing crucible is less thermally influenced. Further, since the single crystal-growing section of the single crystal-growing crucible is not in an equilibrium state but in a kinetics state, the growing section is still less thermally influenced.

The third aspect of the present invention can be excellently applied to not only to the production of the single crystal fiber products but also the planar single crystal products. A concrete process of producing such planar single crystal products will be explained later.

The process according to the fourth aspect of the present invention includes the steps of feeding the oxide-series single crystal raw material to the crucible, melting it therein and growing the oxide-series single crystal after a seed crystal is contacted with the melt, wherein a laser beam is irradiated upon the oxide-series single crystal, a light outputted from the oxide-series single crystal is measured, and the composition ratio of the raw material to be fed to the crucible is controlled based on the measuremental result.

The oxide-series single crystal-producing apparatus according to the fourth aspect of the present invention is adapted for feeding the oxide-series single crystal raw material to the crucible, melting it therein and growing the oxide-series single crystal after a seed crystal is contacted with the melt, and includes the crucible with the single crystal-drawing hole, a raw material feeder for feeding the raw material to the crucible, a driving device for pulling down the oxide-series single crystal body from the crucible, a laser beam source for irradiating the laser beam upon the oxide-series single crystal body, a measuring device for measuring an output light from the oxide-series single crystal body, and a controller for controlling the composition ratio of the raw material to be fed to the crucible based on an output signal from the measuring device.

The present inventors have excellently succeeded in solving the above-mentioned problems, continuously pulling down the single crystal fiber and keeping the composition thereof constant by employing the construction according to the fourth aspect of the present invention. More specifically, the inventors discovered that the feeder is provided to feed the oxide-series single crystal raw material to the crucible, the laser beam is irradiated upon the oxide-series single crystal body being downwardly pulled, the output light beam from the oxide-series single crystal is measured, and the composition ratio of the raw material to be fed to the crucible is controlled based on the measuremental result, whereby even if the single crystal fiber or the like is continuously pulled down, the composition of the single crystal fiber can be prevented from changing.

Referring to the above in more detail, that the wavelength of a peak of the output light beam from the oxide-series single crystal shifts to a long wavelength side or a short wavelength side means that the composition is deviated from a target one. In that case, the composition ratio of the raw material is changed to reduce the shifting of the peak wavelength. By so doing, the composition of the single crystal fiber can be kept in a given range, while pulling it down.

These and other objects, features and advantages of the invention will be appreciated upon reading the following description of the invention when taken in conjunction with the attached drawings, with the understanding that some modifications, variations and changes could be easily made by the skilled person in the art to which the invention pertains.

BRIEF DESCRIPTION OF THE INVENTION

For a better understanding of the invention, reference is made to the attached drawings, wherein:

FIG. 2 is a sectional view of outlining a single crystal-growing device to be favorably used in the first aspect of the present invention;

FIG. 3(a) is a sectional view for illustrating a state of the growing device in FIG. 2 before a seed crystal is contacted with a melt;

FIG. 3(b) is a sectional view for illustrating a state of the growing device in FIG. 2 in which the seed crystal is contacted with the melt;

FIG. 4(a) is a plane view of a plane plate 31 with grooves 32;

FIG. 4(b) is a perspective view of a nozzle portion 35 formed by combining a pair of the plane plates 31;

Figure 9:
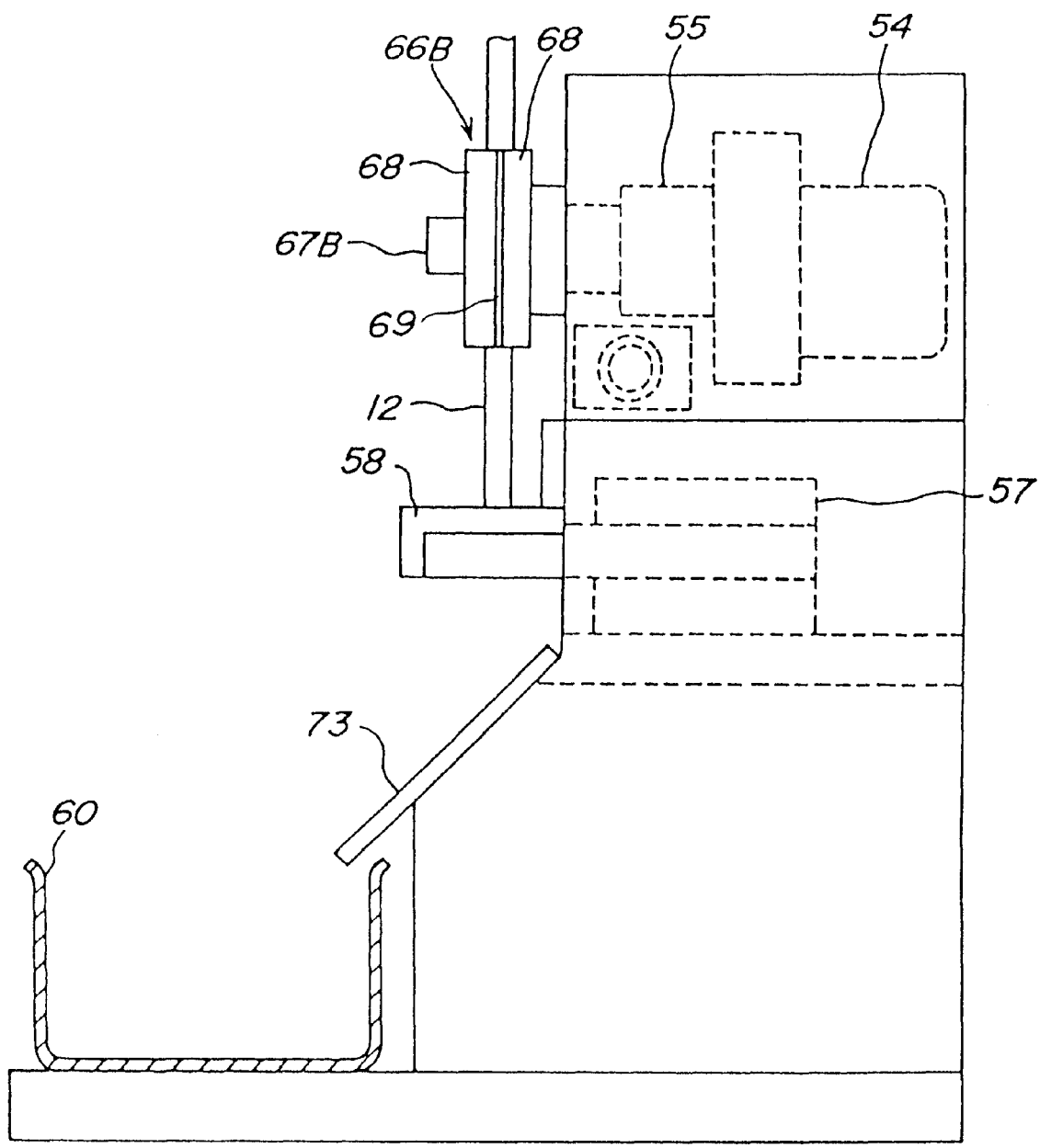
Figure 12A:
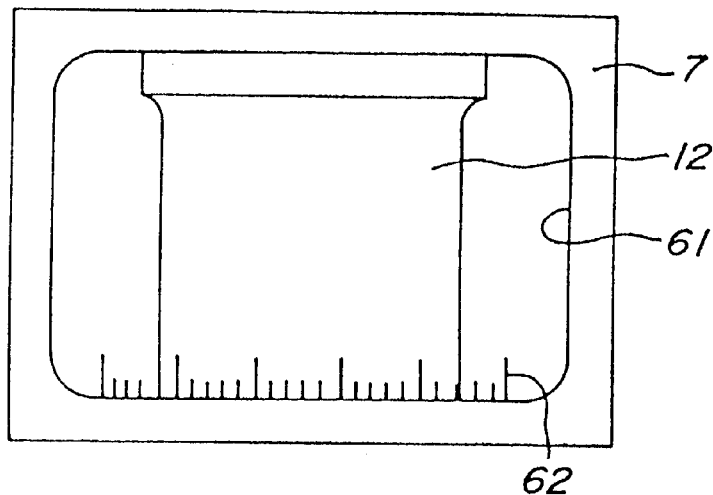
Figure 12B:
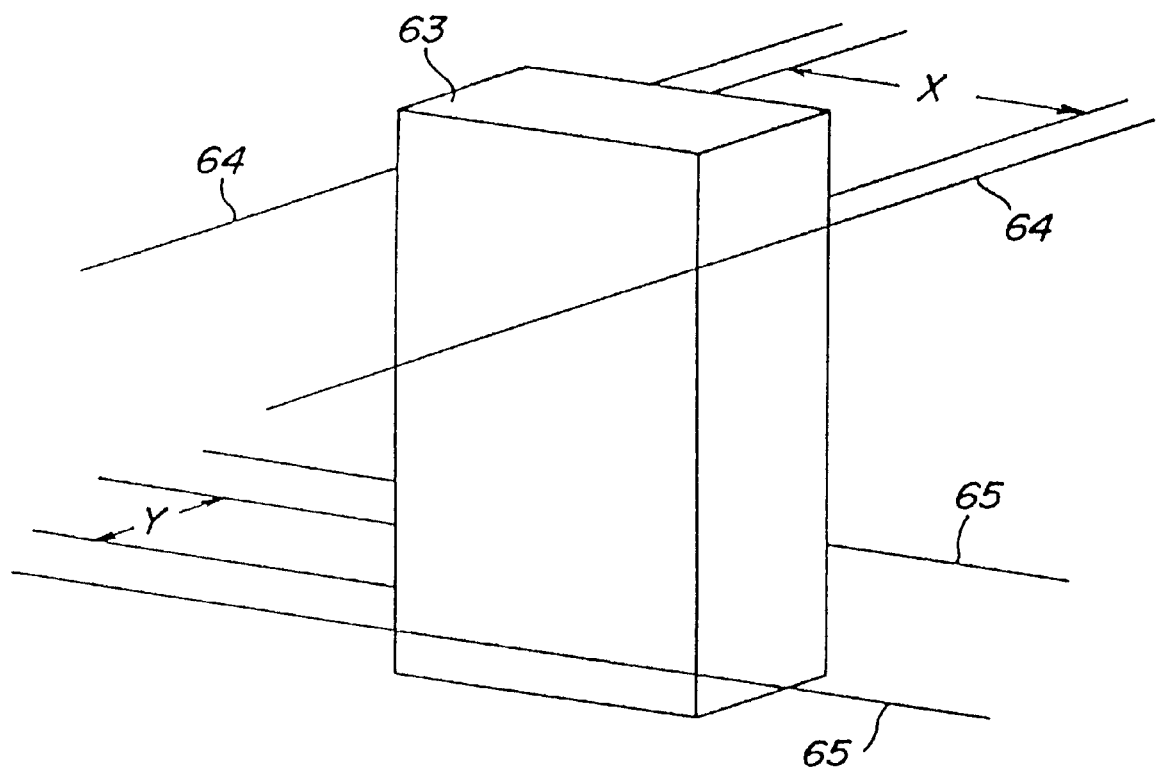
Figure 13:
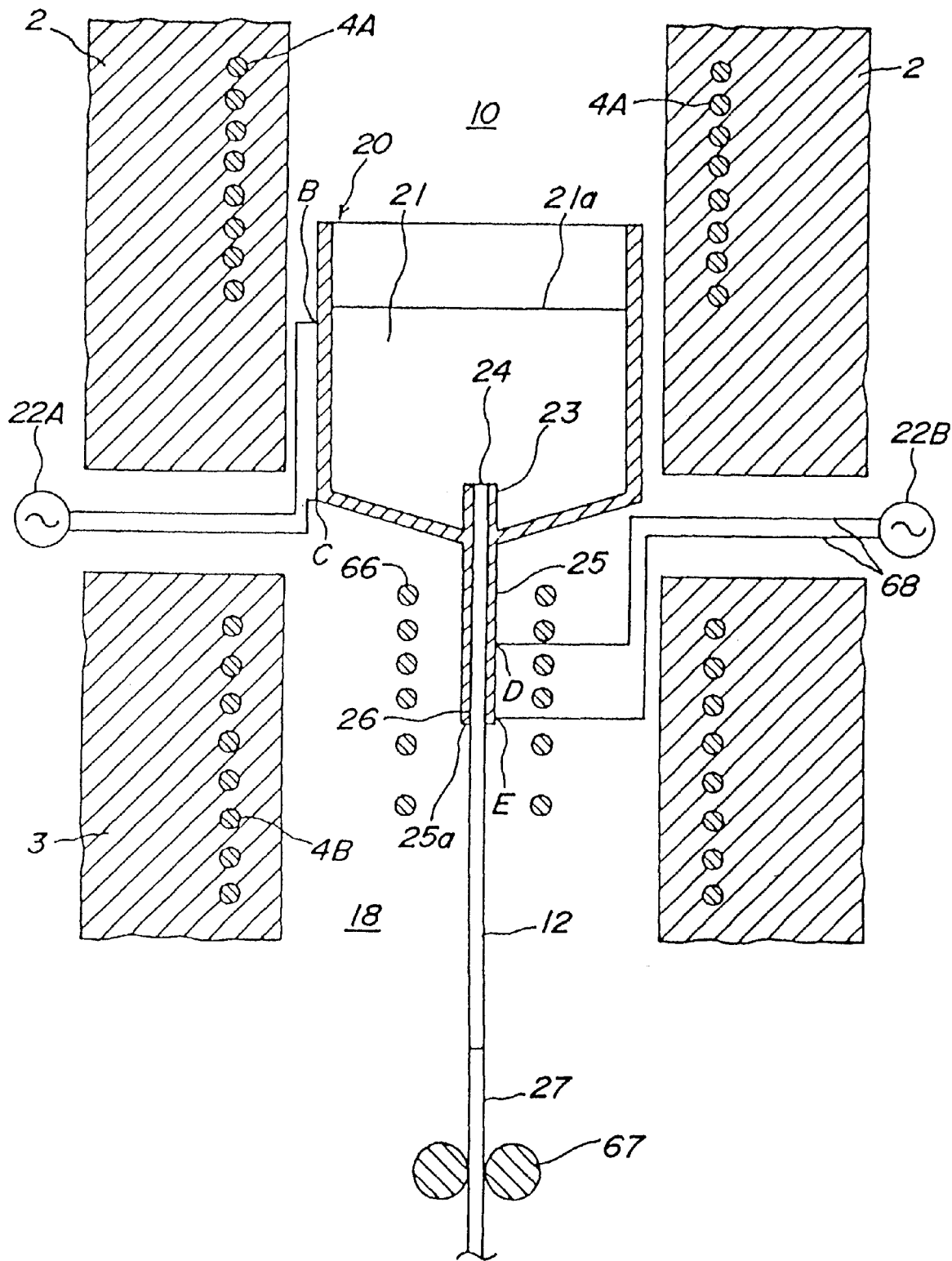
Figure 14:
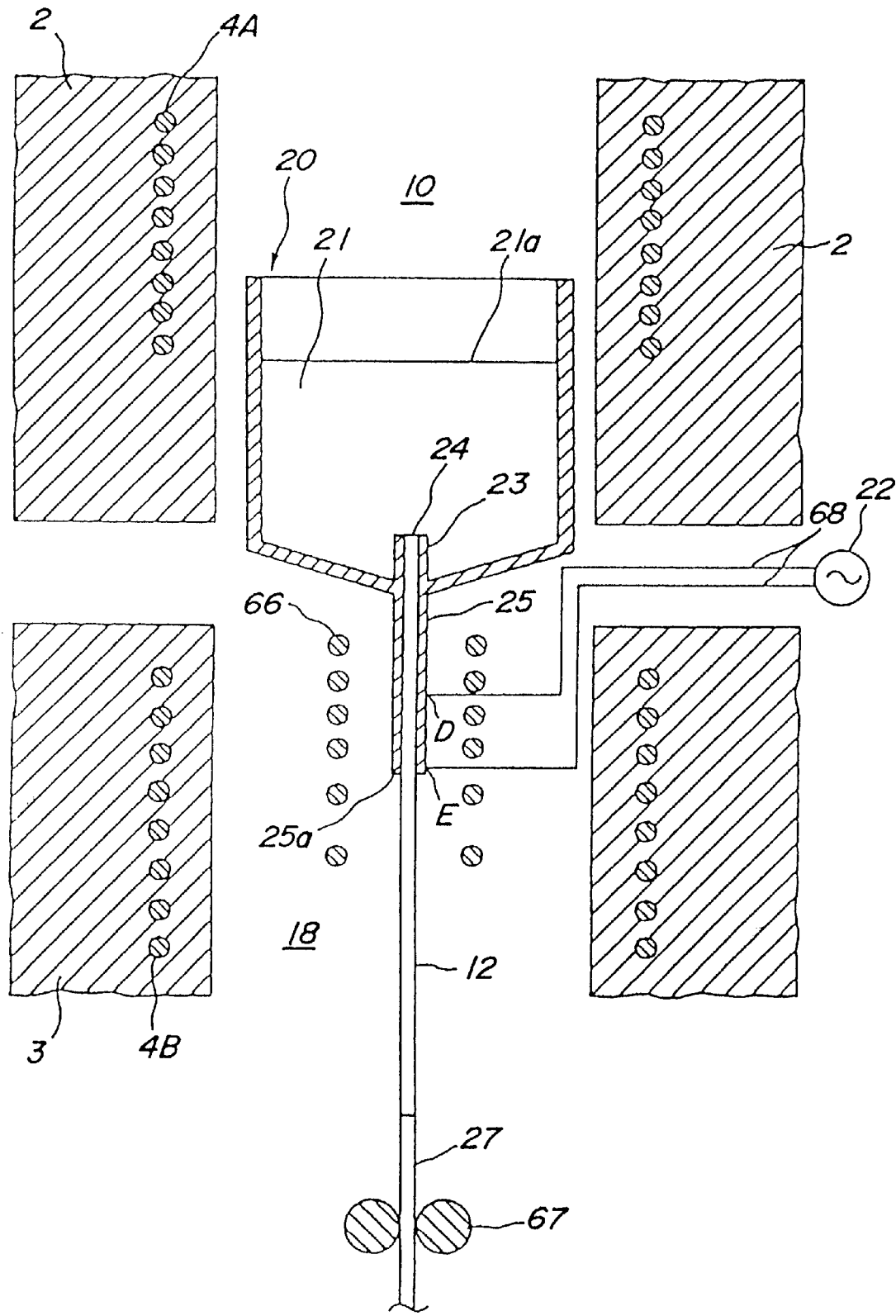
Figure 15:
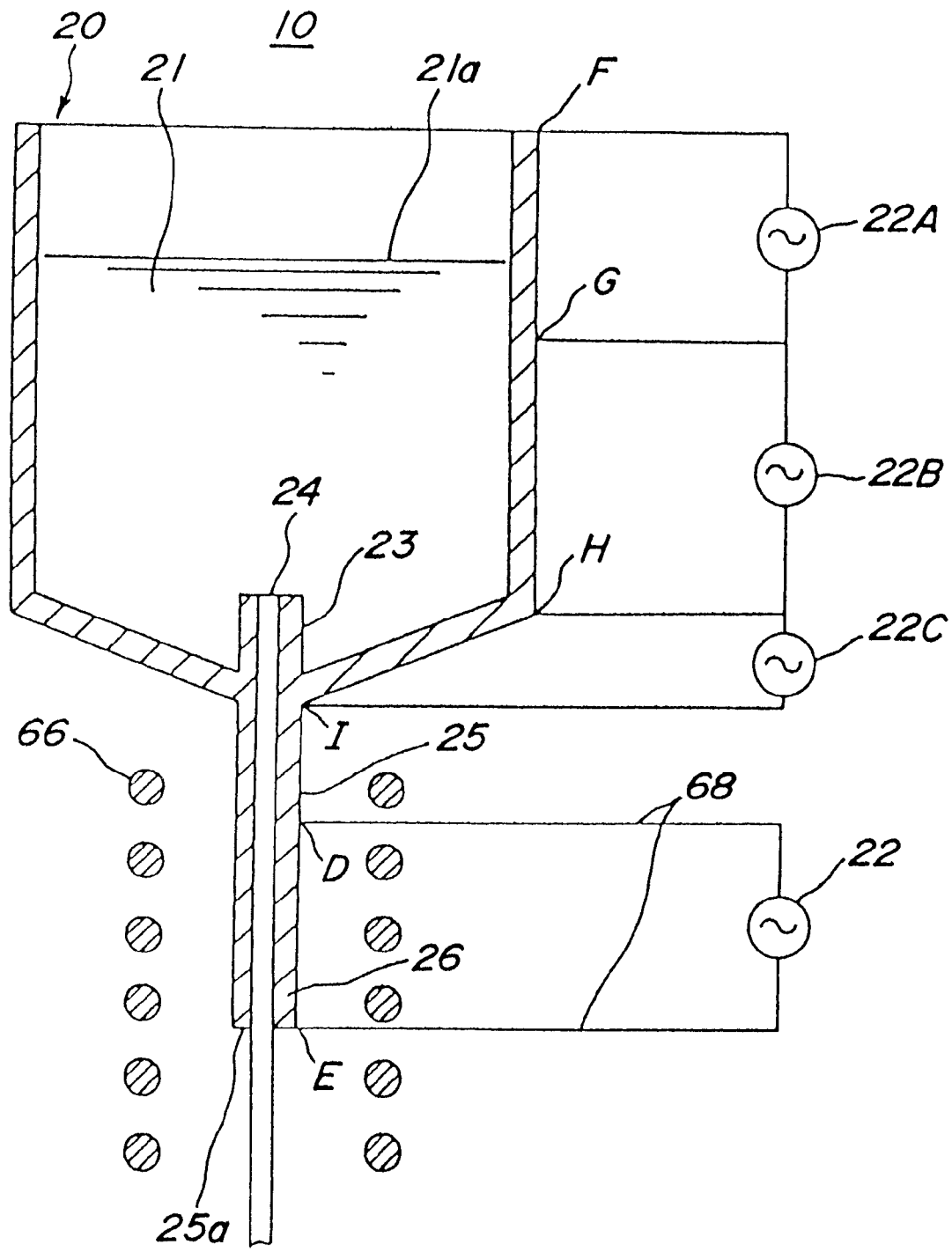
Figure 16:
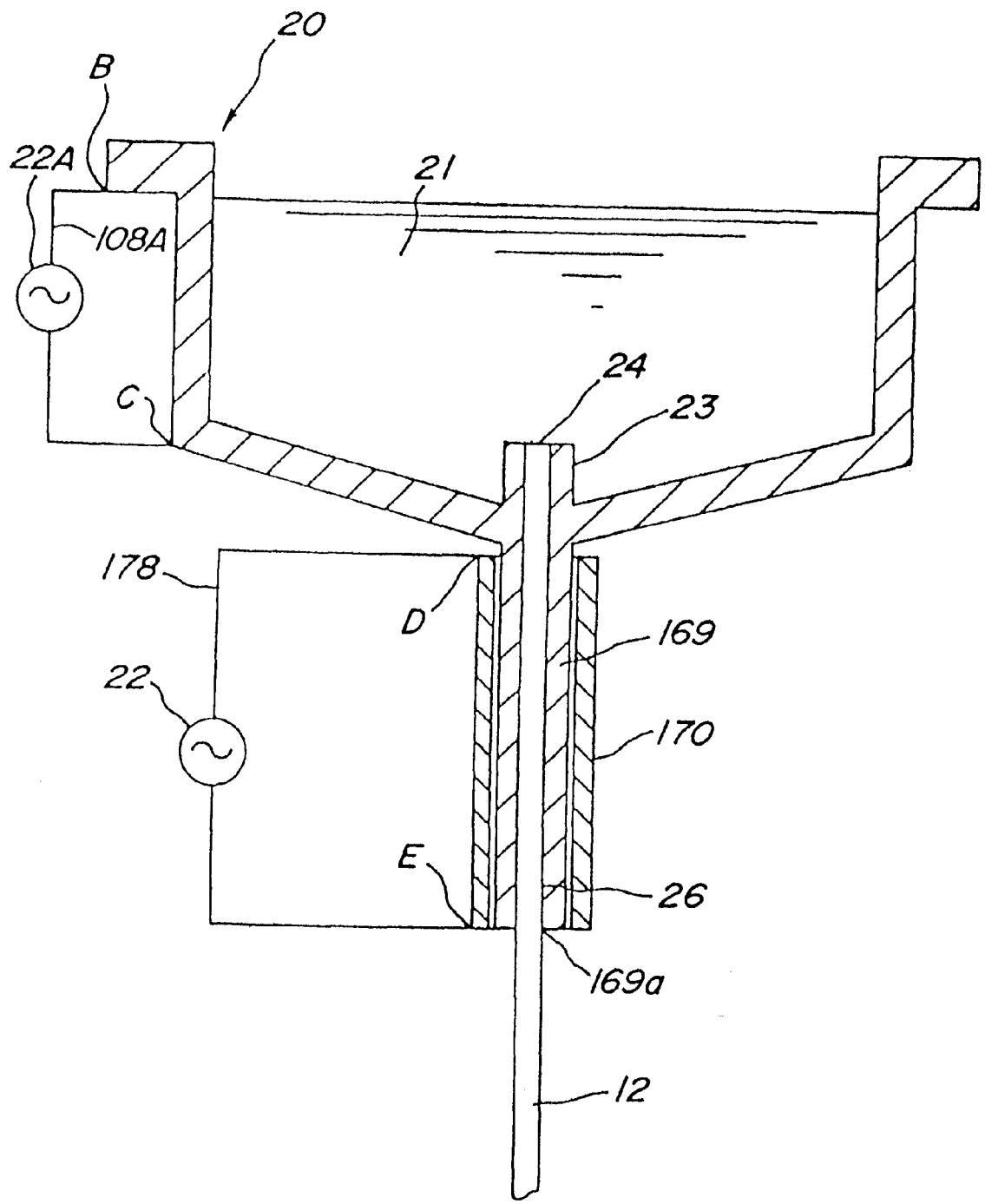
Figure 17:
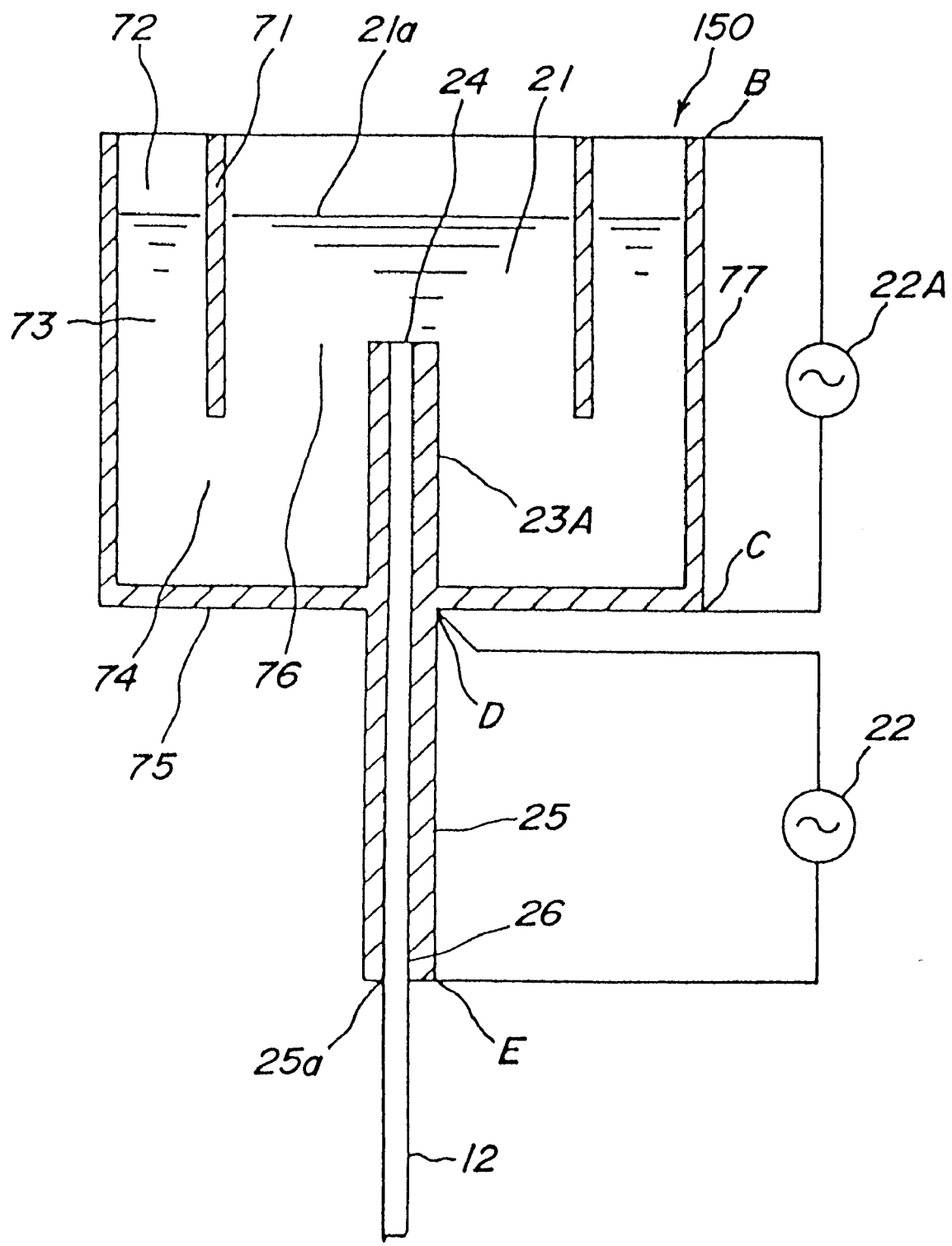
Figure 22:
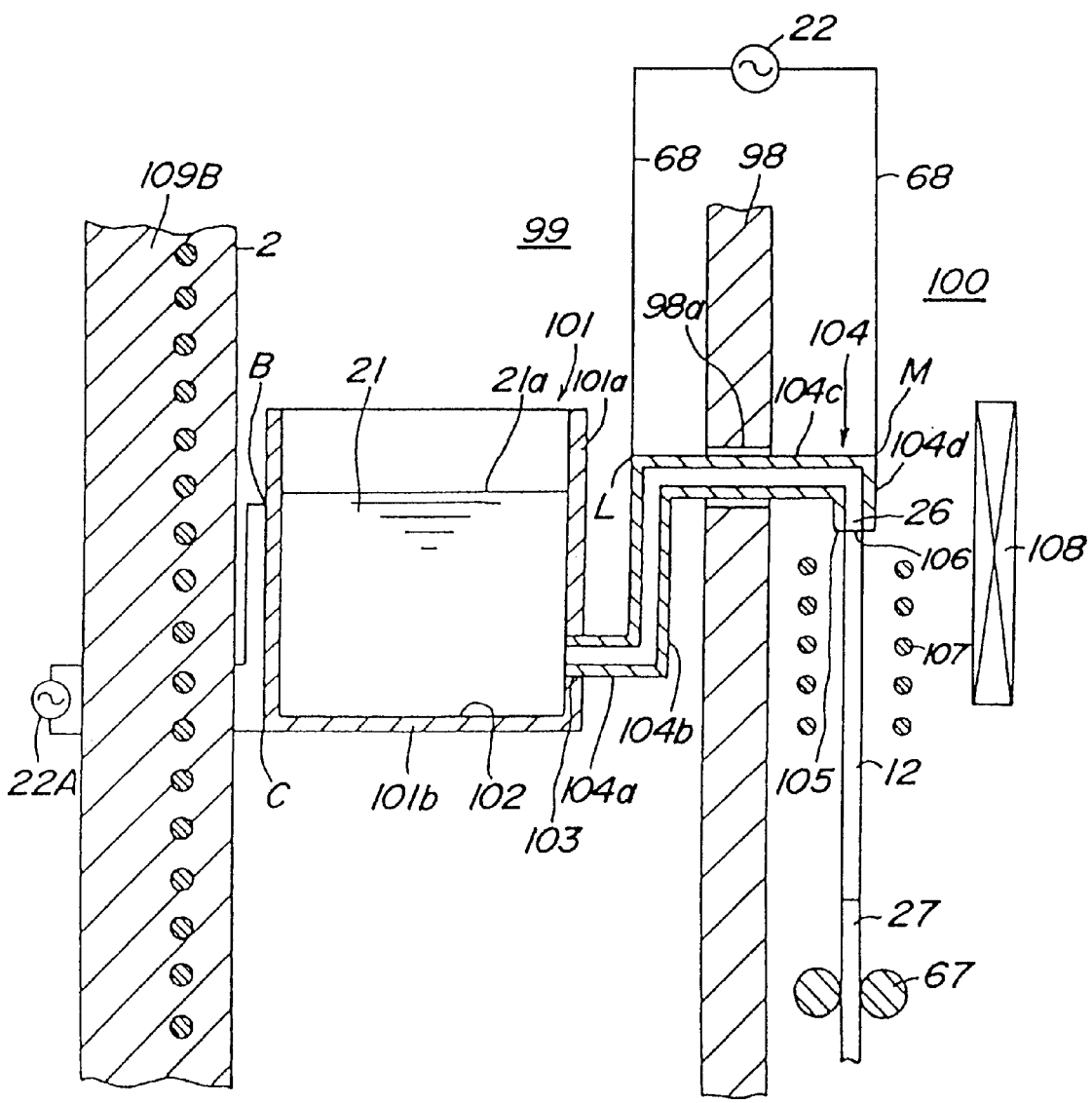
Figure 23:
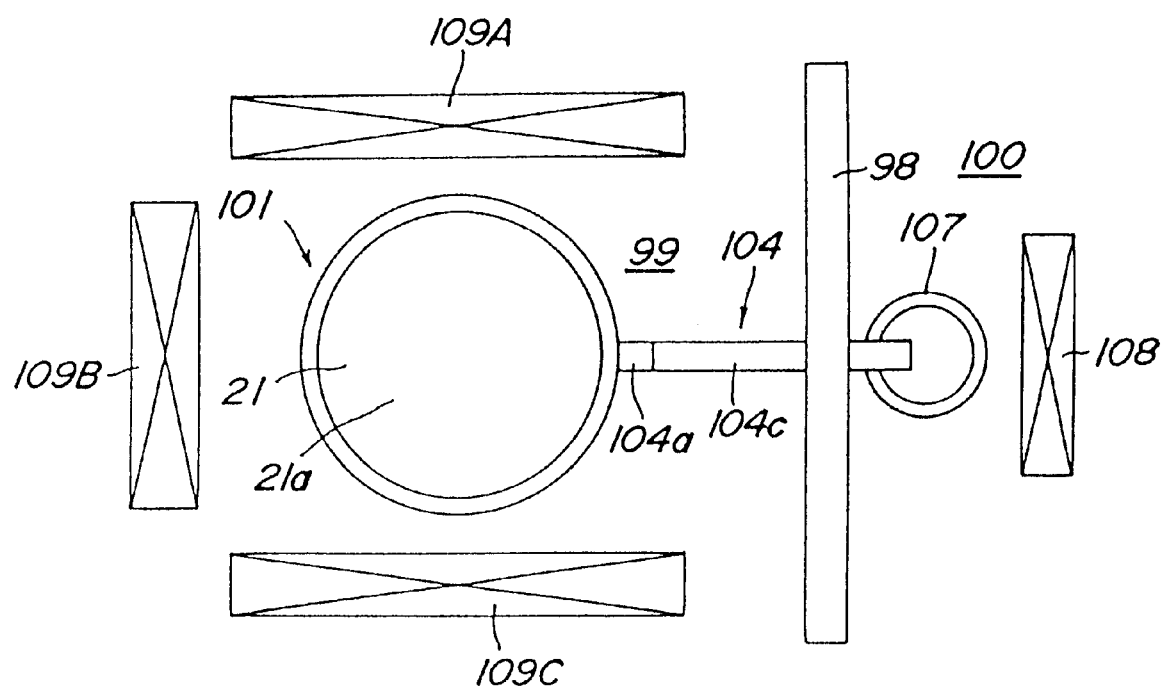
Figure 24:
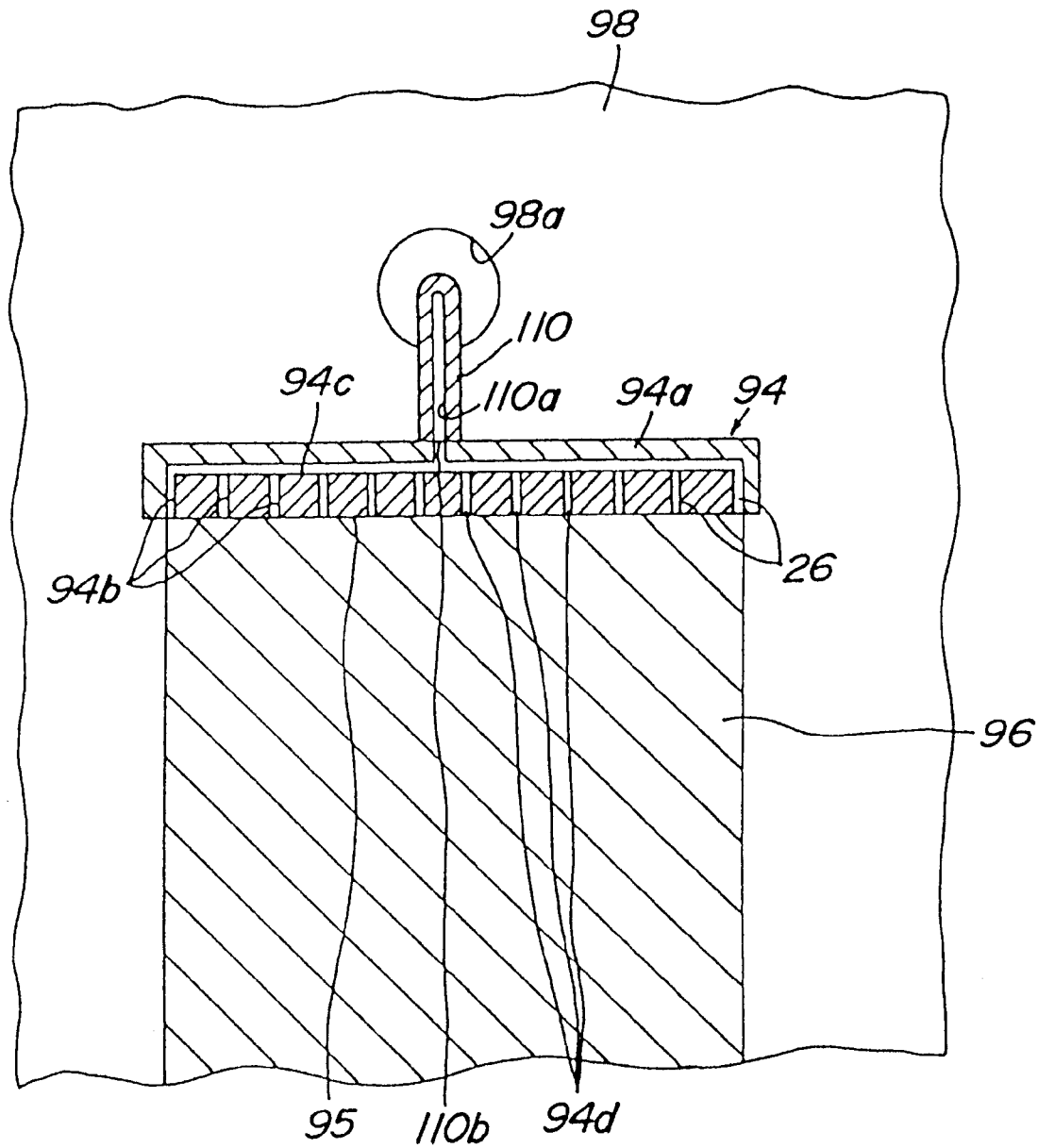

FIG. 4(c) is a perspective view for illustrating a state in which a single crystal plate 36 is being grown through the nozzle portion 35 of a crucible 37;

FIG. 5 is a view for schematically illustrating a crucible provided with plural rows of nozzle portions;

FIG. 6 is a perspective view for illustrating a moving device and a cutter to be favorably used in the first aspect of the present invention;

FIG. 7 is a side view for illustrating a principal portion of the moving device and the cutter in FIG. 6;

FIG. 8 is a front view of a holder in FIGS. 6 and 7;

FIG. 9 is a side view for outlining another moving device and another cutter to be favorably used in the first aspect of the present invention;

FIG. 10 is a perspective view for illustrating a driving mechanism for rotary bodies used in the moving device in FIG. 9;

FIG. 11(a) is a schematic view for illustrating a state in which a heater 69 is contacted with a single crystal body 12;

FIG. 11(b) is a schematic view for illustrating a state in which the single crystal body 12 is cut by the heater 69;

FIG. 12(a) is a front view for illustrating a state in which images of the single crystal body 12 and a scale 62 are taken in a monitor 7;

FIG. 12(b) is a perspective view for illustrating a state in which laser beams 64 and 65 are irradiated upon a single crystal body 63;

FIG. 13 is a sectional view for outlining a single crystal-growing device according to an embodiment of the second aspect of the present invention;

FIG. 14 is a sectional view for outlining a single crystal-growing device according to another embodiment of the second aspect of the present invention;

FIG. 15 is a sectional view for outlining a crucible and an electric power feeding mechanism in a single crystal-producing apparatus according to a further embodiment of the second aspect of the present invention;

FIG. 16 is a sectional view for structurally outlining a crucible and an electric power feeding mechanism in a still further embodiment of the single crystal-producing apparatus according to the second aspect of the present invention;

FIG. 17 is a sectional view for outlining the construction of a crucible in a still further embodiment of the single crystal-producing apparatus according to the second aspect of the present invention;

FIG. 18(a) is a plane view of a flat plate 78 made of a corrosion-resistant material;

FIG. 18(b) is a plane view for illustrating a state in which a groove 79 is formed at the flat plate 78;

FIG. 18(c) is a section a view of a nozzle portion 80 formed by joining a pair of the flat plates 78;

FIG. 18(d) is a sectional view illustrating a state in which the nozzle portion 80 is fitted to a crucible 82;

FIG. 19 is a perspective view for illustrating a cut nozzle portion 83 constituted by a plurality of tubular members 85;

FIG. 20 is a sectional view for outlining a nozzle portion 89 having an outer diameter-enlarged portion 91 and a crucible;

FIG. 21 is a sectional view for outlining a crucible provided with a nozzle portion having a diameter enlarged portion with numerous flow holes;

FIG. 22 is a sectional view for outlining a single crystal-producing apparatus according to a still further embodiment of the second aspect of the present invention;

FIG. 23 is a plane view for outlining the apparatus in FIG. 22;

FIG. 24 is a sectional view of another nozzle portion used in the single crystal-producing apparatus in FIGS. 22 and 23 as viewed from a through-hole 98*a;*

Figure 25:
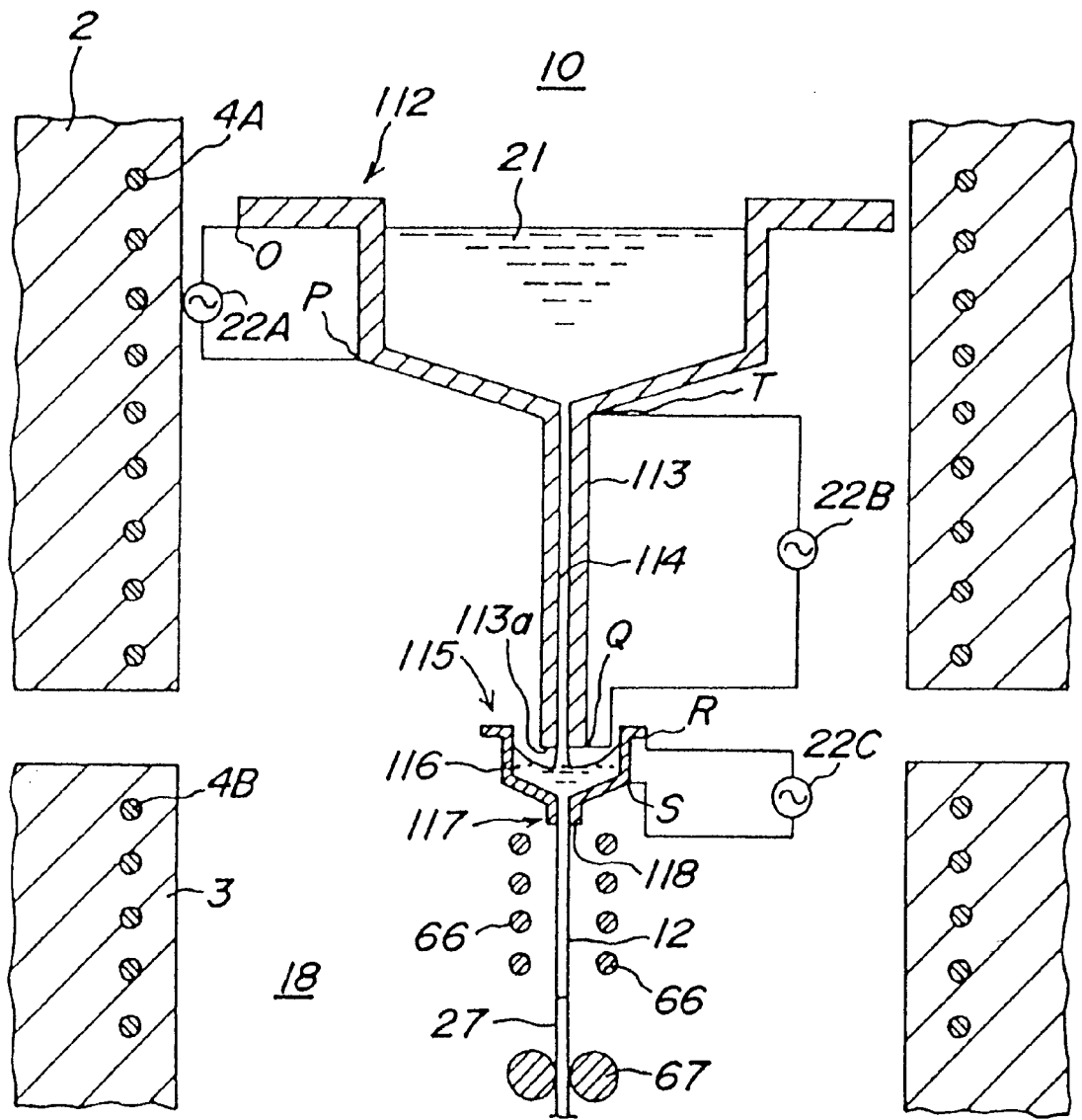
Figure 26:
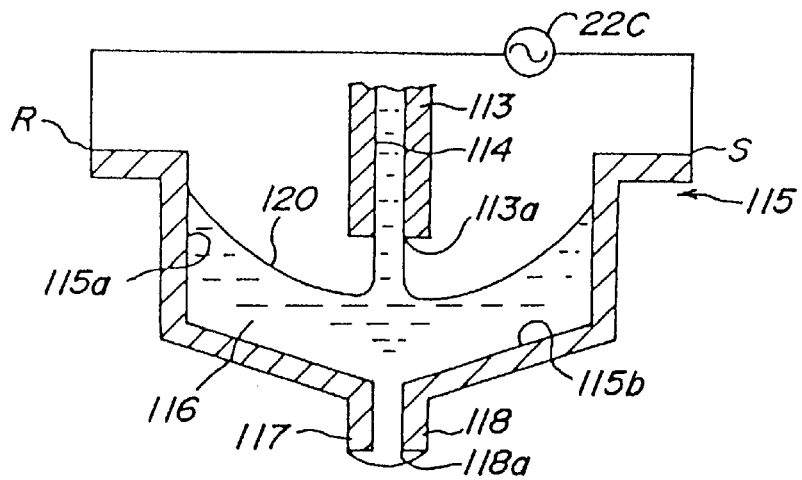
Figure 28:
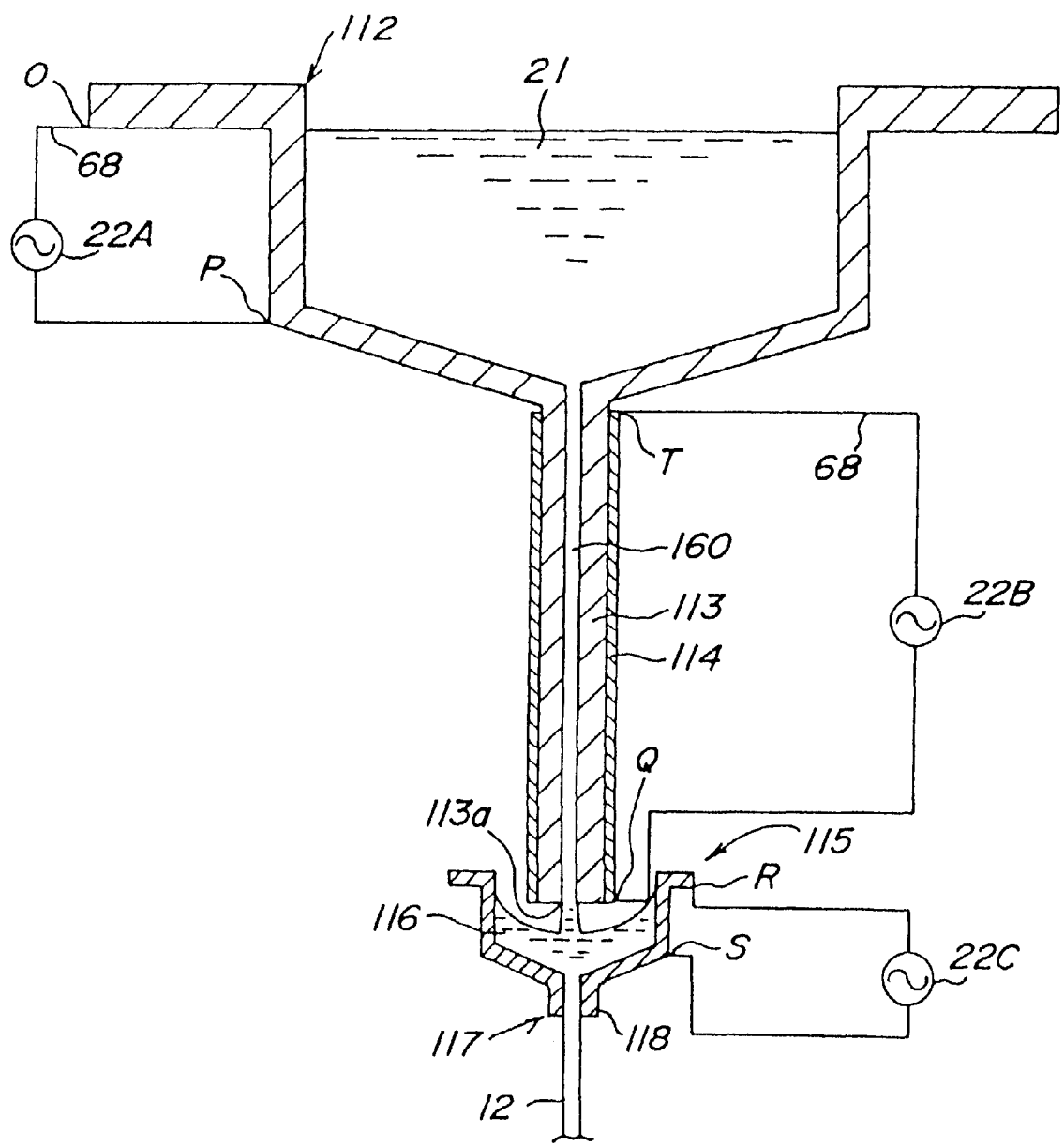
Figure 32:
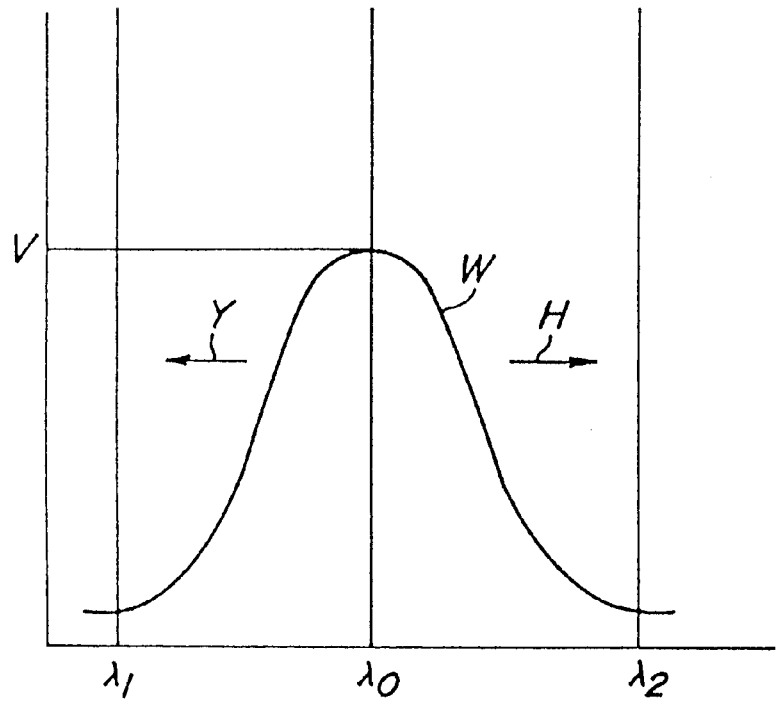
Figure 33:
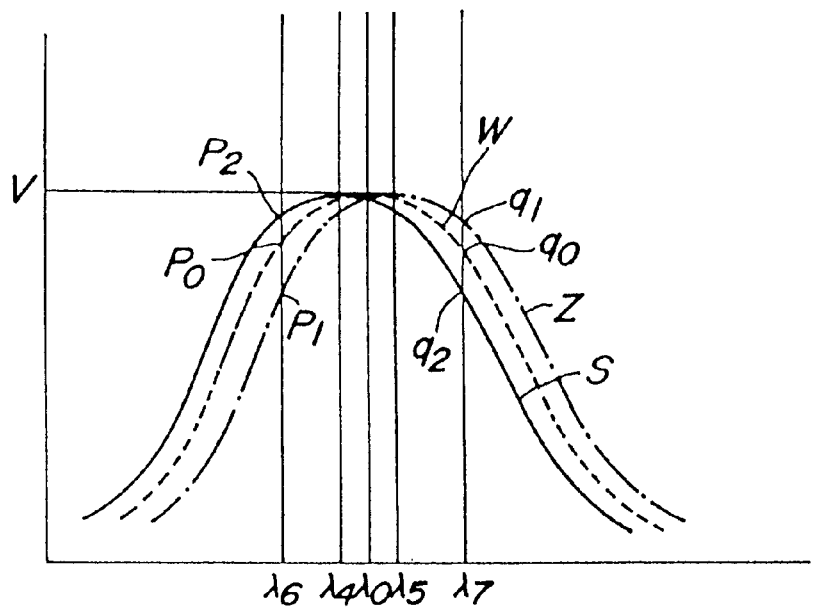
Figure 34:
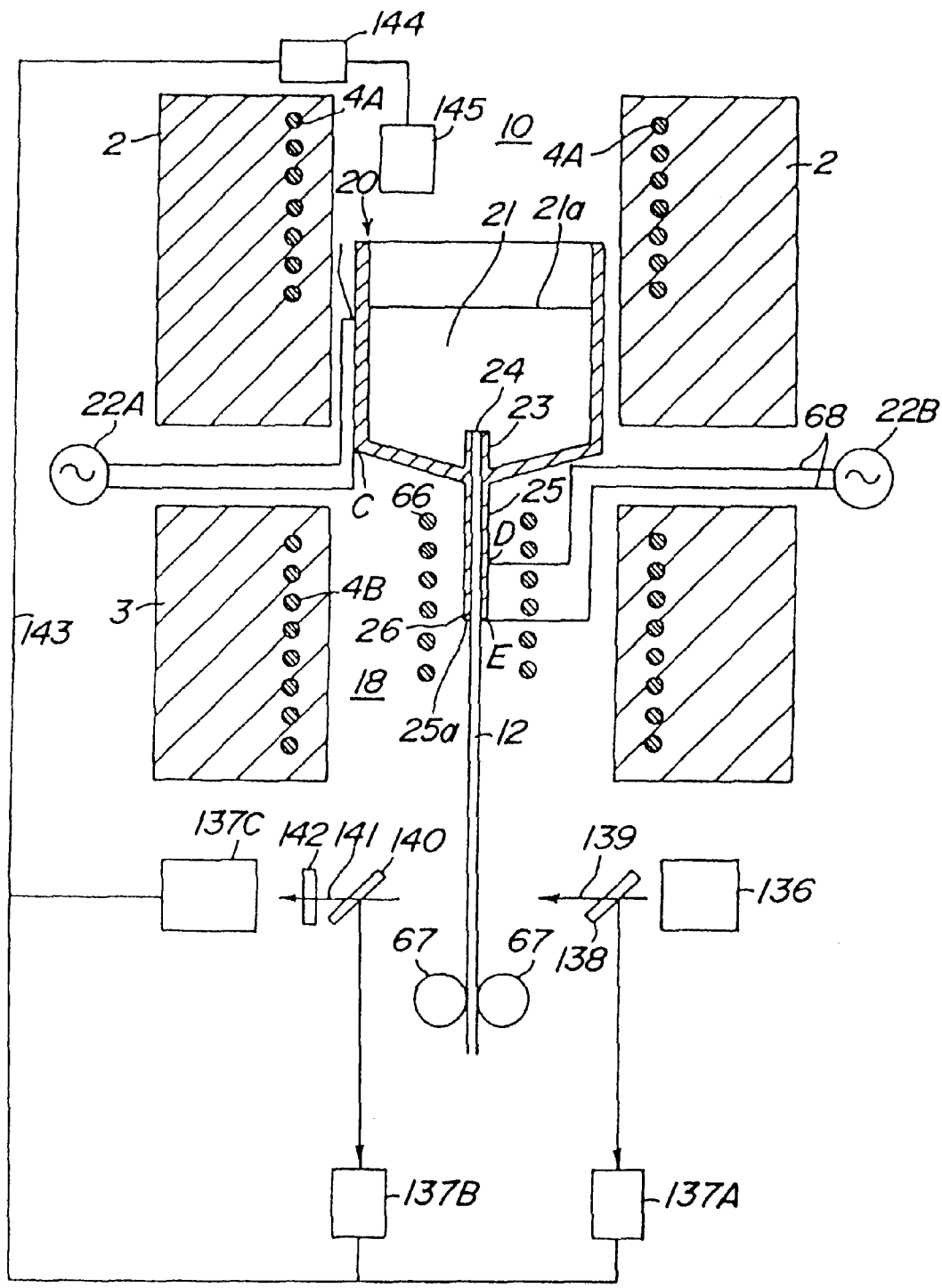

FIG. 25 is a sectional view for outlining a single crystal-producing apparatus according to an embodiment of the third aspect of the present invention;

FIG. 26 is a sectional view for outlining a single crystal-growing crucible 115 and its adjacent portion;

FIGS. 27(*a*) and 27(*b*) are schematic views for illustrating states of a distal end portion of the single crystal-growing crucible 115;

FIG. 28 is a sectional view for outlining the construction of a crucible in a single crystal-producing apparatus according to the third aspect of the present invention;

FIG. 29(*a*) is a plane view for illustrating a flat plate 121 made of a corrosion-resistant material;

FIG. 29(*b*) is a view for illustrating a state in which groove 122 is formed at the flat plate 121;

FIG. 29(*c*) is a sectional view of a nozzle portion 123 formed by joining a pair of the flat plates 121;

FIG. 29(*d*) is a sectional view illustrating a state in which the nozzle portion 123 is fitted to a crucible 125;

FIG. 30(*a*) is a plane view of a plane plate 126 made of a corrosion-resistant material formed with plural rows of groove 127;

FIG. 30(*b*) is a perspective view of a nozzle portion 128 formed by combining a pair of the plane plates 126;

FIG. 30(*c*) is a perspective view for illustrating a state in which the nozzle portion 128 is attached to a single crystal-growing crucible 131;

FIG. 31 is a partially cut perspective view for illustrating a state in which a plurality of nozzle portions 134 made of tubular bodies are contacted to adjacent ones in a line;

FIG. 32 is a graph showing the relationship between the wavelength and the intensity of the output light beam in connection with the fourth aspect of the present invention;

FIG. 33 is a graph for illustrating how to measure the intensity of output light beams having wavelengths on opposite sides of a target wavelength $\lambda o$;

FIG. 34 is a sectional view for outlining a single crystal-producing apparatus according to an embodiment of the fourth aspect of the present invention; and FIG. 35 is a block diagram for illustrating a feed back control system using a pair of laser beam sources 147A and 147B and a pair of light beam-receivers 148A and 148B.

DETAILED DESCRIPTION OF THE INVENTION

Now, embodiments of the single crystal-producing apparatus according to the first aspect of the present invention will be explained.

Figure 1:
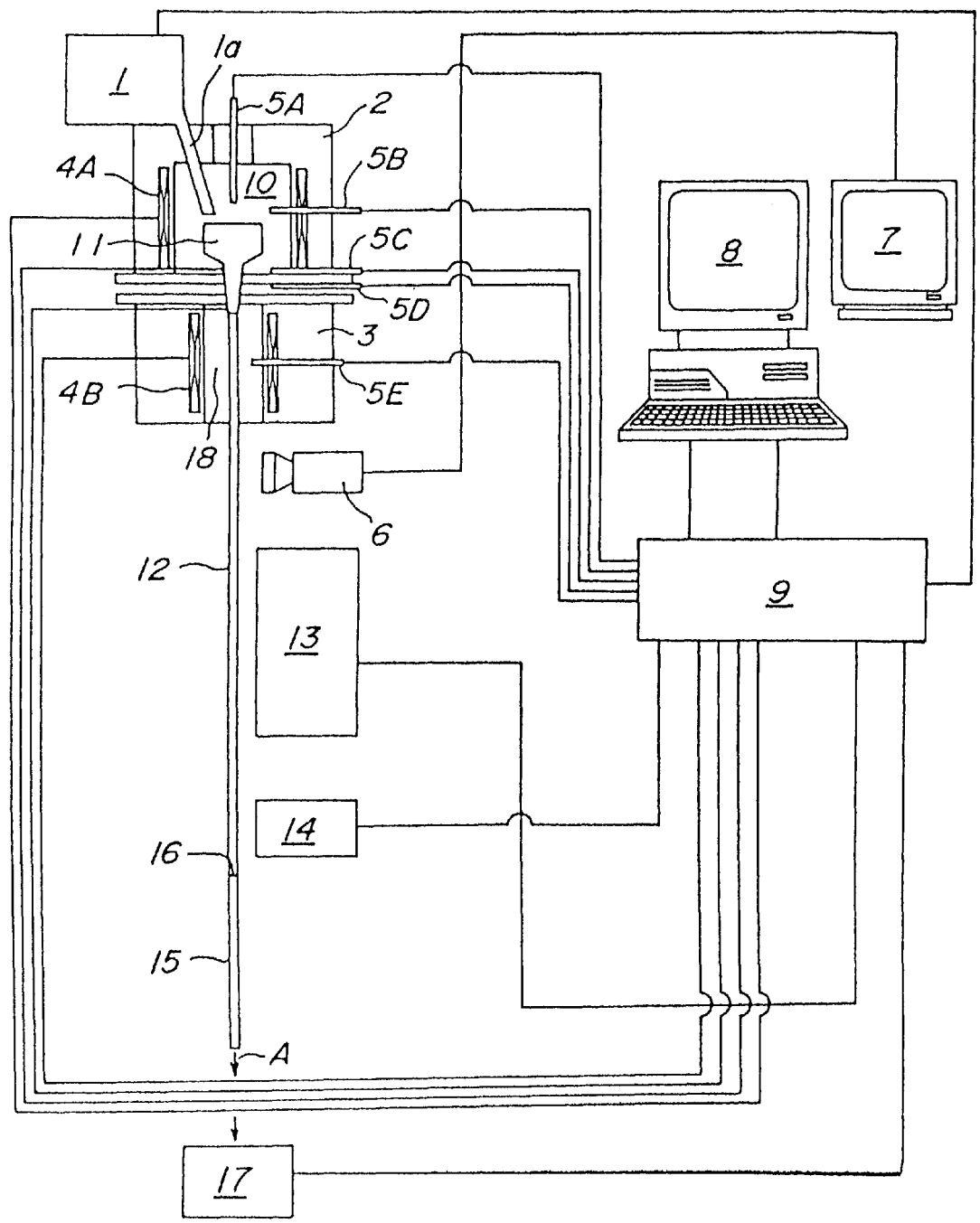
FIG. 1 is a block diagram for schematically illustrating an embodiment of the single crystal-producing apparatus according to the first aspect of the present invention.

FIG. 1 is a block diagram of schematically illustrating the single crystal-producing apparatus according to the an embodiment of the first aspect of the present invention. In the single crystal-producing apparatus, a heater 4A is provided inside an upper furnace 2, and a heater 4B is provided in a lower furnace 3. Temperature detectors (preferably thermocouples) 5A, 5B, 5C, 5D and 5E are arranged at specific locations of the upper and lower furnace. Signal cords are extended from each temperature detector to a controller 9. A crucible 11 is placed inside an inner space 10 of the upper furnace 2, and a single crystal body is drawn out into an inner space 18 of the lower furnace 3 through a nozzle of the crucible 11. A preferred embodiment of this portion will be explained later. A raw material feeder 1 is arranged above the upper furnace 2, and a feed port 1*a* of this raw material feeder 1 is opened to toward an upper face of the crucible 11. The raw material feeder 1 is also connected to the controller 9 through a signal cord.

A photographing device 6 for the single crystal body 12 is arranged under the lower furnace 3, and connected to the monitor 7. A moving device 13 schematically shown in the form of a block is arranged under the photographing device 6, and a cutter is under the moving device 13. Both the moving device 13 and the cutter 14 are connected to the controller. A reference numeral 16 denotes a cut portion of the single crystal body, and 15 denotes a single crystal product cut with a specified shape and dimension.

A transfer device 17 is arranged under the single crystal product, and the single crystal product 15 is moved into the transfer device 17 in a direction of the arrow A. The single crystal-producing apparatus is observed through a terminal unit 8, and controlled by the controller through the terminal unit.

In the following, preferred embodiments of various portions of the single crystal-producing apparatus will be explained in more detail. FIG. 2 is a sectional view for outlining a single crystal-growing device, and FIG. 3(*a*) and 3(*b*) are schematic views for illustrating a distal end portion of a nozzle portion.

Inside the furnace is provided a crucible 20. An upper furnace is arranged to cover the crucible 20 and an upper space 10 around it. A heater 4A is buried in the upper furnace 2. The nozzle portion 25 extends downwardly from an lower end portion of the crucible 20, and a drawing hole 25*a* is formed at a lowermost end of the nozzle portion 25. A lower furnace 3 is arranged to cover the nozzle 25 and a space 28 around it. A heater 4B is buried in the lower furnace. The heating furnace can of course be modified in various ways. For example, although the heating furnace is divided into two zones, i.e., the upper and lower furnaces in FIG. 2, the heating furnace may be divided into three or more zones. Both of the crucible 20 and the nozzle 25 are made of a corrosion-resistive conductive material.

One electrode extending from an electric power source 22A is connected to a location B of the crucible 20, and the other electrode of the electric power source 22A is connected to a corner C of a lower bent portion of the crucible 20. One electrode extending from an electric power source 22B is connected to a location D of the nozzle portion 25, and the other electrode of the electric power source 22B is connected to a lower end of the nozzle portion 25. The electrocity-passing mechanisms mentioned above are separated from each other so that voltages applied to these mechanisms may be independently controlled.

Further, an after-heater 66 is provided inside the space 18 such that heater 66 surrounds the nozzle at a given interval. Inside the crucible 20 is upwardly extended an intake tube 23, which has an intake hole 24 at its upper end. The intake hole 24 is located at a location slightly protruding into a bottom portion of a melt 21 inside the crucible 20.

Alternatively, the melt intake hole 24 may be formed at the bottom of the crucible so that the intake hole 24 may not be located to protrude the intake tube 20 from the bottom of the crucible 20. In this case, no intake tube 23 is provided. However, as the crucible is used for a long time, impurities in the melt may gradually accumulate in the bottom portion of the crucible. When the intake opening 24 is provided at the upper end of the intake tube 23, the impurities at the bottom is are unlikely to enter the intake opening 24 even if impurities are accumulated on the bottom of the crucible, because the intake tube 23 protrudes in the crucible from its bottom.

The upper furnace 2, the lower furnace 3 and the after heater 66 are caused to generate heat to properly set the temperature distribution inside each of the spaces 10 and 18, the raw material for the melt is fed into the crucible 20, and the crucible 20 and the nozzle portion 25 are caused to generate heat through application of electric power thereto. In this state, as shown in FIG. 3(a), the melt 21 slightly protrudes from a drawing opening 25a in a s1ngle crystal-growing section 26 at a lower end portion of the the nozzle portion 25, and is held therein by its surface tension to form a relatively flat surface 29.

The gravity acting on the melt 21 inside the nozzle 25 is largely reduced through contacting of the melt with the inner surface of wall of the nozzle 25. In particular, if the inner diameter of the nozzle portion 25 was set at not more than 0.5 mm, the abovementioned uniform solid phase/liquid phase interface (meniscus) could be formed.

In this state, a seed crystal 27 is moved upwardly as shown in a direction of the arrow F, so that an end face 27a of the seed crystal 27 is contacted with the above surface 29 of the melt. Then, as shown in FIG. 3(b), the seed crystal 27 is downwardly pulled down. The uniform meniscus 30 is formed between the upper end of the seed crystal 27 and the melt 21 is drawn downwardly through the nozzle portion 25. As a result, as shown in FIG. 2, the single crystal body 12 is continuously formed above the seed crystal 27, and pulled downwardly. A reference numeral 28 denotes a mechanism for pulling down the seed crystal 27.

On the other hand, if a conventional crucible is used and an amount of the raw material powder fed to the crucible is increased, an expanded portion of the melt is formed downwardly swelled from a drawing hole of the crucible. In this state, if an end face of a seed crystal is contacted with the melt, no good solid phase/liquid phase interface is formed.

Next, a preferred concrete configuration of the nozzle portion for the production of a single crystal plate will be explained. As shown in FIG. 4(a), plural rows of slender grooves 32 are formed in parallel at a flat plate 31. A planar nozzle portion 35 is formed by bonding the planar plates 31 as shown in FIG. 4(b) so that plural rows of melt flow passages 33 may be formed in the nozzle portion 35. A reference numeral 34 denotes a joint.

As shown in FIG. 4(c), the nozzle portion 35 is joined to the bottom of an elongated crucible 37. The melt in the crucible 37 flows out downwardly through the melt flow passages 33 of the nozzle 35. At that time, the melts flowing down through the melt flow passages 33 are combined together along the bottom face 35a of the nozzle portion 33, and the combined melt is solidified immediately below the bottom face 35a. Accordingly, the planar single crystal 36 is pulled downwardly through the nozzle portion 35. According to this type of the nozzle portion, the melt flow passages 33 each having a small diameter can be easily formed in the nozzle portion for the production of the single crystal plate.

FIG. 5 is a schematic view for illustrating a single crystal-growing device with a plurality of drawing holes. A melt 21 is received in a crucible 38, and a plurality of the drawing openings 40 are provided in the bottom of the crucible 38 so that single crystal bodies 12 may be pulled down through the respective drawing openings 40 in a direction of the arrows H. In order to supplement reduction in the amount of the melt in the crucible, a fresh single crystal raw material 39 is supplemented to the crucible in a direction of the arrow G.

FIG. 6 is a perspective view for illustrating a preferred embodiments of holders and cutters, and FIG. 7 is a side view for illustrating a principal portion thereof. FIG. 8 is a front view for illustrating chucks of the holder and their vicinity. Feed screws 42A and 42B are provided for a pair of respective frame members 41A and 41B, and holders 44A and 44B are fixed to the respective feed screws 42A and 42B. Cutters are provided under the respective holders 44A and 44B, and each of cutting members 45A and 45B of the cutters are coupled to a cylinder 46 via a shaft 47. Motors 43A and 43B are accommodated in a base table under the frame members 41A and 41B. The motors 43A, 43B are actuated to rotate the feed screws 42A, 42B so that the holder and the cutter may be moved up or down.

A concrete construction example of the holder 44A, 44B is shown in FIG. 8. A shaft 49 is connected to a cylinder 48, and a chuck 53A is fixed to the shaft 49 by a fixing member 52A. The shaft 49 is mechanically connected to a shaft 50 parallel thereto by a link mechanism 51. A chuck 53B is fixed to this shaft 50 by a fixing member 52B. The cylinder 48 can be driven in the arrow directions indicated by I. If the cylinder 48 is moved left in FIG. 8, the shaft 49 and the chuck 53A move toward the left side, whereas the shaft 50 and the chuck 53B move toward the right side. Consequently, the distance between the chucks 53A and 53B becomes greater to release grasping of the single crystal body. When the single crystal is to be grasped, the cylinder 48 is driven toward right, and the shaft 49 and the chuck 53A are moved toward the right side, whereas the shaft 50 and the chuck 53B move toward the left side.

When the single crystal body is to be downwardly fed, the outer periphery of the single crystal body is first grasped by the holder 44B, and then the feed screw is driven to move the holder 44B down to a specific location. At that time, as shown in FIG. 7, the cylinder 46 is driven to protrude the cutting member 45B so that the cutting member 45B may be brought into contact with the single crystal body 12, and caused to cut the single crystal body 12 upon pushing. Thereby, a single crystal product 15 is formed. Then, while the grasping of the single crystal body with the holder 44B is released, the single crystal body is grasped by the holder 44A at a given location, and then the holder 44A is in turn moved downwardly. During this step, the holder 44B is moved up to a specific upper location. In this way, the single crystal body 12 is alternatively grasped by and released from the holders 44A and 44B, and successively moved downwardly and cut, so that the single crystal body can be successively and automatically moved and cut. The above operations of the holders, the feed screws, etc. are controlled by the controller, but the controlling itself can be made according to a known method.

FIG. 9 is a side view for outlining other preferred embodiments of the single crystal-moving device and cutters, and FIG. 10 is a perspective view for illustrating a driving mechanism for a pair of rotary bodies. A rotary shaft 67B is fixed to a rotary shaft of a motor 54 via a gear chamber 55, and a pair of wheels 68 are fixed around the rotary shaft 67B such that a gap 69 is provided between a pair of the wheels 68. By so constructing, a rotary body 66B is formed. A rotary shaft 67A is provided to be synchronized with the rotary shaft 67B via a mechanism not shown. A pair of wheels 68 are fixed around the rotary shaft 67A such that a gap 69 is provided between a pair of the wheels 68. By so constructing, a rotary body 66A is formed. The single crystal body 12 is held in the gaps between a pair of the rotary bodies 66A and 66B, and then pulled downwardly.

Under the moving devices is arranged a cutter 57, which includes a cutting blade 58 connected to a driving unit. The cutting blade 58 is contacted with the single crystal body 12, and is caused to shear cut the single crystal body 12 under application of pressure. Thereby, a single crystal product not shown is obtained. This single crystal product is fallen down to a receiving box 60 along a slider 73.

The single crystal body may be fused by using a heater. For example, as schematically illustrated in FIG. 11(*a*), a heater 189 is opposed to the single crystal body 12, and as shown in FIG. 11(*b*), the heater 189 is caused to generate heat, and the single crystal body 12 is locally heated and fused. Thereby, a single crystal product 27 can be obtained. At that time, a portion of the single crystal body 12 is located inside a recess 189*a* of the heater 189, and the heater is caused to generate heat in the state that the heater does not contact the single crystal body 12. Alternatively, the single crystal body 12 may be fused in the state that the heater 189 is brought into contact with the single crystal body 12.

Referring to FIG. 12(*a*), a single crystal body 12 is on a screen 61 of a monitor 7. A scale 62 is arranged vertically to the single crystal 12, which enables the outer dimension of the single crystal body 12 to be measured.

As illustrated in FIG. 12(*b*), a laser beam 64 is irradiated upon the outer periphery of a single crystal body 12, and a portion of the irradiated light beam not interrupted by the single crystal body 12 is received by a light beam-receiving device not shown. Thereby, a X-direction dimension of the single crystal body 12 can be measured. Simultaneously, a laser beam 65 is irradiated upon the the outer periphery of the single crystal body 12 in a direction orthogonal to that of the laser beam 64, and a portion of the irradiated light beam not interrupted by the single crystal body 12 is received by a light beam-receiving device not shown. Thereby, a Y-direction dimension of the single crystal body 12 can be measured.

In the following, more concrete experimental results will be explained.

EXAMPLE 1
Growing of a KLN single crystal fiber

According to the process illustrated in connection with FIG. 1, a KLN single crystal fiber was produced. As the single crystal-growing device, that shown in FIG. 2 was used. The temperature of the entire interior of the furnace was controlled by the upper furnace 2 and the lower furnace 3. The growing device was so designed that the temperature gradient of an area near the single crystal-growing section 26 might be controlled by applying electric power to the nozzle 25 and making the after-heater 66 generate heat.

A powdery raw material was prepared by mixing potassium carbonate, lithium carbonate and niobium oxide in a molar composition ratio of 30:20:50. Into the crucible 20 made of platinum was put about 50 g of the above powdery raw material, and the crucible 20 was set at a specified location. Above the crucible 20 was set the raw material feeder 1, and a weight detector (not shown) was arranged in an upper portion of the crucible so that the feed speed of the raw material may be controlled based on a signal from the weight detector. The temperature of the space 10 inside the upper furnace 2 was adjusted to a temperature range of 1100–1200° C., thereby the raw material was melted inside the crucible 20. The temperature of the space 18 inside the lower furnace 3 was uniformly controlled to the temperature range of 500–1000° C. While a given electric power was applied to the crucible 20, the nozzle portion 25 and the after-heater 66, a single crystal body was grown. At that time, the single crystal body was excellently grown under the controlled condition that the temperature of the single crystal-growing section was set at 1050–1150° C., and the temperature gradient at the single crystal-growing section was controlled to 10–50° C./mm.

The cross sectional shape of each of the inner and outer peripheries of the nozzle portion 25 was circular with the outer diameter of 1 mm, the inner diameter of 0.1 mm and the length of 20 mm. The plane shape of the crucible 20 was circular with the diameter of 30 mm and the height of 30 mm.

The single crystal-moving device was used, which included the rotary bodies as shown in FIGS. 9 and 10, and the cutter shown in FIGS. 11(*a*) and 11(*b*) were used with the heater made of a platinum wire. This moving device enabled the single crystal fiber to be drawn down at a vertically uniform speed in a range of 2–200 mm/hr. As an observing device, the CCD image-photographer and the monitor shown in FIGS. 1 and 12(*a*) were used.

In order to first effect seeding, a seed crystal was moved up from a lower side, and contacted to the melt. After a good meniscus was formed at the interface between the seed crystal and the melt, the seed crystal was drawn down at a speed of 20 mm/hr, and a single crystal fiber was grown. By so doing, the single crystal fiber or single crystal body having a sectional shape of 1×1 mm was grown. When the length of the grown single crystal body reached about 200 mm, the single crystal fiber was grasped between a pair of the rotary bodies. Then, the seed crystal portion was cut off by applying electric power to the heater 169. The single crystal fiber exists between the holder and the nozzle portion of the single crystal-growing device.

As the single crystal fiber grew, the melt inside the crucible decreased and the weight of the entire crucible, that is, the weight of the melt decreased. Therefore, the total weight of the crucible and the melt was measured by a load cell, and a fresh raw material was fed so that the measured result might be almost constant with an error of within ±10 mg. Since the single crystal fiber grew 60 mm in about 3 hours, electric power was applied to the heater every three hours to cut the single crystal fiber. Thereby, single crystal fiber products having a dimension of 1×1×60 mm were continuously produced. In this state, the above operation was continued for one week to obtain 56 single crystal fiber products.

With respect to the thus obtained single crystal fiber products, the second harmonic wave-generating characteristic was measured. As a result, it was found out that a phase matched wavelength was almost constant within a detection variation of ±0.2 μm with respect to a target one of 840 nm. Further, an output conversion efficiency obtained was almost the same as its theoretical value, and its variation is within ±1%, which is the detection limit of this measurement.

EXAMPLE 2
Multiple growing of Nd-LN single crystal fibers

Nd—LN single crystal fibers were grown according to the process explained by referring to FIG. 1. The same growing crucible shown in FIG. 5 except that the number of the nozzles were 10 was used. The furnace for the single crystal-growing device as shown in FIG. 2 was used. The temperature of the entire interior of the furnace was controlled by the upper furnace 2 and the lower furnace 3. The temperature gradient near the single crystal-growing section 26 was controlled by feeding the electric power to the nozzle portion 25 and making the after heater 66 generate heat.

A powdery raw material was prepared by mixing neodymium oxide, lithium carbonate and niobium oxide at a molar composition ratio of 1:49:50. Into the platinum crucible 38 was put 100 g of this powdery raw material. Above the crucible 38 was set the raw material feeder 1. A thermocouple was arranged near the surface of the melt inside the crucible, and the feeding of the raw material into the melt inside the crucible was controlled based on a signal from the thermocouple.

The temperature of the space 10 inside the upper furnace 2 was adjusted to a temperature range of 1200–1300° C., thereby melting the raw material inside the crucible 38. The temperature of the space 18 inside the lower furnace 3 was uniformly controlled to the temperature range of 600–1200° C. While a given electric power was applied to the crucible 38, the nozzle portion 40 and the after-heater 66, a single crystal body was grown. At that time, the single crystal body was excellently grown under the controlled condition that the temperature of the single crystal-growing section was set at 1200–1300° C., and the temperature gradient at the single crystal-growing section was controlled to 10–50° C./mm.

The single crystal-moving device was used, which included the holders and the cutters as shown in FIGS. 6, 7 and 8. In this experiment, each set of the holder and the cutter was arranged at a location corresponding to each nozzle portion. This moving device enabled the single crystal fiber to be pulled down at a vertically uniform speed in a range of 2–200 mm/hr. As an observing device, the CCD image-photographer and the monitor shown in FIGS. 1 and 12(a) were used.

A seed crystal was grasped by a first uppermost holder. In order to first effect seeding, a seed crystal was moved up from a lower side, and contacted to the melt. After a good meniscus was formed at the interface between the seed crystal and the melt, the seed crystal was pulled down at a speed of 25 mm/hr, and a single crystal fiber having a sectional shape of 0.6×0.6 mm was grown. When the length of the thus grown single crystal body reached about 200 mm and the first holder was located 75 mm lower than the second one, the single crystal fiber was grasped by the second holder, and the single crystal fiber was pulled down by a speed of 25 mm/hr. Thereafter, the grasping of the single crystal fiber with the first holder was released, and the first holder was moved upwardly. The single crystal fiber was cut by the cutting member under the second holder, and the single crystal fiber product was moved to a single crystal fiber-stocking section. Such single crystal fiber products could be continuously produced by repeating the above process.

As the single crystal fiber grew, the melt inside the crucible decreased. Thus, the temperature was measured by the thermocouple arranged at a location slightly higher than the surface of the melt inside crucible, and changes of the melt surface were detected based on changes of the thus measured temperature. A temperature signal was sent to the controller, which feed back controlled the feeding of the raw material so that variations in the height of the melt surface might be within ±0.1 mm from a target one. Since the single crystal fiber grew 75 mm in about 3 hours, electric power was applied to the heater every three hours to cut the single crystal fiber. Thereby, single crystal fiber products having a dimension of 0.6×0.6×75 mm were continuously produced. In this state, the above operation was continued for one week to obtain 56 single crystal fiber products.

With respect to all the thus obtained Nd-LN single crystal fiber products, the laser oscillating characteristic was measured. As a result, it was confirmed that almost same output conversion efficiency at 1060 nm was obtained, and detection variations were within ±1%. The elementary analysis of the composition distribution with EPMA revealed that with respect to the charged composition of 1.0 mol %, a variation in each component of the composition was controlled to within ±2% variation from the first molar ratio, which is the detection limit of this measurement.

EXAMPLE 3

Growing of a KLN single crystal plate

According to the process illustrated by referring to FIG. 1, a KLN single crystal plate was produced. As the single crystal-growing crucible, that shown in FIGS. 4(a) to 4(c) was used. The furnace for the single crystal-growing device as shown in FIG. 2 was used. The temperature of the entire interior of the furnace was controlled by the upper furnace 2 and the lower furnace 3. The growing device was designed such that the temperature gradient of an area near the single crystal-growing section 26 might be controlled by applying electric power to the nozzle 25 and making the after-heater 66 generate heat.

As the flat plate 31 was used a platinum plate having a dimension of 30 mm×30 mm×0.6 mm. Grooves 32 were formed at this platinum plate by mechanical cutting using a dicing machine. The interval between the adjacent grooves 32 was 5 mm, and the width of each groove was 0.1 mm. A planar nozzle portion 35 having a thickness of 1.2 mm was formed by joining two platinum plates 31. As explained in connection with FIGS. 4(a) to 4(c), the melt was flown through the melt flow passages 33.

A powdery raw material was prepared by mixing potassium carbonate, lithium carbonate and niobium oxide in a molar composition ratio mentioned later. Into the crucible 37 made of platinum was charged 500 g of the above powdery raw material. Above the crucible 20 was set the raw material feeder 1. The thermocouple was set near the surface of the melt inside crucible, and the feeding of the raw material to the melt was controlled based on a signal from the thermocouple.

The temperature of the space 10 inside the upper furnace 2 was adjusted to a temperature range of 1100–1200° C., thereby the raw material was melted inside the crucible 37. The temperature of the space 18 inside the lower furnace 3 was uniformly controlled to the temperature range of 500–1000° C. While given electric power was applied to the crucible 37, the nozzle portion 25 and the after-heater 66, a single crystal body was grown. At that time, the single crystal body was excellently grown under the controlled condition that the temperature of the single crystal-growing section was set at 1050–1150° C., and the temperature gradient at the single crystal-growing section was 10–50° C./mm.

The single crystal plate-moving device was used, which included the rotary bodies as shown in FIGS. 9 and 10. A cutter was used, which cut the single crystal plate by irradiating carbon dioxide laser beam upon it. This moving device enabled the single crystal plate to be pulled down at a vertically uniform speed in a range of 2–200 mm/hr. The measuring device shown in FIG. 12(b) was used, which observed the dimension of the single crystal plate by using the laser beams. Under the cutter was arranged a transfer device for transferring cut single crystal plate products by a belt conveyor in the state that the cut single crystal plate products were placed on a holding member and transferred.

In addition, an observing device for the composition of the single crystal plate was installed, which includes a titanium-sapphire laser beam source and spectrum analyzer for analyzing output light beam from the single crystal plate.

In order to first effect seeding, a seed crystal was moved up from a lower side, and contacted to the melt. After a good meniscus was formed at the interface between the seed crystal and the melt, the seed crystal was pulled down at a speed of 18 mm/hr, and a single crystal plate was grown. When the length of the thus grown single crystal body reached about 200 mm with a sectional shape of 50 mm×1 mm, the single crystal plate was grasped between a pair of the rotary bodies. Then, the seed crystal portion was cut off by irradiating the carbon dioxide laser, and the moving device was moved down to the lowermost portion.

As the single crystal plate grew, the melt inside the crucible decreased. Thus, the temperature was measured by the thermocouple arranged at a location slightly higher than the surface of the melt inside crucible, and changes of the melt surface were detected based on changes of the thus measured temperature. A temperature signal was sent to the controller, which feed back controlled the feeding of the raw material so that variations in the height of the melt surface might be within ±0.1 mm from a target one.

A laser beam of near a target phase matched wavelength (840 mn) was irradiated upon the single crystal plate from the titanium-sapphire laser beam source, and an output light was analyzed by the spectrum analyzer. As raw materials, powders having the following two kinds of compositions were used.

Powder 1: $K_{3.1}Li_2Nb_5O$
Powder 2: $K_{2.9}Li_2Nb_5O$

First, Powders 1 and 2 were mixed at a ratio of 1:1, which was put into the crucible. When the peak wavelength shifted to a longer side, the amount of Powder 1 was increased, whereas when the peak wavelength shifted to a shorter side, the amount of Powder 2 was increased. By so doing, the composition of the single crystal plate was controlled.

As a result, the phase matched wavelength of the single crystal plate was controlled to an accuracy of not more than 0.2 nm. That is, the composition of the KLN single crystal could be controlled to a high accuracy of not more than 0.01 mol % than ever before.

Since the single crystal fiber grew 50 mm in about 3 hours, the single crystal plate was cut by irradiating the carbon dioxide laser beam thereupon every three hours to cut the single crystal plate. Thereby, single crystal plate products having a dimension of 50 mm×50 mm×1 mm were continuously produced. In this state, the above operation was continued for one week to obtain 56 single crystal plate products.

With respect to all of the thus obtained single crystal products, the property of the second harmonic generation plate was measured. As a result, it was confirmed that a phase matched wavelength was almost constant within a detection variation of ±0.2 nm with respect to a target one of 840 nm. Further, an output conversion efficiency obtained was almost the same as its theoretical value within ±1% variation, which is the detection limit of this measurement.

Next, embodiments of the second aspect of the present invention will be explained.

FIG. 13 is a schematic cross-sectional view of the producing apparatus for growing a single crystal, and the state of the distal end portion of the nozzle portion thereof will be explained using FIGS. 3(a) and 3(b).

A crucible 20 is disposed in the interior of the furnace body. An upper furnace 2 is arranged to surround the crucible 20 and its upper space 10. The upper furnace 2 has a heater 4A embedded therein. A nozzle portion 25 extends downwardly from the lower end of the crucible 20 and has an opening 25a at the lower end. A lower furnace 3 is arranged to surround the nozzle portion 25 and its surrounding space 18. The lower furnace 3 has a heater 4B embedded therein. The crucible 20 and the nozzle portion 25 are respectively made of a corrosion-resistant electrically conductive material. The heating furnace can of course be modified variously. For example, though the heating furnace is divided into two heating zones in FIG. 13, the heating furnace may be divided into at least three heating zones.

An electrode of an electric power source 22A is connected to a portion B of the crucible 20 through a leading wire 68 and the other electrode of the power source 22A is connected to a portion C of the crucible 20. An electrode of an electric power source 22B is connected to the portion D the nozzle portion 25 and the other electrode of the power source 22B is connected to the lower end E of the nozzle portion 25. These electric power supplying mechanisms are separated from each other and constructed to control its voltage independently.

In addition, an after-heater 66 is arranged in the space 18 to surround the nozzle portion 25 with a spacing. An intake tube 23 extends upwardly and has an intake hole 24 at the upper end. The intake tube 23 is a little protruded upwardly from the bottom of the melt 21.

If the temperature gradient of the nozzle portion 25 has been optimized by the furnace body (a heat-generating member and a refractive material), the after-heater 66 is not indispensable and may be omitted.

The intake hole for the melt may be provided at the bottom of the crucible such that it does not protrude from the bottom of the crucible. In such a case, the intake tube 23 is not provided. However, when the crucible is used for a prolonged period of time, impurities in the melt are occasionally gradually accumulated on the bottom of the crucible. By the provision of the intake hole 24 at the upper end of the intake tube 23 as in this embodiment, the impurities on the bottom of the crucible are hardly introduced in the intake hole 24 even if the impurities are accumulated on the bottom of the crucible, because the intake tube 23 is protruded from the bottom of the crucible.

The upper furnace 2, the lower furnace 3 and the after-heater 66 are heat generated to suitably determine the temperature distributions in the spaces 10, 18, the raw material for forming the melt is fed in the crucible 20, and the crucible 20 and the nozzle portion 25 are heat-generated by supplying an electric power thereto. At this state, at the single crystal-growing section 26 existing at the lower end of the nozzle portion 25, the melt 21 is slightly protruded from the opening 25a and retained thereat by the surface tension to form a relatively flat surface 29.

The gravity acting on the melt 21 in the nozzle portion 25 is largely decreased by the contact of the melt with the inner wall surface of the nozzle portion 25. Particularly, by using the nozzle portion 25 of an inner diameter of not more than 0.5 mm, a uniform meniscus could be formed as described above.

At this state, the seed crystal 27 is moved upwardly as shown by the arrow F to contact its upper end surface 27a with the lower surface 29 of the melt 21. Then, the seed crystal 27 is pulled downwardly as shown in FIG. 3(b). At that time, a uniform meniscus is formed between the upper end surface of the seed crystal 27 and the lower end surface of the melt 21 drawn downwardly from the nozzle portion 25.

As a result, a single crystal fiber 12 is continuously formed on the seed crystal 27 and pulled downwardly. In this embodiment, the seed crystal 27 and the single crystal fiber 12 are drawn by a pair of rollers 67.

Meanwhile, in case if a conventional crucible is used and the amount of the material powder initially charged in the conventional crucible is increased, a round expanded surface of the melt is formed downwardly from the opening 25a of the nozzle portion 25. If the upper end surface of the melt is contacted to the upper end surface of the seed crystal 27, a good meniscus is not formed.

The producing apparatus shown in FIG. 14 is substantially the same as that shown in FIG. 13, so that the same functional members are allotted with the same reference numerals as in FIG. 13 and the explanations of FIG. 13 are referenced in FIG. 14. However, the producing apparatus shown in FIG. 14 is not provided with the mechanism of supplying electric power to the crucible 20 per se as used in the producing apparatus of FIG. 13, so that the crucible 20 per se is not heat-generated. However, in this case also, the raw material powder in the crucible 20 can satisfactorily be heated by adjusting the temperature of the upper furnace 2, or if necessary by providing and using a not shown radio frequency heat-generating mechanism around the crucible 20.

FIG. 15 is a schematic cross-sectional view of another embodiment of the present producing apparatus. The same functional members as in FIGS. 13 and 14 are allotted with the same reference numerals and explanations thereof are omitted. Also, the neighboring portions, such as, the upper and lower furnaces shown in FIGS. 13 and 14 are omitted in FIG. 15. In the producing apparatus shown in FIG. 15, electrodes of the electric power source 22A are connected to the upper end F and the substantially central portion G of the crucible 20, electrodes of the electric power source 22B are connected to the substantially central portion G and the lower end H of the crucible 20, and electrodes of an alternating current electric power source 22C are connected to the lower end H of the crucible 20 and the upper end I of the nozzle portion 25. The nozzle portion 25 is connected to an alternating current power source 22 through leading wires. These electric power supplying mechanisms are separated from each other and constructed to control its voltage independently.

FIG. 16 is a schematic cross-sectional view of still another embodiment of the producing apparatus showing a shape of the crucible. A nozzle portion 169 extends downwardly from the lower end of the crucible 20 and has an opening 169a at the lower end. The single crystal fiber or plate 12 is pulled down from the opening 69a. The intake tube 23 extends upwardly in the crucible 20 and has the intake hole 24 at the upper end.

The crucible 20, the intake tube 23 and the nozzle portion 169 are respectively made of a corrosion-resistant electrically conductive material. Electrodes of the electric power source 22A are connected to the upper end B and the lower end C of the crucible 20. A circular shaped heat-generating member 170 is arranged around the nozzle portion 169. An electrode of the electric power source 22 is connected to the upper end D of the heat-generating member 170 through a leading wire 178 and the other electrode of the electric power source 22 is connected to the lower end E of the heat-generating member 170. These electric power supplying mechanisms are separated from each other and constructed to control its voltage independently.

In order to heat the nozzle portion, a not shown radio frequency heat-generating mechanism may be provided around the nozzle portion; and the single crystal could be grown by precisely controlling the mechanism.

If a direct current power source is connected to the nozzle portion 169, bubbles of gas are occasionally formed by electrolysis of the ionized melt. In such a case, an alternating current power source has to be connected to the nozzle portion 169. However, if the circular heat-generating member 170 is arranged around the nozzle portion 169 as in this embodiment, a direct current power source may be connected to the heat-generating member 170.

FIG. 17 is a schematic cross-sectional view of still another embodiment of the producing apparatus showing a shape of the crucible 150 used therein. A nozzle portion 25 extends downwardly from the lower end of a main body 77 of a crucible 150, while an intake tube 23A extends upwardly from the bottom of the crucible 150. In the main body 77 of the crucible 150, a partition wall 71 which is circular viewed in plan view is disposed between the inner wall of the main body 77 and the intake tube 23A to form a space 73 between the inner wall of the main body 77 and the partition wall 71 as well as a space 76 between the partition wall 71 and the intake tube 23A. The partition wall 71 may be fixed to the inner wall of the main body 77 at a portion not shown or may be fixed to an exterior member of the crucible 150.

The lower end of the partition wall 71 is not contacted to the bottom 75 of the main body 77, so that a gap 74 exists between the partition wall 71 and the main body 77. Therefore, if the raw material powder is charged in the space 73 from a raw material supply hole 72 existing at the outside of the partition wall 71, the raw material powder is melted in the space 73 and passed from the space 73 to the space 76 through the gap 74 and rises in the space 76 and introduced in the intake tube 23A from the intake hole 24.

Processing of a noble metal, such as, platinum to form the nozzle portion of a fine inner diameter of not more than 0.2 mm is usually difficult and much expensive. Therefore, the inventors have found out that such a small nozzle portion of a fine inner diameter of not more than 0.2 mm can be produced by the following method.

That is, the inventors produced such nozzle portion by forming a groove in a corrosion-resistant member made of a corrosion-resistant metal or a corrosion-resistant ceramics preferably of a plate shape, and adhering or joining the grooved member to the other corrosion-resistant member preferably of a plate shape. In such a nozzle portion, the groove serves as an elongated passage of a fine diameter for the melt.

At that time, the passage for the melt may be prepared by forming the groove in both the flat plates and integrally uniting the grooves when adhering the flat plates. Alternatively, the passage may be prepared by forming the groove in one flat plate, while leaving the other flat plate as it is, and adhering the two flat plates to obtain the passage formed by the groove in the flat plate.

In addition, the inventors could produce a single crystal plate as described later in detail by forming a plurality of grooves in the nozzle portion to form the passages for the melt and drawing the melt simultaneously from the passages.

In these cases, preferably the grooves have respectively a width of 0.01–0.5 mm, and a spacing of 0.1–10 mm. The grooves may have a square shape, a rectangular shape, V-shape or a half circular shape.

Concretely explaining, an elongated flat plate 78 is prepared as shown in FIG. 18(a), and an elongated groove 79 is formed longitudinally in the flat plate 78 as shown in FIG. 18(b). The same work is effected using another flat plate 78. Two sheets of such flat plates 78 are adhered facing the grooves 79 to each other to prepare a nozzle portion 80 as well as a passage 81 in the nozzle portion 80 as shown in FIG. 18(c). The nozzle portion 80 is joined to the bottom 82a of a crucible 82 and the melt is flowed down in the passages 81 as shown in FIG. 18(d). If such a means is used, a nozzle portion having a fine inner diameter of not more than 0.2 mm for forming the single crystal fiber can easily be prepared. Of course, the nozzle portion may have an inner diameter of not less than 0.2 mm.

Next, concrete shapes of the nozzle portion for producing the single crystal plate will be explained. The inventors have found out that in the μ pulling down process the single crystal plate can be pulled down by preparing a flat surface of a plate shape corresponding to the cross-section of the single crystal plate, forming a plurality of elongated passages for the melt, drawing the melt simultaneously from the passages downwardly, and flowing and uniting the drawn melt along the flat surface.

In this embodiment, the whole of the nozzle portion can be made to a plate shape. Also, the nozzle portion may have a tubular shape and a diameter expanded portion at the distal end and the distal end surface of the diameter expanded portion may have a flat surface as described above. The nozzle portion may be made of a plurality of tubular members and the tubular members may be integrally joined to each other to form an integral flat surface composed of the distal end surfaces of the tubular members.

For example, a plurality of rows of elongated parallel grooves 32 are formed in a flat plate 31 as shown in FIG. 4(a). The same work is effected using another flat plate 31. Two sheets of such flat plates 31 are adhered to prepare a flat plate shaped nozzle portion 35 as well as passages 33 in the nozzle portion 35 as shown in FIG. 4(b). The reference numeral 34 denotes a joint.

The nozzle portion 35 is joined to the bottom of a rectangular crucible 37 as shown in FIG. 4(c). The melt in the crucible 37 flows down in the respective passage 33 of the nozzle portion 35 to flow out from the lower end of the respective passage 33. At that time, the melt flowed out from the lower end of the respective passage 33 becomes integral and flowed on a flat bottom plate 35a of the nozzle portion 35 and assumes a solid phase at immediate below the flat bottom plate 35a to allow the pulling of a plate shaped single crystal 36 downwardly from the nozzle portion 35. In this way, the small nozzle portion 35 of a fine inner diameter for forming the single crystal plate can easily be prepared.

In the embodiment shown in FIG. 19, a nozzle portion 83 were made of a plurality of tubular members 85. The tubular members 85 were arranged in a row such that their outer circumferential surfaces continue from each other. Though the crucible portion was omitted in FIG. 19, a crucible, such as, the crucible 37 as shown in FIG. 4(c) may be used. The tubular members 85 have therein respectively a passage 84 for the melt and has an opening at the lower end bottom surface 85a thereof.

The melt in the crucible flows down in the respective passage 84 of the respective tubular members 85 and flowed out therefrom to the lower end bottom surface 85a. At that time, the melt flowed out from the respective passage 84 is made integral and flowed on the a flat end surface 87 composed of the bottom surfaces of the tubular members 85 to assume a solid phase at immediate below the flat end surface 87 thereby to allow the downward pulling of a plate shaped single crystal 86 from the nozzle portion 83.

Also, the nozzle portion may have a diameter expanded portion at the distal end. Namely, if the nozzle portion is formed from a high melting point metal, such as, platinum, preferably the nozzle portion has a thickness of not more than 0.2 mm in order to heat-generate the nozzle portion by passing an electric power thereto. Also, the diameter of the passage in the nozzle portion has an upper limit, so that the outer diameter of the nozzle portion has a limit. Meanwhile, the diameter of the single crystal fiber drawn from the nozzle portion is usually not more than the outer diameter of the nozzle portion. As a result, the outer diameter of the nozzle portion is occasionally less than the outer diameter of the desired single crystal fiber, and in such a case the single crystal fiber can not be drawn. As a means for solving such a problem, the nozzle portion may be formed from the main body of a relatively small outer diameter and the diameter expanded portion of a relatively large outer diameter arranged at the distal end of the main body.

FIG. 20 is a schematic cross-sectional view of an embodiment of the producing apparatus of the second aspect of the present invention. A nozzle portion 89 extends downwardly from the lower end of the crucible 20. The nozzle portion 89 is formed from a main body 90 of the nozzle portion 89 and a diameter expanded portion 91 arranged at the lower end of the main body 90. The diameter expanded portion 91 has the single crystal growing section 26 arranged therein and an opening 91a from which the single crystal fiber 12 is pulled down as shown by the arrow J. The crucible 20, the intake tube 23, the main body 90 and the diameter expanded portion 91 of the nozzle portion 89 are respectively made of a corrosion-resistant electrically conductive material. The electrodes of the electric power source 22A are connected to the portions B and C of the crucible 20 and the electrodes of the electric power source 22 are connected to the main body 90 of the nozzle portion 89 at, for example, portions D and E through the leading wires 68.

Next, the embodiment of providing the diameter expanded portion at the distal end of the tubular nozzle portion, the distal end having the flat surface as described above, and pulling down the single crystal plate along the flat surface, will be illustrated. FIG. 21 is a schematic cross-sectional view of the embodiment of the producing apparatus. The nozzle portion extends downwardly from the lower end of the crucible 20. A main body 93 of the nozzle portion has a passage 93a formed therein and an opening 93b at the lower end of the passage 93a.

A diameter expanded portion 94 is joined below the main body 93. The diameter expanded portion 94 has a substantially flat shaped outer shell 94a and a passage 94c which extends in the vertical direction in the drawing formed in the flat shaped outer shell 94a. A multiple number of horizontal passages 94b are also formed in the outer shell 94a. The passages 94b are regularly formed in parallel to each other with a desired spacing and have respectively an opening 94d at the distal lower end. The diameter expanded portion 94 has a flat surface 95 formed at the lower side.

The melt in the crucible 20 flows down in the passage 93a of the main body 93 of the nozzle portion, flows horizontally in the passage 94c and vertically in the respective passages 94b, and flows out from the respective opening 94d. The melt flowed out from the respective opening 94d becomes integral and flowed on the flat surface 95 and assumes a solid phase at immediate below a flat surface 95 thereby to allow the pulling of a plate shaped single crystal 96 downwardly from the nozzle portion.

FIG. 22 is a schematic cross-sectional view of another embodiment of the producing apparatus of the present invention for growing the single crystal. FIG. 23 is a schematic plan view of the apparatus of FIG. 22. A crucible 101 of a substantially cylindrical shape is disposed in the melting furnace 99, and heating devices 109A, 109B and 109C are arranged to surround the crucible 101 from, for example, three directions. The crucible 101 contains a melt 21. An electrode of the electric power source 22A is connected to a portion B of the crucible 101 through a leading wire, and the other electrode of the electric power source 22A is connected to the lower end C of the crucible 101.

Though the shape of the bottom wall 101b is of a plate shaped in this embodiment, the shape may be changed variously as the case maybe.

The melting furnace 99 accommodating the crucible 101 is partitioned from the growing furnace by a heat insulating wall 98. A nozzle portion 104 is arranged at a side wall 101a of the crucible 101. The crucible 101 and the nozzle portion 104 are respectively made of a corrosion-resistant electrically conductive material. The nozzle portion 104 has a horizontal portion 104a protruded from the side wall 111a, a vertical portion 104b extending upwardly in the vertical direction, an inserting portion 104c inserted in a through-hole 98a of the heat insulating wall 98, and a distal end portion 104d extending downwardly from the distal end of the inserting portion 104c. That is, the nozzle portion 104 has the vertical portion 104b extending upwardly viewed from a connecting portion 103 connecting the nozzle portion 104 and the crucible 101. The nozzle portion 104 is connected to the electric power source 22 at desired portions, for example, L and M, so as to heat-generate the nozzle portion 104.

Here, preferably the nozzle portion 104 is protruded from the crucible 101 between the surface level 21a of the melt and the bottom surface 102 of the crucible 101 at a height not higher than the middle point of the two levels. This is because, particularly when the raw material powder is supplied continuously or intermittently in the crucible, minute variations in the composition are likely occur to adversely influence over the composition of the oxide series single crystal, whereas the adverse influence of the continuous or spasmodic supply of the raw material powder over the composition of the oxide series single crystal can be prevented by protruding the nozzle portion 104 at a height not higher than the middle point of the surface level 21a and the bottom surface 102 of the crucible 101.

Heating devices 109A, 109B and 109C are heat-generated and the crucible 101 is heat-generated by passing an electric current therethrough to melt the raw material in the crucible 101. Temperature distributions in the nozzle portion 104 is suitably determined by passing an electric current therethrough so that the raw material powder is not excessively stayed in nozzle portion 104. Simultaneously, the thickness and the material of the heat insulating wall 98, the temperatures of the heating devices and the temperature of the after-heater 107 are suitably determined to optimize particularly the temperature distributions in the vicinity of the single crystal growing section 26 thereby to pull down the single crystal fiber or plate from the opening 26 of the nozzle portion. In this embodiment, the seed crystal 27 and the single crystal fiber 12, etc., are transported by the rollers 67.

In the single crystal producing apparatus shown in FIGS. 22 and 23 also, a flat surface may be formed at at least the lower distal end of the nozzle portion as described above, and the single crystal plate may be pulled downwardly along the flat surface. In this case also, a plate shaped nozzle portion may be used as described above. However, in this embodiment, the nozzle portion itself is bent so that the drawing hole of the nozzle portion may exist at a higher position than the bottom surface of the crucible. At that time, the plate shaped nozzle portion may be bent, e.g., as shown in FIGS. 22 and 23 in the production thereof.

The main body per se of the nozzle portion may have a shape of, e.g., tubular shape as shown in FIG. 22, and the diameter expanded portion may be formed at the above described flat surface of the distal end of the tubular nozzle portion, and the single crystal plate may be pulled down along the flat surface. This embodiment will be illustrated with reference to FIG. 24.

FIG. 24 is a schematic partial cross-sectional view of the vicinity of the distal end portion of another nozzle portion viewed from the growing furnace in the single crystal producing apparatus shown in FIGS. 22 and 23. The crucible and the melting furnace, etc., of the producing apparatus in this embodiment ate the same as those described in FIGS. 22 and 23. A main body 110 is formed vertically downwardly at the outside of a through-hole 98a and has the diameter expanded portion 94 joined thereto. The main body 110 has a passage 110a formed therein and an opening 110b formed at the lower end.

The shape of the diameter expanded portion 94 is the same as that shown in FIG. 21. The melt in the crucible 20 flows down in the passage 110a of the main body 110, horizontally in the passage 94c and vertically through the vertical passages 94b and out from the opening 94d. The melt flowed out from the respective opening 94d becomes integral and flows on the flat surface 95 and assumes a solid phase at immediate below the fat surface 95 thereby to allow the pulling of the plate shaped single crystal 96 downwardly from the nozzle portion.

Hereinafter, the second aspect of the present invention will be explained with reference to concrete experimental results.

EXAMPLE 4

Using the single crystal producing apparatus shown in FIG. 13, a KLN single crystal fiber was produced according to the present invention except that the nozzle portion 89 shown in FIG. 20 was used as the nozzle portion. The temperatures in the whole furnace were controlled by means of the upper furnace 2 and the lower furnace 3. The temperature gradient in the vicinity of the single crystal-growing section 26 was controlled by the supply of electric power to the nozzle portion 89 and heat-generation of the after-heater 66. For pulling down the single crystal fiber, a mechanism was used which pulls the single crystal fiber downwardly at a controlled uniform pulling rate in a range of 2–100 mm/hr in the vertical direction.

Potassium carbonate, lithium carbonate and niobium oxide were reciped in a mol ratio of 30:20:50 to prepare a raw material powder. Around 50 g of the material powder were charged in a melting crucible 20 made of platinum and the melting crucible 20 was set at a desired position in the furnace. The temperature in the space 10 of the upper furnace 2 was adjusted to a temperature of 1,100–1,200° C. to melt the raw material in the crucible 20. The temperature in the space 18 of the lower furnace 3 was uniformly controlled to a temperature of 500–1,000° C. A desired electric power was supplied to the melting crucible 20, the nozzle portion 89 and the after-heater 66 to perform the growing of the single crystal. At that time, the single crystal-growing section could be controlled to a temperature of 1,050–1,150° C. and a temperature gradient of 10–150° C./mm.

The nozzle portion 89 had outer and inner cross-sections of circular shapes. In particular, the main body 90 had an outer diameter of 0.4 mm, an inner diameter of 0.2 mm and a length of 20 mm. The diameter expanded portion 91 had an outer diameter of 1.0 mm, an inner diameter of 0.2 mm and a length of 2 mm. The melting crucible 20 had a circular shape in plan view and a diameter of 30 mm and a height of 30 mm. At this state, the single crystal fiber was pulled downwardly at a pulling rate of 20 mm/hr in the a axial direction to find out that a good KLN single crystal fiber could be pulled down. In the same manner, the single crystal fiber could be pulled down in the c axial direction.

The thus grown single crystal fiber having a longitudinal and lateral size of 1 mm×1 mm and a length of 100 mm was examined with respect to the composition distribution of the single crystal fiber viewed in the length direction (grown direction). Concretely explaining, the single crystal fiber was irradiated at various portions in the longitudinal direction by a light beam. And the wavelength of the light beam emitted therefrom was measured to detect an SHG phase matched wavelength. If there is even a slight variation in the composition of the KLN single crystal fiber, the SHG phase matched wavelength of the emitted light beam is varied by the variation in the composition.

The result of the measurement showed that the wavelength was controlled within not more than 1 nm. So, the composition of the single crystal fiber could be controlled with a high precision of not more than 0.01 mol % of composition when, which is a high precision never attained before as a KLN single crystal. The wavelength conversion efficiency of the KLN single crystal fiber was substantially the same with the theoretical value with an error of not more than ±2% which is within the range of measurmental error.

EXAMPLE 5

In the same manner as in Example 4, a KLN single crystal fiber was grown except that a raw material feeding mechanism was used in the furnace, which intermittently feeds the raw material in the melting crucible 20. Also, a cutting mechanism was arranged below the furnace, which intermittently cuts the single crystal fiber to a desired length to continuously grow the single crystal fiber. With the progress of the growing of the single crystal fiber, the raw material powder was fed in the melting crucible in an amount corresponding to the amounts of the components drawn and evaporated from the melting crucible. In this way, a single crystal fiber of a length of around 10 m was continuously formed and the variation in the composition thereof was measured in the same manner as in Example 4. As a result, the variation in the composition of the single crystal fiber could be controlled within not more than 0.01 mol % over the entire length of around 10 m.

EXAMPLE 6

The nozzle portion 35 and the crucible 37 as shown in FIG. 4 were used to succeed in pulling down a KLN single crystal plate of a thickness of 1 mm and a width of 30 mm. However, a platinum plate of a size of 30 mm×30 mm×0.6 mm was used as the plate 31. Grooves 32 each having a width of 0.1 mm were formed with a spacing of 5 mm in the platinum plate 31 by mechanical cutting using a dicing machine. A plate shaped nozzle portion of a thickness of 1.2 mm was prepared by joining two sheets of the platinum plate. The melt was flowed out from the respective passage of the melt as explained above with reference to FIGS. 4(*a*)–4(*c*). The SHG phase matched wavelength and the wavelength conversion efficiency in the-single crystal plate were measured to obtain the same values as those of the above described single crystal fiber.

EXAMPLE 7

The present invention was applied to a method of growing a single crystal of neodymium substituted $LiNbO_3$. However, the amount of neodymium substituted in this system was around 0.3 mol %, if a method, for example, a CZ method was used.

Neodymium oxide, lithium carbonate and niobium oxide were reciped in a mol ratio of 1:49:50 to prepare a raw material powder. The same apparatus as in Example 4 for producing the single crystal fiber was used. Around 50 g of the material powder were fed in the melting crucible 20 and the melting crucible 20 was set at a desired position in the furnace. The temperature in the space 10 of the upper furnace 2 was adjusted to a temperature of 1,250–1,350° C. to melt the raw material in the melting crucible 20. The temperature in the space 18 of the lower furnace 3 was uniformly controlled to a temperature of 500–1,200° C. A desired electric power was fed to the crucible 20, the nozzle portion 89 and the after-heater 66 to grow the single crystal.

At that time, the single crystal growing section was controlled to a temperature of 1,200–1,300° C. and to a temperature gradient of 10–150° C./mm. At this state, the single crystal fiber was pulled downwardly at a pulling rate of 20 mm/hr to find out that a good $Nd—LiNbO_3$ single crystal fiber can be drawn down.

The thus grown single crystal fiber having a longitudinal and lateral size of 1 mm×1 mm and a length of 100 mm was elementary analyzed by EPMA with respect to the composition distribution viewed in the length direction (grown direction). As a result, it was found that, the proportion of neodymium in the composition of the single crystal fiber could be controlled to 1.0 mol % with an error of not more than ±2% which is a high precision within a detectable limit. From, Nd laser oscillation experiment, a three times or more of the output and a sharp wavelength property as compared with a sample prepared by a CZ method were obtained.

EXAMPLE 8

Using the single crystal producing apparatus shown in FIGS. 22 and 23, a KLN single crystal fiber was produced according to the aforedescribed method. Potassium carbonate, lithium carbonate and niobium oxide were reciped in a mol ratio of 30:20:50 to prepare a raw material powder. Around 50 g of the raw material powder were charged in a melting crucible 101 made of platinum and the melting crucible 101 was set at a desired position in the furnace. The temperatures in the melting furnace 99 was controlled by the heating devices 109A, 109B and 109C and the temperature in the growing furnace 100 side was controlled by a heating device 108. The temperature gradient in the vicinity of the single crystal growing section was controlled by the supply of electric power to a nozzle portion 104 and heat-generation of the after-heater. The single crystal fiber moving mechanism could pull down the single crystal fiber at a controlled uniform drawing rate of 2–100 mm/hr in the vertical direction.

The temperature in the melting furnace was controlled to a temperature of 1,100–1,200° C. to melt the raw material in the crucible. The temperature in the growing furnace 100 was uniformly controlled to a temperature of 500–1,000° C. The crucible 101, the nozzle portion 104 and the after-heater 107 were respectively supplied with a desired electric power to optimize the temperature thereof for performing the growth of the single crystal. At that time, the single crystal growing section 26 could be controlled to a temperature of 1,050–1,150° C. and a temperature gradient of 10–150° C./mm.

The nozzle portion 104 had outer and inner cross-sections of circular shapes, an outer diameter of 1 mm, an inner diameter of 0.8 mm and a length of around 50 mm. The nozzle portion 104 was extended in the horizontal direction from around the middle portion between the surface level 21*a* of the melt in the crucible 101 and the bottom surface 102. The crucible 101 had a circular shape in plan view, a diameter of 30 mm and a height of 30 mm. At this state, the single crystal fiber was pulled downwardly at a pulling rate of 20 mm/hr in the a axial direction to find out that a good KLN single crystal fiber can be pulled down. In the same manner, the single crystal fiber can be pulled down in the c axial direction.

The thus grown single crystal fiber having a longitudinal and lateral size of 1 mm×1 mm and a length of 100 mm was examined with respect to the composition distribution viewed in the length direction (grown direction) in the same manner as in Example 4. The result of the measurement shows that the wavelength was controlled within not more than 1 nm. So, the composition of the single crystal fiber could be controlled with a high precision of not more than 0.01 mol % of composition, which is a high precision never attained before as a KLN single crystal. The wavelength conversion efficiency of the KLN single crystal fiber was substantially the same with the theoretical value with an error of not more than ±2% which is within the range of measuremental error.

EXAMPLE 9

In the same manner as in Example 8, a KLN single crystal fiber was grown except that a raw material feeding mechanism was used in the furnace, which intermittently feeds the raw material in the melting crucible. Also, a cutting mechanism was arranged below the furnace, which intermittently cuts the single crystal fiber to a desired length to continuously grow the single crystal fiber.

With the progress of the growing of the single crystal fiber, the amount of the melt in the crucible was decreased. Here, the raw material powder was fed in the melting crucible such that the liquid surface of the melt exists at a level about 0.5±0.1 mm higher than the distal end of the nozzle portion. In this way, a single crystal fiber of a length of 10 m was continuously formed and the variation in the composition was measured in the same manner as in Example 4. As a result, the variation in the composition of the single crystal fiber could be controlled to not more than 0.01 mol % over the entire length of around 10 m.

EXAMPLE 10

The growing of the single crystal was performed in the same manner as in Example 5 using the nozzle portion shown in FIG. 24 to succeed in pulling down a KLN single crystal plate of a thickness of 1 mm and a width of 30 mm. The diameter expanded portion 94 was made of a platinum plate of a height of 3 mm, a width of 30 mm and a thickness of 1 mm. The passages 94b had respectively a width of 0.5 mm and a spacing of 3 mm.

With the progress of the growing of the single crystal plate, the amount of the melt in the crucible was decreased. Here, the raw material powder was fed in the melting crucible such that the liquid surface of the melt exists at a level about 2.0±0.1 mm higher than the distal end of the nozzle portion. The SHG phase matched wavelength and the conversion efficiency were measured to obtain the same values as those of the single crystal fiber.

EXAMPLE 11

The present invention was applied to a method of growing a single crystal of a solid solution of neodymium substituted $LiNbO_3$ in the same manner as in Example 8. Neodymium oxide, lithium carbonate and niobium oxide were reciped in a mol ratio of 1:49:50 to prepare a raw material powder. Around 50 g of the raw material powder were charged in a melting crucible 101 made of platinum. The temperature in the melting furnace was controlled to a temperature of 1,250–1,350° C. to melt the raw material in the crucible 101. The temperature in the growing furnace 100 was uniformly controlled to a temperature of 500–1,200° C. Desired electric powers were supplied to the melting crucible 101, the nozzle portion 104 and the after-heater 107 to optimize the temperature gradient at the respective portion to perform the growth of the single crystal. At that time, the single crystal growth section could control to a temperature of 1,200–1,300° C. and a temperature gradient of 10–50° C./mm.

At this state, the single crystal fiber was pulled downwardly at a pulling rate of 20 mm/hr to find out that a good single crystal fiber could be pulled down.

The thus grown single crystal fiber having a longitudinal and lateral size of 1 mm×1 mm and a length of 100 mm was elementary analyzed by EPMA with respect to the composition distribution of the single crystal fiber viewed in the length direction (grown direction). As a result, it was found out that, the proportion of neodymium in the composition of the single crystal fiber could be controlled to 1.0 mol % with an error of not more than ±2% which is a high precision within a detectable limit. From Nd laser oscillation experiment, a three times or more of the output and a sharp wavelength property as compared with a sample prepared by a CZ method were obtained.

COMPARATIVE EXAMPLE 1

Using a conventional growth apparatus, a KLN single crystal fiber as same that of Example 4 was produced. The amount of the raw material powder charged in the melting crucible was 50 mg. The melting crucible was made of platinum. The temperature in the space 10 of the upper furnace 2 was adjusted to a temperature of 1,100–1,200° C. to melt the raw material powder in the crucible. The temperature in the space 18 of the lower furnace 3 was uniformly controlled to a temperature of 500–1,000° C. Desired electric power was supplied to the melting crucible in an effort of controlling the growth and pulling down the single crystal from the intake hole or drawing hole. At this state, the single crystal fiber was drawn at a drawing rate of 20 mm/hr to obtain a KLN single crystal fiber.

The thus grown single crystal fiber having a longitudinal and lateral size of 1 mm×1 mm and a length of 100 mm was examined with respect to the composition distribution viewed in the length direction (grown direction) in the same manner as in Example 4. As a result, the SHG phase matched wavelength had a variation of 50 nm in the wavelength which corresponds to a high variation of exceeding 1.0 mol % in the composition when calculated by conversion which is a practically unacceptable level.

COMPARATIVE EXAMPLE 2

In Comparative Experiment 1, the raw material powder was periodically supplied to the melting crucible in an amount corresponding to the amounts of the components drawn and evaporated from the melting crucible in an effort of continuously growing the single crystal fiber. However, once the raw material powder was supplied to the melting crucible, the thermal equilibrium state in the melting crucible was largely unbalanced, so that the continuous growing of the single crystal fiber became impossible.

COMPARATIVE EXAMPLE 3

In Comparative Experiment 1, a crucible of a larger size was used and the amount of the raw material powder initially charged in the crucible was increased to 5 g. The temperatures in the whole furnace were controlled by the upper furnace and the lower furnace, and electric power was supplied to the crucible to control the growth and the pulling down of the single crystal from the drawing hole.

However, though a larger electric power had to be supplied to the crucible to improve the melting of the raw material powder in the crucible if the temperature in the upper furnace was adjusted to a low temperature of 500–900° C., the larger output of the electric power resulted in non-crystallization of the melt. Meanwhile, if a smaller electric power was supplied to the crucible, the melt was solidified before the drawing thereof from the drawing hole. Thus, a condition for pulling down the single crystal could not be found.

In the meantime, if the upper furnace was controlled to a temperature of not less than 900° C., the temperature gradient necessary for the crystallization could not be retained in the vicinity of the drawing hole which is the crystal growing point by the radiant heat from the furnace body, so that the pulling of the single crystal fiber downwardly was impossible also in this case.

Hereinafter, embodiments of the third aspect of the present invention will be explained in more detail with reference to the drawings.

Figure 27A:
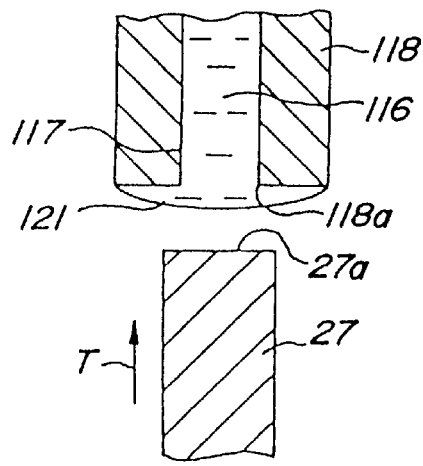
Figure 27B:
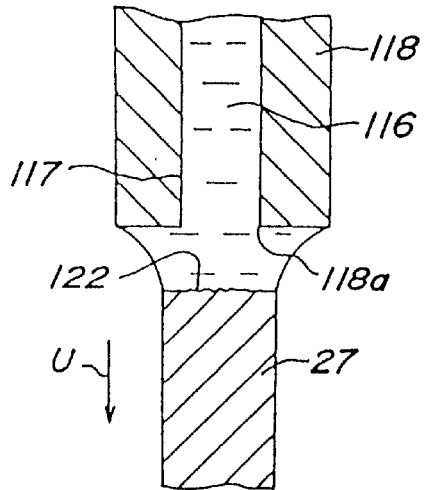

FIG. 25 is a schematic cross-sectional view of the producing apparatus for growing a single crystal. FIG. 26 is an enlarged schematic cross-sectional view of the single crystal growing furnace. FIGS. 27(a) and 27(b) are schematic cross-sectional views of the single crystal growing section.

A melting crucible 112 is disposed in the interior of the furnace body. The upper furnace 2 is arranged to enclose the crucible 112 and its upper space 10. The upper furnace 2 has a heater 4A embedded therein. A nozzle portion 113 extends downwardly from the lower end of the crucible 112 and an opening 113a is provided at the lower end of the nozzle portion. A crucible 115 for growing the single crystal is disposed at immediate below an opening 113a of the nozzle portion 113. A single crystal growing crucible 115 is disposed at the neighbourhood of the boundary portion between the upper furnace 2 and the lower furnace 3. The lower furnace 3 is arranged to enclose the single crystal fiber drawing portion and its surrounding space 18. The lower furnace 3 has a heater 4B embedded therein. Of course, such an arrangement of the heating furnace may be changed variously.

The melting crucible 112, the nozzle portion 113 and the single crystal growing crucible 115 are respectively made of a corrosion-resistant electrically conductive material. An electrode of the electric power source 22A is connected to a portion O of the melting crucible 112 through a leading wire and the other electrode of the power source 22A is connected to a portion P of the melting crucible 112. An electrode of the electric power source 22B is connected to the upper end T of the nozzle portion 113 and the other electrode of the power source 22B is connected to the lower end Q of the nozzle portion 113.

Similarly, an electrode of the electric power source 22C is connected to an end portion R of the single crystal growing crucible 115 through a leading wire and the other electrode of the power source 22C is connected to a portion S of the single crystal growing crucible 115. These electric power supplying mechanisms are separated from each other and constructed to control its voltage independently. The after-heater 66 is arranged below the single crystal growing crucible 115 in the space 18.

In case if the temperature gradient of the nozzle portion is already optimized by the furnace body (the heat-generating member and the refractive material), the after-heater 66 is not indispensable and may be omitted.

The temperature distributions in the spaces 10, 18 are suitably determined by the heat-generation of the upper furnace 2 and the lower furnace 3, the raw material for the melt is fed in the melting crucible 112, and electric power is supplied to the melting crucible 112, the nozzle portion 113 and the single crystal growing crucible 115 to heat generate them respectively thereby to melt the raw material in the melting crucible 112 to form a melt 21. The melt 21 is flowed down through the passage 114 in the nozzle portion 113, while retaining its melted state by means of the heat-generation of the nozzle portion 113 and the after-heater 66.

The melt is flowed in the single crystal growing crucible 115 from the opening 113a. The melt 116 is stayed in the single crystal growing crucible 115.

Alternatively, the melt flowed from the opening 113a may be solidified at immediate below the opening 113a to assume a polycrystalline body, and the fiber or plate made of the polycrystalline body may be continuously fed in the single crystal growing crucible 115 in which the fiber or plate may be melted.

At the stage before starting the pulling down of the single crystal fiber, the melt 116 is slightly protruded from the opening 118a at the single crystal growing section 117 existing at the end portion of the nozzle portion 113 and retained by its surface tension to form a relatively flat surface 121.

Different from the melting crucible 112 which performs the melting of the raw material, the single crystal growing crucible 115 does not perform the melting of the raw material and is smaller in size than the melting crucible 112. In the small crucible 115, the melt 116 is drawn by the surface tension along the shape of the vertical inner side wall 115a and the bottom surface 115b to assume an inwardly recessed liquidus surface 120. Therefore, the gravity acting on the melt 116 in the nozzle portion 118 is largely decreased by the contact of the melt to the inner wall surfaces 115a and 115b of the single crystal growing crucible 115.

At this state, the seed crystal 27 is moved upwardly as shown by the arrow T to contact its upper end surface 27a with the lower surface 121 of the melt 116. At that time, a uniform meniscus 122 is formed between the upper end of the seed crystal 27 and the lower end of the melt 116 drawn downwardly from the opening 118a of the nozzle portion 118.

As a result, a single crystal fiber 12 is continuously formed on the seed crystal 27 and pulled downwardly. In this embodiment, the seed crystal 27 and the single crystal fiber 12 are pulled down by the rollers 67.

Meanwhile, in case if the amount of the material powder supplied to the crucible is increased according to a conventional method, an expanded portion of the melt is formed downwardly from the opening 118a of the crucible. Moreover, if the weight of the material powder is large, the melt is flowed when the material powder is melt, and a good meniscus cannot be formed when the end surface 27a of the seed crystal 27 is contacted with the melt.

FIG. 28 is a schematic cross-sectional view of another embodiment of the producing apparatus for growing the single crystal showing the shape of the crucibles. In FIG. 28 the same functional members are allotted with the same reference numerals as those of FIG. 25 and the same explanations are used.

The nozzle portion 113 extends downwardly from the lower end of the melting crucible 112 and has the opening 113a at the lower end. The melt or its solidified body is continuously fed from the opening 113a to the single crystal growing crucible 115.

The melting crucible 112 and the nozzle portion 113 are respectively made of a corrosion resistant material. The electrodes of the electric power source 22A are connected to the upper end portion O and the lower bent portion P. A circular heat-generating member 114 is arranged around the nozzle portion 113. An electrode of the electric power source 22B is connected to the upper end portion T of the heat-generating member 114 and the other electrode of the electric power source 22B is connected to the lower end Q of the heat-generating member 114. These electric power supplying mechanisms are separated from each other and constructed to control its voltage independently.

A radio frequency induction heating mechanism not shown may be provided around the nozzle portion 113 to heat the same thereby to control the supply of the melt.

In the above described embodiments, a circular shaped nozzle portion was used as the nozzle portion of the melting crucible as well as as the nozzle portion of the single crystal growing crucible. However, such a circular shaped nozzle portion is generally much expensive in processing. For example, the nozzle portion having a small inner diameter is difficult to produce by processing a material made of a noble metal, such as, platinum.

Therefore, the inventors produced the nozzle portion by forming a groove in a corrosion-resistant member made of a corrosion-resistant metal or a corrosion-resistant ceramics, and adhering or joining the grooved member to the other corrosion-resistant member. In such a nozzle portion, the groove serves as the elongated minute diameter passage for the melt. The grooved member should have a flat surface on the side in which the groove is formed, and is preferably a flat plate shaped.

At that time, the passage for the melt may be prepared by forming the groove in both the flat plates and integrally uniting the grooves when adhering the flat plates. Alternatively, the passage may be prepared by forming the groove in one flat plate, while leaving the other flat plate as it is, and adhering the two flat plates to obtain the passage formed by the groove in the flat plate. The nozzle portion prepared in this way can be used for the crucible for melting the raw material as well as for the single crystal growing crucible.

In addition, in using the single crystal growing crucible the inventors could produce a single crystal plate by forming a plurality of grooves in parallel to each other in the nozzle portion thereby to form the passages for the melt, and drawing the melt from the passages.

If the nozzle portion is used for the single crystal growing crucible, preferably the grooves have respectively a width of 0.01–0.5 mm, and a spacing of 0.1–10 mm. The grooves may have a square, a rectangular, V-shape or a half circular shape.

Figure 29A:
Figure 29B:
Figure 29C:
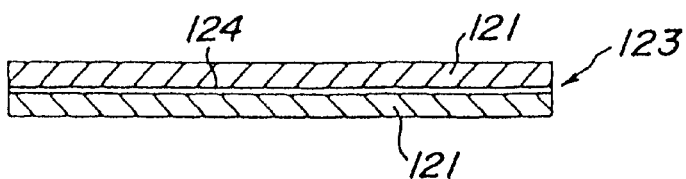

Concretely explaining, an elongated flat plate 121 is prepared as shown in FIG. 29(a), and an elongated groove 122 is formed longitudinally in a flat plate 121 as shown in FIG. 29(b). The same work is effected using another flat plate 121. The two flat plates 121 are adhered facing the grooves 122 to each other to prepare a nozzle portion 123 as well as passages 124 in the nozzle portion 123 as shown in FIG. 29(c).

Figure 29D:
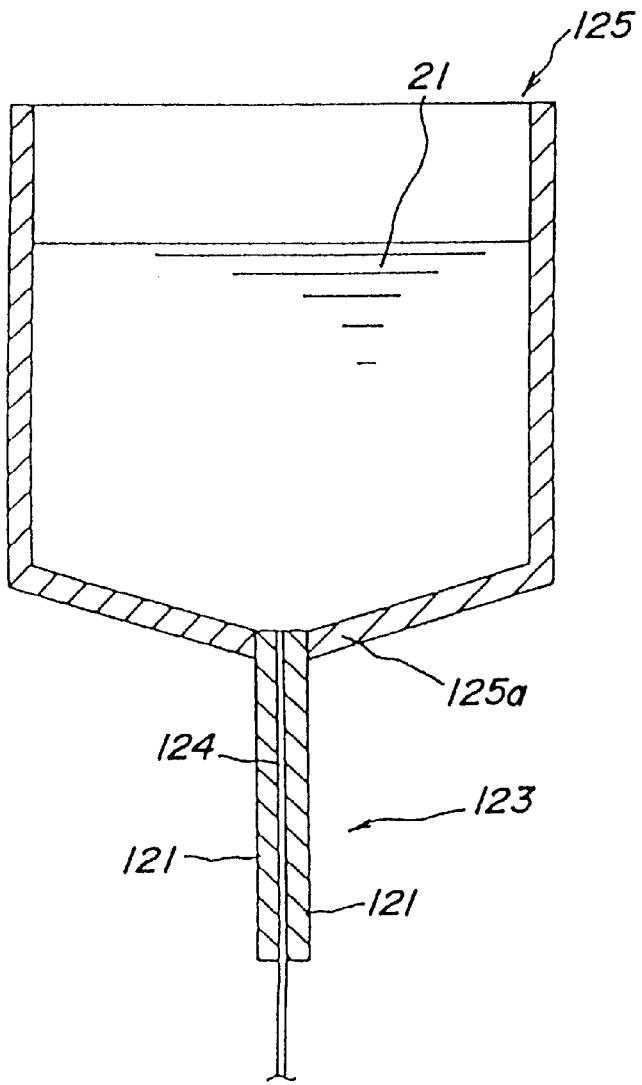

The nozzle portion 123 is joined to the bottom 125a of the crucible 125 and the melt is flowed down in the passages 124 as shown in FIG. 29(d). If such a means is used, the nozzle portion for forming the single crystal fiber can easily be prepared. The crucible having such a nozzle portion may be used as the melting crucible as well as as the single crystal growing crucible.

Figure 30A:
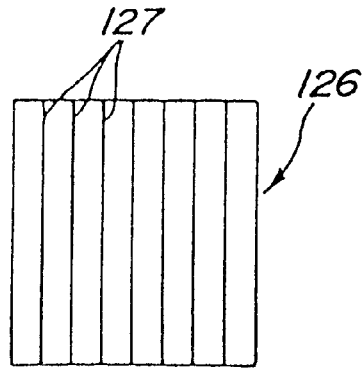
Figure 30B:
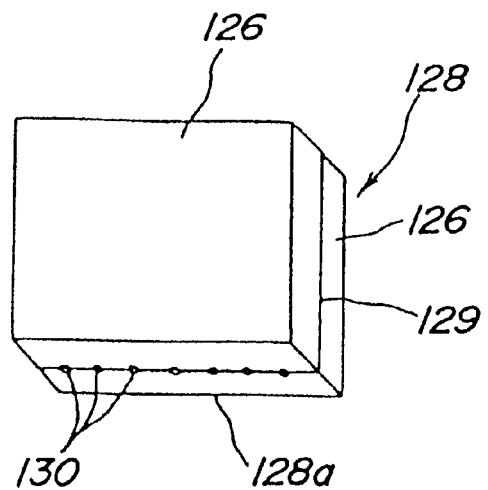

Next, concrete shapes of the nozzle portion for producing the single crystal plate will be explained with reference to preferred embodiments. A plurality of elongated grooves 127 in parallel to each other are formed in a flat plate 126 as shown in FIG. 30(a). The same work is effected using another flat plate 126. The two flat plates 126 are adhered facing the grooves 127 to each other to prepare a flat shaped nozzle portion 128 as well as a plurality of passages 130 in the nozzle portion 128 as shown in FIG. 30(b). The reference numeral 129 denotes a joint.

Figure 30C:
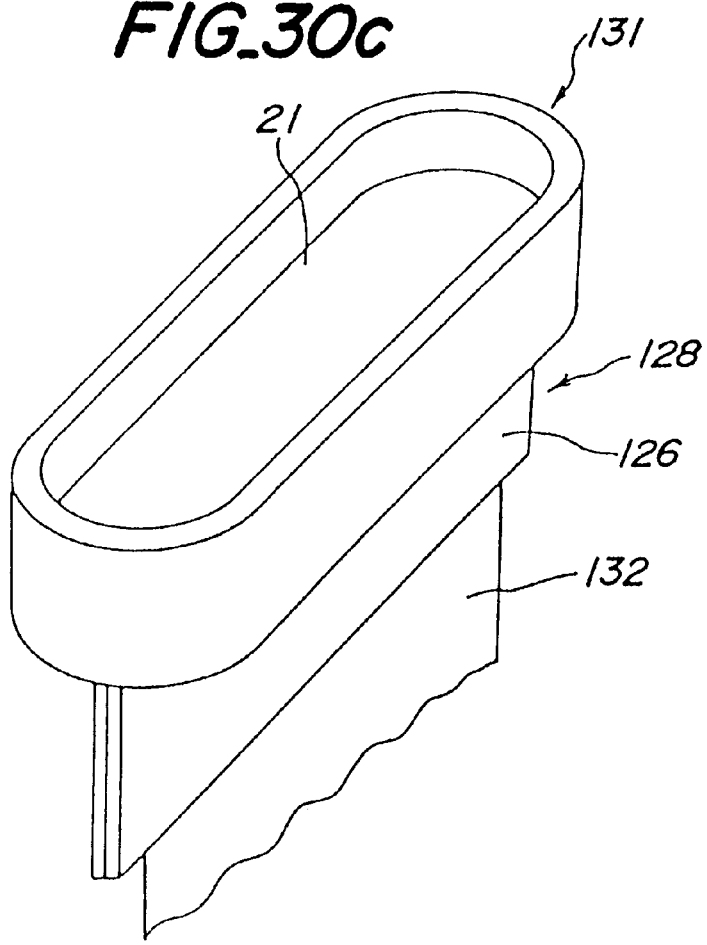

The nozzle portion 128 is joined to the bottom of a rectangular melting crucible 131 as shown in FIG. 30(c). The melt 21 in a crucible 131 flows down in the respective passage 130 of the nozzle portion 128 to flow out from the lower end of the respective passage 130. At that time, the melt flowed out from the lower end of the respective passage 130 becomes integral and flowed on the bottom plate 128a of the nozzle portion 128, and the integral flow of a shape of a plate 132 made of the melt or the polycrystalline is fed to the single crystal growing crucible.

In the embodiment shown in FIG. 31, a plurality of tubular members 134 are used as the respective nozzle portion and arranged such that their outer circumferential surfaces continue from each other. Though the crucible portions were omitted in FIG. 31, a crucible, such as, the crucible 131 as shown in FIG. 30(c) may be used. The tubular members 134 have therein respectively a passage 133 for the melt and has an opening at the lower bottom end surface 134a thereof.

The melt in the crucible flows down in the respective passage 133 of the respective tubular nozzle portions 134 and flowed out therefrom. At that time, the melt flowed from the respective passage 133 is made integral and flowed on the bottom end surface 134a of the nozzle portions 134 to become a flat plate 132 and fed to the single crystal growing crucible.

A nozzle portions of the same shape but shorter length could be used as the nozzle portion of the lower single crystal growing crucible to stably produce a single crystal plate similarly as in the case of the above described single crystal fiber.

Hereinafter, the present invention will be explained with reference to more concrete experimental results.

EXAMPLE 12

Using the single crystal producing apparatus shown in FIG. 25, a KLN single crystal fiber was produced according to the present invention. The temperatures in the whole furnace were controlled by means of the upper furnace 2 and the lower furnace 3. The temperature gradient in the neighbourhood of the single crystal growing section was controlled by the supply of electric power to the single crystal growing crucible 115 and heat-generation of the after-heater 66. For pulling down the single crystal fiber a mechanism was used which pulls the single crystal fiber downwardly at a controlled uniform pulling rate in a range of 2–100 mm/hr in the vertical direction.

Potassium carbonate, lithium carbonate and niobium oxide were reciped in a mol ratio of 30:20:50 to prepare a raw material powder. Around 50 g of the material powder were fed in the melting crucible 122 made of platinum and the melting crucible 122 was set at a desired position in the furnace. The nozzle portion 113 had outer and inner cross-sections of circular shapes and an outer diameter of 1 mm, an inner diameter of 0.3 mm and a length of 20 mm. The melting crucible had a circular shape in plan view and a diameter of 30 mm and a height of 30 mm. The single crystal growing crucible had a size capable of containing 1 g of the raw material. A tube of an outer diameter of 1.2 mm, an inner diameter of 0.8 mm and a length of 2 mm were used for the nozzle portion.

The temperature in the space 10 of the upper furnace 2 was adjusted to a temperature of 1,100–1,200° C. to melt the raw material in the crucible 112. The temperature in the space 18 of the lower furnace 3 was uniformly controlled to a temperature of 500–1,000° C. Desired electric powers were supplied to the melting crucible and the nozzle portion to control the supply of the melt to the single crystal growing crucible 115. Electric power was controlledly supplied to the after-heater 66 and the single crystal growing furnace. As a result, the single crystal growing section could be controlled to a temperature of 1,050–1,150° C. and to a temperature gradient of 10–150° C./mm.

At this state, the single crystal fiber was pulled downwardly at a pulling rate of 20 mm/hr to find out that a good KLN single crystal fiber could be drawn down.

The thus grown single crystal fiber having a longitudinal and lateral size of 1 mm×1 mm and a length of 100 mm was examined with respect to the composition distribution of the single crystal fiber viewed in the length direction (grown direction). Concretely explaining, the single crystal fiber was irradiated at various portions in the longitudinal direction by a light beam, and the wavelength of the light beam emitted therefrom was measured to detect an SHG phase matched wavelength. If there is even a slight variation in the composition of the KLN single crystal fiber, the SHG phase matched wavelength of the emitted light beam is varied by the variation in the composition.

The result of the measurement shows that the wavelength was controlled within not more than 1 nm. So, the composition of the single crystal fiber could be controlled with a high precision of not more than 0.01 mol % of composition, which is a high precision never attained before as a KLN single crystal. The wavelength conversion efficiency of the KLN single crystal fiber was substantially the same with the theoretical value with an error of not more than ±2% which is within the range of measuremental error.

EXAMPLE 13

In the same manner as in Example 12, a KLN single crystal fiber was grown except that a raw material feeding mechanism was used in the furnace, which intermittently feeds the raw material in the melting crucible 112. Also, a cutting mechanism was arranged below the furnace, which intermittently cuts the single crystal fiber to a desired length to continuously grow the single crystal fiber. With the progress of the single crystal fiber, the raw material powder was periodically fed in the melting crucible in an amount corresponding to the amounts of the components pulled down out and evaporated from the melting crucible. In this way, a single crystal fiber of a length of around 10 m was continuously formed and the variation in the composition thereof was measured in that same manner as in Example 12. As a result, the variation in the composition of the single crystal fiber could be controlled within not more than 0.01 mol % over the entire length of around 10 m.

EXAMPLE 14

The nozzle portion 128 and the crucible 131 as shown in FIG. 30 were used to succeed in pulling down a KLN single crystal plate of a thickness of 1 mm and a width of 30 mm. However, a platinum plate of a size of 30 mm×30 mm×0.6 mm was used as the plate 126. Grooves 127 each having a width of 0.1 mm were formed with a spacing of 5 mm in the platinum plate 126 by mechanical cutting using a dicing machine. A plate shaped nozzle portion of a thickness of 1.2 mm was prepared by joining two sheets of the platinum plate. Parallely arranged tubular nozzles as shown in FIG. 31 consisting of 30 tubes of an outer diameter of 1 mm and an inner diameter of 0.6 mm and a length of 2 mm parallely arranged in a row were used as the nozzle portion of the single crystal growing crucible. The melt was flowed from the passages of the melt as explained above with reference to FIGS. 30(a) and (c). The SHG phase matched wavelength and the wavelength conversion efficiency in the interior of the single crystal plate were measured to obtain the same values as in the case of the above described single crystal fiber.

EXAMPLE 15

The present invention was applied to a method of growing a single crystal of neodymium substituted in $LiNbO_3$. However, the amount of substituted neodymium in this system was around 0.3 mol %, if a method, for example, a CZ method was used.

Neodymium oxide, lithium carbonate and niobium oxide were reciped in a mol ratio of 1:49:50 to prepare a raw material powder. The same apparatus as in Example 12 for producing a single crystal fiber was used. Around 50 g of the material powder were fed in the melting crucible 112 and the melting crucible 112 was set at a desired position in the furnace. The temperature in the space 10 of the upper furnace 2 was adjusted to a temperature of 1,250–1,350° C. to melt the raw material in the melting crucible 112. The temperature in the space 18 of the lower furnace 3 was uniformly controlled to a temperature of 500–1,200° C. The temperature gradient in the neighbourhood of the single crystal growing section was controlled by the supply of electric power to the nozzle portion 113, the single crystal growing furnace 115 and the heat-generation of the after-heater 66.

At that time, the single crystal growing section was controlled to a temperature of 1,200–1,300° C. and to a temperature gradient of 10–150° C./mm. At this state, the single crystal fiber was pulled downwardly at a pulling rate of 20 mm/hr to find out that a good KLN single crystal fiber could be pulled down.

The thus grown single crystal fiber having a longitudinal and lateral size of 1 mm×1 mm and a length of 100 mm was elementary analyzed by RPMA with respect to the composition distribution of the single crystal fiber viewed in the length direction (grown direction). As a result, it was found that, the proportion of neodymium in the composition of the single crystal fiber could be controlled to 1.0 mol % with an error of not more than ±2% which is a high precision within a detectable extent.

Also, the comparative experiments 1, 2 and 3 same as described above were repeated.

Hereinafter, embodiments of the fourth aspect of the present invention will be explained.

In the fourth aspect of the present invention, more preferably a laser beam is irradiated to an oxide series single crystal having the effect of second harmonic generation and detected the SEG wave generation. As such an oxide series single crystal, use may be made of publicly known oxide series single crystals. Particularly preferable are those, such as, KLN, KLTN, or KN, etc., which generates a blue light beam by SHG or those, such as, CLBO, BBO, LBO, etc., which generates a ultra violet ray. Of course, the present invention is applicable to a more higher degree of wavelength conversion, such as, a third harmonic wave, or a fourth harmonic wave.

If the laser beam irradiated to the oxide series single crystal has a range of wavelength including a wavelength corresponding to the purposed composition, the emitted light beam from the oxide series single crystal may be analyzed by a spectrum analyzer to detect the respective intensity of the respective wavelength in the desired range of wavelength.

Concretely explaining, assuming that the light beam corresponding to the purposed composition has a wavelength $\lambda 0$ and the laser beam has light beams of wavelengths between $\lambda 1$ and $\lambda 2$ in FIG. 32, the intensities of the laser beams between the wavelengths $\lambda 1$ and $\lambda 2$ are detected by a spectrum analyzer. If the oxide series single crystal pulled down from the drawing hole of the crucible has a desired composition, the laser beam has a maximum value V at the wavelength $\lambda 0$. However, with the progress of the production, the thermal state of the oxide series single crystal at the drawing hole and the effect of gravity, etc., are a little changed, and the peak wavelength $\lambda 0$ is shifted little towards the wavelength direction of $\lambda 1$ or $\lambda 2$. Accompanying to such a shifting, the whole of the curve W is shifted little to the direction of the arrow Y or the arrow H in the graph.

Therefore, at the stage of pulling down the oxide series single crystal, if the composition of the single crystal is varied then the peak wavelength of the emitted light beam may be varied. So, the change of the peak wavelength may be detected immediately and feed backed to the raw material feeding device.

If the light beam receiving device can not detect the distribution of the wavelength components as a photodiode, the intensity of the emitted light beam of the respective wavelength can not be detected directly. Therefore, a preferable monitoring method in such a case will be explained with reference to FIG. 33.

The wavelength of the emitted light beam corresponding to the purposed composition is assumed as $\lambda 0$. If the composition of the oxide series single crystal pulled down from the drawing hole of the crucible meets the purposed composition, the intensity of the laser beam has the maximum value V at the wavelength $\lambda 0$. With the progress of the production, the peak wavelength $\lambda 0$ is shifted little to $\lambda 4$ or $\lambda 5$ as described above. Accompanying to such a shifting, the curve W is displaced little to the direction of right or left to become the curve Z or the curve S.

However, the shifting of the maximum value is little, and moreover the shape of the whole curve has usually a very small inclination at around the maximum value. Therefore, it has been found out that, if the maximum value of the curve is displaced little, the variation of the emitted light beam at the peak wavelength $\lambda 0$ becomes further small, so that the detection of the variation in the composition is practically impossible.

Thus, the oxide series single crystal was irradiated by a first laser beam having a wavelength $2\lambda 7$ larger than a wavelength $2\lambda 0$ and a second laser beam having a wavelength $2\lambda 6$ smaller than a wavelength $2\lambda 0$, and the intensity of the respective emitted light beam corresponding to these first and second laser beams were measured by a light beam receiving device.

As a result, if the composition of the oxide series single crystal pulled down from the drawing hole of the crucible meets the purposed composition, the emitted light beam has an intensity po at the wavelength $\lambda 6$ and an intensity $q_0$ at the wavelength $\lambda 7$. With the progress of the production, if the peak value $\lambda 0$ is shifted to the direction of $\lambda 5$, the curve W is displaced to the right to become a curve Z. At this time, the emitted light beam has a decreased intensity $p_1$ at the wavelength $\lambda 6$ which is a smaller value than $p_0$. Meanwhile, the emitted light beam has an increased intensity $q_1$ at the wavelength $\lambda 7$ which is a larger value than $q_0$. In contrast, if the peak value $\lambda 0$ is displaced to the direction of $\lambda 4$, the curve W is displaced to the left to become a curve S. At this time, the emitted light beam has a increased intensity $p_2$ at the wavelength $\lambda 6$ which is a larger value than $p_0$. Meanwhile, the emitted light beam has an decreased intensity $q_2$ at the wavelength $\lambda 7$ which is a smaller value than $q_0$.

In this way, the increasement and the decreasement of the intensity occurs as a pair at the both wavelength sides of the curve, so that an extremely good sensibility against a variation in the composition can be obtained. Moreover, if the emitted light beams are measured at selected wavelengths which are outside of the peak wavelengths $\lambda 0$, $\lambda 4$ and $\lambda 5$ while avoiding the peak wavelengths $\lambda 0$, $\lambda 4$ and $\lambda 5$, the relatively large inclined portions of the curve can be utilized, so that a particularly sharp sensibility can be obtained also from this point of aspect.

In the aforedescribed method, the first and second laser beams may simultaneously be used to irradiate the single crystal. Alternatively, a laser device capable of varying the wavelength may be used to sequentially irradiate the single crystal two times using laser beams of two types of wavelength.

In the present invention, preferably the size of the cross-section of the oxide series single crystal is measured by an optical sensor. In growing the single crystal, the shape of the cross-section is usually controlled to a constant and the precision of the control can be improved by measuring the size precisely and cancelling the variation in the light beams-permeating thickness.

Next, preferable embodiments of the present invention will be explained in more detail. The inventors have made researches on using enlarged crucibles in an effort of establishing a mass production technique by pulling down process of pulling down the oxide series single crystal and tried in this process to use an enlarged crucible having a nozzle portion extending downwardly from the crucible and a single crystal growing section arranged at the lower end of the nozzle portion to control the temperatures of the crucible and the single crystal growing section independently from each other.

As a result, the inventors have found out that the oxide'series single crystal could easily be drawn down continuously even when a large amount of the raw material powder of more than 5 g was melted in the melting crucible of an enlarged capacity meeting the increased amount of the raw material powder.

A reason why such a function and effect were obtained is presumed that the single crystal growing section became difficult to directly receive the influence of the heat generated by the melt in the crucible by the provision of the single crystal growing section at the lower end of the nozzle portion, and simultaneously that the temperature gradient at the neighborhood of the single crystal growing section could be made large by separately controlling the temperature of the crucible and the temperature of the single crystal growing section and or the nozzle portion.

Moreover, the inventors have found out that, according to this method, the variations in the composition of the KLN single crystal fiber could be reduced to a surprisingly high precision of not more than 0.01 mol %, even when the amount of the raw material powder melted in the crucible was increased to an amount of around 30–50 g. Therefore, the oxide series single crystal of such an extremely high precision can be mass produced by combining the producing method and the present invention.

In addition, the inventors have made researches on the state of the melt in the single crystal growing section and the physical properties of the single crystal. As a result, the inventors have found out that a good oxide series single crystal of a very few variation in the composition could be pulled down continuously in case when the surface tension is dominant than the gravity in the environment of the single crystal growing section. This is considered presumably due to a reason that a good meniscus was formed thereby.

In this way, in order to create a condition that the surface tension is more dominant than the gravity in the single crystal growing section, the provision of a mechanism in the crucible of decreasing the gravity acting on the melt in the nozzle portion is effective. The inventors have made researches on such a mechanism to find out that, by decreasing the inner diameter of the nozzle portion to not more than 0.5 mm, the condition that the surface tension is dominant than the gravity acting on the melt can be created in the nozzle portion to form a uniform meniscus at the distal end opening of the nozzle portion.

However, if the inner diameter of the nozzle portion is less than 0.01 mm, the growing speed of the single crystal becomes too slow, so that the inner diameter is preferably not less than 0.01 mm from the view point of mass production. An optimum inner diameter of the nozzle portion is in a range of 0.01–0.5 mm and varies a little depending on the viscosity, the surface tension and the specific gravity of the melt, and the growing speed of the single crystal, etc.

In addition, the inventors have made researches on this point to obtain the following finding. That is, in the conventional $\mu$ pulling down process presumably the single crystal fiber could have been pulled down continuously by virtue of the small scale of the crucible, and this is presumably because the amount of the melt in the crucible was small and the melt adhered on the inner wall of the crucible by its surface tension to relatively reduce the gravity acting on the drawing hole so that a meniscus which is uniform to a certain extent could be formed. However, when a crucible of an enlarged size was used, such condition that the surface tension was dominant at around the drawing hole was lost.

Moreover, in this method, the temperature gradient viewed in the longitudinal direction of the nozzle portion can easily be made large at the neighbourhood of the single crystal growing section thereby to quench the melt flowed down in the nozzle portion.

Therefore, the method is particularly suitable for producing the single crystal of a solid solution state. The single crystal of a solid solution state has a property that the proportion of its composition is varied in an egiliblium condition. When the conventional $\mu$ pulling down process was used for producing the single crystal of a solid solution state, the melt was in the eqiliblium condition at the drawing hole, so that the composition of the solid solution could have been varied by a slight change of the temperature and the speed of the solidification due to such a property. In contrast, according to the present method and apparatus, the quenching of the single crystal of a solid solution is possible at the neighbourhood of the single crystal growing section, so that the composition of the melt can be retained.

Illustrative examples of such an oxide series single crystal of a solid solution state are, for example, Mn—Zn ferrite, tungsten bronze structures around $Ba_{1-x}Sr_xNb_2O_6$, KLN, KLTN[$K_3Li_{2-2x}(Ta_yNb_{1-y})_{5+x}$]$O_{15+x}$, etc.

When the raw material powder is supplied to the crucible, the thermal state in the crucible is varied due to the heat of solution of the raw material thereby to cause variations in the composition of the single crystal to occur. However, if the nozzle portion is provided below the crucible as described above, the raw material can be supplied to the crucible continuously or intermittently. This is because, if the aforedescribed thermal variation is occurred in the crucible, it affects few thermal influence over the single crystal growing section, and the single crystal growing section is not in an equilibrium state but in a kinetic theory state so that the single crystal growing section is further not affected by the influence of the thermal variations.

In the present invention, heating method of the crucible is not particularly limited. However, the heating furnace is preferably arranged to surround the single crystal growing device. At that time, preferably the heating furnace is divided into an upper furnace and a lower furnace, the crucible is surrounded by the upper furnace and the upper furnace is heat-generated to a relatively high temperature to assist the melting of the material powder in the crucible. Meanwhile, preferably the lower furnace is arranged around the nozzle portion and heated to a relatively lower temperature to make the temperature gradient large in the single crystal growing section at the lower end of the nozzle portion.

In addition, in order to improve the efficiency of melting the raw material powder in the crucible, preferably the crucible per se is made of an electrically conductive material and heated by the supply of electric power thereto rather than by heating the crucible solely by the heating furnace. In addition, in order to retain the melted state of the melt flowing in the nozzle portion, preferably the nozzle portion is made of an electrically conductive material and heat-generated by supplying electric power thereto.

Particularly, in order to enlarge the temperature gradient in the single crystal growing section, preferably the electric power supplying mechanism to the crucible and the electric power supplying mechanism to the nozzle portion are separated from each other so that they can be controlled independently.

As such an electrically conductive material, platinum, platinum-gold alloys, platinum-rhodium alloys, platinum-iridium alloys, and iridium are preferable particularly from the aspect of the corrosion resistant property.

However, platinum and the like electrically conductive material have respectively a relatively low resistivity, so that the thickness of the nozzle portion has to be made small to make its resistivity larger than a certain extent in order to effectively heat it by supplying an electric power thereto. For example, if the nozzle portion is made of platinum, it had to be made of a thin film of a thickness of around 100–200 $\mu$m. However, if the nozzle portion is made of such a thin film, the nozzle portion becomes weak in structure and is easily deformed, so that the stable production of the single crystal is likely obstructed.

So, in order to effectively heat the nozzle portion, a heat-generating resistive member may be provided around the nozzle portion and heat-generated by supplying electric power thereto. In such a case, the nozzle portion may be made of a corrosion-resistant material as described above and heat-generated by supplying electric power thereto or it may not be supplied by electric power. By affording a principal heating function to the heat-generating resistive member surrounding the nozzle portion in this way, the load of heat-generation required to the nozzle portion becomes small, and the nozzle portion may not necessarily be heat-generated. Thus, the nozzle portion can have a larger thickness of e.g. not less than 300 μm to achieve an improved mechanical strength, so that it may suit to the mass production.

The present invention is also satisfactorily applicable not only to the production of the single crystal fiber but also to the production of the single crystal plate. Concrete method of forming the plate will be explained below.

The property of the KLN single crystal were described above.

FIG. 34 is a schematic cross-sectional view of an embodiment of the fourth aspect of the present invention showing a producing apparatus for growing the single crystal, and FIGS. 3(a) and 3(b) are schematic cross-sectional views thereof for explaining the distal end portion of the nozzle portion.

The crucible 20 is disposed in the interior of the furnace body. The upper furnace 2 is arranged to surround the crucible 20 and its upper space 10 and has the heater 4A embedded therein. The nozzle portion 25 extends downwardly from the lower end of the crucible 20 and has the opening 25a at the lower end. The lower furnace 3 is arranged to surround the nozzle portion 25 and its surrounding space 18 and has the heater 4B embedded therein. Of course the shape per se of such a heating furnace may be changed variously. For example, though the heating furnace was divided into two heating zones in FIG. 34, the heating furnace may be divided into at least three heating zones. The crucible 20 and the nozzle portion 25 are respectively made of a corrosion-resistant electrically conductive material.

An electrode of the electric power source 22A is connected to a portion B of the crucible 20 through a leading wire 68 and the other electrode of the power source 22A is connected to a lower bent edge portion C of the crucible 20. An electrode of the electric power source 22B is connected to a portion D of the nozzle portion 25 through a leading wire 68 and the other electrode of the power source 22B is connected to a lower end E of the nozzle portion 25. These electric power supplying mechanisms are separated from each other and constructed to control its voltage independently.

In addition, the after-heater 66 is arranged in the space 18 to surround the nozzle portion 25 with a spacing. The intake tube 23 extends upwardly in the crucible 20 and has the intake hole 24 at the upper end. The intake hole 24 is a little protruded from the bottom of the melt 21.

The intake hole 24 may be arranged at the bottom of the crucible 20 such that it does not protrude from the bottom of the crucible 20. In such a case, the intake tube 23 is not arranged. However, if the crucible 20 is used for a prolonged period of time, the impurities in the melt are occasionally gradually accumulated at the bottom of the crucible 20. By providing the intake hole 24 at the upper end of the intake tube 23 as in the present invention, the impurities accumulated at the bottom of the crucible 20 are hardly introduced in the intake hole 24, because the intake tube 23 is protruded from the bottom of the crucible 20.

The temperature distributions in the spaces 10, 18 are suitably determined by the heat-generation of the upper and lower furnaces 2 and 3, the raw material is fed in the melting crucible 20, and the melting crucible 20 and the nozzle portion 25 are heat-generated by supplying electric power thereto. At this state, the melt 21 is slightly protruded downwardly from the opening 25a in the single crystal growing section 26 existing at the lower end of of the nozzle portion 25 and retained by its surface tension to form a relatively flat surface 29.

The gravity acting on the melt in the crucible 20 is largely decreased by the contact of the melt with the inner wall surface of the nozzle portion 25. Particularly, by using the nozzle portion 25 of an inner diameter of not more than 0.5 mm, a uniform meniscus could be formed.

At this state, the seed crystal 27 is moved upwardly to contact its upper end surface 27a with the lower end surface 29 of the melt 21. Then, the seed crystal 27 is pulled downwardly as shown in FIG. 3(b). At that time, a uniform meniscus 30 is formed between the upper end of the seed crystal 27 and the lower end surface 29 of the melt 21 drawn downwardly from the nozzle portion 25.

As a result, a single crystal fiber 12 is continuously formed on the seed crystal 27 and pulled downwardly. In this embodiment, the single crystal fiber 12 is pulled down by the driven rollers 67.

Meanwhile, in case if the amount of the material powder supplied to the conventional crucible is increased, an expanded portion of the melt is formed downwardly from the drawing hole of the crucible. If the upper end surface 27a of the seed crystal 27 is contacted to the melt 21 at this state, a good meniscus is not formed.

If the single crystal fiber is continuously pulled downwardly, the single crystal fiber 12 is irradiated by a laser beam of a wavelength of around 2λ0 from a laser beam source 136 as shown by the arrow 139 and the emitted light beam 141 of a wavelength of around λ0 from the single crystal fiber 12 by second harmonic generation is received by a light beam-receiving device 137C through a long wavelength cut filter 142 to measure the intensity thereof. A signal from the light beam-receiving device 137C is transmitted to a controlling device 144 through a signal wire 143 and treated therein to control the proportion of the composition of the raw material to be charged in the crucible 20 from an upper raw material feeding device 145. If the measured intensity of the emitted light beam is varied from the purposed value, a signal for changing the proportion of the composition of the raw material is transmitted from the controlling device 144 to the feeding device 145 to attain a feed back.

In order to control more precisely, reflecting mirrors 139, 140 and light beam-receiving devices 137A, 137B may be combined to transmit respective signal as to a portion of a long wavelength of around 2λ0 to the controlling device 144 through the signal wire 143.

Hereinafter, more concrete experimental results will be described.

EXAMPLE 16

Using the single crystal producing apparatus shown in FIG. 34, a KLN single crystal fiber was produced according to the present invention. The temperatures in the whole furnace were controlled by means of the upper furnace 2 and the lower furnace 3. The temperature gradient in the neighbourhood of the single crystal growing section was controlled by the supply of electric power to the nozzle portion 25 and heat-generation of the after-heater 66. For pulling down the single crystal fiber a mechanism was used which pulls the single crystal fiber downwardly at a controlled uniform pulling rate in a range of 2–100 mm/hr in the vertical direction. As the laser beam source 136, a tunable titanium sapphire laser beam source was used which can generate the laser beam in a wavelength range of 780–900 nm.

Potassium carbonate, lithium carbonate and niobium oxide were reciped in a mol ratio of 30:20:50 to prepare a raw material powder. Around 50 g of the material powder were fed in the melting crucible 20 made of platinum and the melting crucible 20 was set at a desired position in the furnace. The temperature in the space 10 of the upper furnace 2 was adjusted to a temperature of 1,100–1,200° C. to melt the raw material in the crucible 20. The temperature in the space 18 of the lower furnace 3 was uniformly controlled to a temperature of 500–1,000° C. Desired electric powers were supplied to the melting crucible 20, the nozzle portion 25 and the after-heater 66 to perform the growing of the single crystal. At that time, the single crystal growing section could be controlled to a temperature of 1,050–1,150° C. and to a temperature gradient of 10–50° C./mm.

The nozzle portion 25 had an outer and inner cross-sections of circular shapes and an outer diameter of 1 mm, an inner diameter of 0.1 mm and a length of 20 mm. The melting crucible 20 had a circular shape in plan view and a diameter of 30 mm and a height of 30 mm. At this state, the single crystal fiber was pulled downwardly at a pulling rate of 20 mm/hr.

Simultaneously, the single crystal fiber was irradiated by a laser beam of nearly a purposed phase matched wavelength of 850 nm from a titanium sapphire laser beam source and the light beam emitted therefrom was analyzed by a spectrum analyzer. As the raw material, powders of the following two types of composition were used.

Powder 1: $K_{3.1}Li_2Nb_5O$
Powder 1: $K_{2.9}Li_2Nb_5O$

Initially, the powder 1 and the powder 2 were mixed in a ratio of 1:1 and the mixture was charged in the crucible. Then the amount of the powder 1 in the mixture was increased, if the peak wavelength of the emitted light beam is moved to a longer direction, while the amount of the powder 2 in the mixture was increased, if the peak wavelength of the emitted light beam is moved to a shorter direction.

In this way, a single crystal fiber of a longitudinal and lateral size of 1 mm×1 mm and a length of 100 mm was continuously grown, while controlling the mixing proportion of the raw material. As a result, the single crystal fiber could emit a light beam of a phase matched wavelength with a small error of not more than 0.2 nm, so that the composition of the single crystal fiber could be controlled with a small error of not more than 0.01 mol %, which is a much high precision never before attained by a KLN single crystal.

EXAMPLE 17

In the same manner as in Example 16, a KLN single crystal fiber was produced except that a severing device for intermittently severing the single crystal fiber to a desired length was arranged below the furnace for continuously growing the single crystal fiber. With the progress of the growing of the single crystal fiber, the raw material powder was periodically fed in the melting crucible in an amount corresponding to the amounts of the components drawn and evaporated from the melting crucible 20. At that time, the mixing proportion of the raw material powders was determined as described above.

In this way, a single crystal fiber of a length of around 10 m was continuously formed and the phase matched wavelength of the light beam emitted from the single crystal fiber could be controlled with an error of not more than 0.2 nm, namely, the variation in the composition thereof could be controlled with an error of not more than 0.01 mol %.

EXAMPLE 18

Using the aforedescribed nozzle portion 25 and an elongated shape for the nozzle portion 25, the inventors could succeed to pull down a KLN single crystal plate of a thickness of 0.3 mm.

In this case, the charge of the raw material powder was controlled by observing changes of emitted light beams from two types of semiconductor laser. A laser beam source 147A which generates a laser beam of a wavelength of $2\lambda 6$ (848 nm, namely, 424 nm×2) against the purposed wavelength $\lambda 0$ (425 nm), and a laser beam source 147B which generates a laser beam of a wavelength of $2\lambda 7$ (852 nm, namely, 426 nm×2) were prepared. Light beam-receiving devices 148A, 148B which respectively corresponds to the respective laser beam source were disposed at the opposing positions to the laser beam sources so as to sandwich a single crystal plate 146 therebetween as shown in FIG. 35.

Even if the wavelength of the purposed wavelength $\lambda 0$ varies 0.2 nm from the wavelength 425 nm by the variation in the composition of the single crystal, the intensity of the emitted light beam changes and the output from the light receiving devices 148A, 148B changes. Therefore, the changes of the outputs were transmitted to a controlling device 149 and feed backed to control the mixing proportion of the raw material powder through the controlling device 144 thereby to control the growing of the single crystal. Because the phase matched half width of the second harmonic wave changes depending on the thickness and the quality of the single crystal, the wavelength of the laser beam from the laser beam source has to be selected. Because the KLN single crystal has a theoretical width of 3.5 nm at a thickness of 0.3 mm, the aforedescribed $2\lambda 6$ and $2\lambda 7$ were selected. In case if the KLN single crystal has a thickness of 0.6 mm, $2\lambda 6$ (849 nm, namely, 424.5 nm×2) and $2\lambda 7$ (851 nm, namely, 425.5 nm×2) may be used for the controlling.

Of course, by such a controlling method, the mixing proportion of the raw material powder may be controlled by feed backing also in the case of the single crystal fiber.

Although the present invention was explained with reference to specific preferable embodiments in the foregoing descriptions, it should be understood that the specific descriptions are merely for illustration but not for limiting the present invention, and the present invention can be put into practice by another ways without departing from the broad spirit and scope of the present invention as defined in the appended claims.

What is claimed is:

1. An oxide-series single crystal-producing apparatus comprising a crucible, a nozzle portion extending from said crucible, a single crystal-growing section provided at a lower end of the nozzle portion, and a heating mechanism for independently controlling a temperature of the crucible and that of the single crystal-growing section, wherein a raw material for the oxide-series single crystal is melted in the crucible, a seed crystal is contacted with the melt in the crucible, and the oxide-series single crystal body is grown, while the melt is being downwardly drawn.

2. The oxide-series single crystal-producing apparatus claimed in claim 1, wherein said nozzle portion is provided at a side face of the crucible, a part of the nozzle portion is extended higher than a joint portion between the crucible and the nozzle portion.

3. The oxide-series single crystal-producing apparatus claimed in claim 2, which further includes a melting furnace in which said crucible is placed, a growing furnace in which said single crystal-growing section is provided, and in which a heat-insulating wall is provided for adiabatically separating said melting furnace from said growing furnace, and said nozzle portion is inserted into a through-hole provided in said heat-insulating wall.

4. The oxide-series single crystal-producing apparatus claimed in claim 1, wherein an inner diameter of said nozzle portion is not more than 0.5 mm.

5. The oxide-series single crystal-producing apparatus claimed in claim 1, wherein each of said crucible and said nozzle portion is made of a conductive material, said apparatus further includes a first radio frequency induction heating mechanism for induction heating the crucible, a second-radio frequency induction heating mechanism for induction heating the nozzle portion, and said first radio frequency induction heating mechanism is separated from the second one.

6. The oxide-series single crystal-producing apparatus claimed in claim 5, wherein said first nozzle portion is an alternating current power source.

7. The oxide-series single crystal-producing apparatus claimed in claim 2, which further comprises a radio frequency heating mechanism for making the nozzle portion generate heat through radio frequency induction.

8. The oxide-series single crystal-producing apparatus claimed in claim 1, wherein said crucible is made of a conductive material, a heat-generating resistive member is arranged to surround the nozzle portion, said apparatus further includes a first current-passing mechanism for applying electric power to the crucible to make the crucible generate heat, a second current-passing mechanism for applying electric power to the heat-generating resistive member to make the heat-generating resistive member generate heat, and said first current-passing mechanism is separated from the second one.

9. The oxide-series single crystal-producing apparatus claimed in claim 1, wherein said nozzle portion is constituted by a pair of joined corrosion-resistive members, a groove is provided at an opposed surface of at least one of said joined corrosion-resistive material, and said groove forms a melt flow passage.

10. The oxide-series single crystal producing apparatus claimed in claim 1, wherein said oxide-series single crystal body has a planar shape, a distal end face of said nozzle portion has a flat surface having shape corresponding to a cross sectional shape of the planar single crystal body, plural rows of melt flow passages are formed in the nozzle portion and opened to said flat surface of the tip end face thereof, the melt is simultaneously drawn downwardly through said melt flow passages, and the melts thus drawn downwardly through the respective melt flow passages are integrally combined together along said flat surface to form said planar single crystal body.

11. The oxide-series single crystal-producing apparatus claimed in claim 1, which further comprises a raw material feeder for feeding the raw material to the crucible, a moving device for pulling down the oxide-series single crystal body from the crucible, a laser beam source for irradiating the laser beam upon the oxide-series single crystal body, a measuring device for measuring an output light beam from the oxide-series single crystal body, and a controller for controlling a composition ratio of the raw material to be fed to the crucible based on an output signal from the measuring device.

12. The oxide-series single crystal-producing apparatus, comprising a crucible, an oxide-series single crystal raw material feeder for feeding the raw material to the crucible, a moving device for pulling downwardly the oxide-series single crystal body from the crucible, a laser beam source for irradiating a laser beam upon the oxide-series single crystal body, a measuring device for measuring an output light beam from the oxide-series single crystal body, and a controller for controlling a composition ratio of the raw material to be fed to the crucible based on an output signal from the measuring device.

* * * * *